United States Patent
Kobayashi et al.

(10) Patent No.: US 8,389,993 B2
(45) Date of Patent: Mar. 5, 2013

(54) DISPLAY DEVICE HAVING A BUFFER LAYER FORMED OVER A CHANNEL PROTECTIVE LAYER

(75) Inventors: Satoshi Kobayashi, Kanagawa (JP); Ikuko Kawamata, Kanagawa (JP); Koji Dairiki, Kanagawa (JP); Shigeki Komori, Kanagawa (JP); Toshiyuki Isa, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/361,998

(22) Filed: Jan. 31, 2012

(65) Prior Publication Data

US 2012/0129288 A1    May 24, 2012

Related U.S. Application Data

(62) Division of application No. 12/838,115, filed on Jul. 16, 2010, now Pat. No. 8,133,771, which is a division of application No. 12/196,798, filed on Aug. 22, 2008, now Pat. No. 7,768,009.

(30) Foreign Application Priority Data

Aug. 31, 2007   (JP) .................................. 2007-227073

(51) Int. Cl.
   *H01L 29/04*      (2006.01)
   *H01L 29/10*      (2006.01)
   *H01L 27/12*      (2006.01)
(52) U.S. Cl. ...... 257/59; 257/72; 257/350; 257/E29.151
(58) Field of Classification Search .................... 257/59, 257/72, 350, E29.151
See application file for complete search history.

(56) References Cited

U.S. PATENT DOCUMENTS

| | | | |
|---|---|---|---|
| 4,409,134 A | 10/1983 | Yamazaki |
| 5,591,987 A | 1/1997 | Yamazaki et al. |
| 5,701,167 A | 12/1997 | Yamazaki |
| 5,766,989 A | 6/1998 | Maegawa et al. |
| 6,444,506 B1 | 9/2002 | Kusumoto et al. |
| 6,462,723 B1 | 10/2002 | Yamazaki et al. |
| 8,013,338 B2 | 9/2011 | Kobayashi et al. |
| 2004/0137146 A1 | 7/2004 | Tsujimura et al. |

(Continued)

FOREIGN PATENT DOCUMENTS

| | | |
|---|---|---|
| JP | 04-242724 | 8/1992 |
| JP | 06-275524 | 9/1994 |

(Continued)

OTHER PUBLICATIONS

Toshiaki Arai, et al., "41.2: Micro Silicon Technology for Active Matrix OLED Display", Sid 07 Digest, 2007, vol. 38, pp. 1370-1373.

(Continued)

*Primary Examiner* — Ngan Ngo
(74) *Attorney, Agent, or Firm* — Nixon Peabody LLP; Jeffrey L. Costellia

(57) ABSTRACT

A display device including a thin film transistor with high electric characteristics and high reliability, and a method for manufacturing the display device with high mass-productivity. In a display device including an inverted-staggered channel-stop-type thin film transistor, the inverted-staggered channel-stop-type thin film transistor includes a microcrystalline semiconductor film including a channel formation region, and an impurity region containing an impurity element of one conductivity type is selectively provided in a region which is not overlapped with source and drain electrodes, in the channel formation region of the microcrystalline semiconductor film.

10 Claims, 33 Drawing Sheets

U.S. PATENT DOCUMENTS

| | | | |
|---|---|---|---|
| 2009/0001375 A1* | 1/2009 | Yamazaki et al. | 257/59 |
| 2009/0011551 A1 | 1/2009 | Yamazaki | |
| 2009/0020759 A1 | 1/2009 | Yamazaki | |
| 2009/0021664 A1 | 1/2009 | Yamazaki | |
| 2009/0039351 A1 | 2/2009 | Kobayashi et al. | |
| 2009/0039352 A1 | 2/2009 | Kobayashi et al. | |
| 2009/0045401 A1 | 2/2009 | Yamazaki et al. | |
| 2009/0047759 A1 | 2/2009 | Yamazaki et al. | |
| 2009/0127641 A1* | 5/2009 | Koyama | 257/428 |
| 2009/0152553 A1 | 6/2009 | Yoon et al. | |
| 2009/0224245 A1 | 9/2009 | Umezaki | |
| 2009/0239335 A1 | 9/2009 | Akimoto et al. | |
| 2009/0305461 A1 | 12/2009 | Akimoto et al. | |
| 2010/0193785 A1* | 8/2010 | Kimura | 257/43 |
| 2011/0198595 A1 | 8/2011 | Yamazaki | |

FOREIGN PATENT DOCUMENTS

| | | |
|---|---|---|
| JP | 08-195492 | 7/1996 |
| JP | 09-186342 | 7/1997 |
| JP | 11-121761 | 4/1999 |
| JP | 2001-007024 | 1/2001 |
| JP | 2001-051292 | 2/2001 |
| JP | 2005-049832 | 2/2005 |

OTHER PUBLICATIONS

Mohammad R. Esmaeili-Rad, et al., "Stability of Nanocrystalline Silicon Bottom-Gate Thin Film Transistors With Silicon Nitride Gate Dielectric", Journal of Applied Physics, vol. 102, No. 6, 2007, pp. 064512-1-064512-7.

Czang-Ho Lee, et al., "Directly Deposited Nanocrystalline Silicon Thin-Film Transistors With Ultra High Mobilities", Applied Physics Letters, vol. 89, No. 25, 2006, pp. 252101-1-252101-3.

Hyun Jung Lee, et al., "Leakage Current Mechanisms in Top-Gate Nanocrystalline Silicon Thin Film Transistors" Applied Physics Letters, 2008, vol. 92, American Institute of Physics, pp. 083509-1-083509-3.

Mohammad R. Esmaeili-Rad, et al., "Absence of Defect State Creation in Nanocrystalline Silicon Thin Film Transistors Deduced Form Constant Current Stress Measurements", Applied Physics Letters, 2007, American Institute of Physics, vol. 91, pp. 113511-1-113511-3.

Czang-Ho Lee, et al. "Stability of Nc-Si:H TFTS With Silicon Nitride Gate Dielectric", IEEE Transactions on Electron Devices, vol. 54, No. 1, Jan. 2007, pp. 45-51.

Andrei Sazonov, et al., "Low-Temperature Materials and Thin Film Transistors for Flexible Electronics", Proceedings of the IEEE, vol. 93, No. 8, Aug. 2005, pp. 1420-1428.

Czang-Ho Lee, et al., "Top-Gate TFTS Using 13.56 Mhz PECVD Microcrystalline Silicon", IEEE Electron Device Letters, vol. 26, No. 9 Sep. 2005, pp. 637-639.

Czang-Ho Lee, et al., "Postdeposition Thermal Annealing and Material Stability of 75° C. Hydrogenated Nanocrystalline Silicon Plasma-Enhanced Chemical Vapor Deposition Films", Journal of Applied Physics, vol. 98, 2005, pp. 034305-1-034305-7.

C-H. Lee, et al., How to Achieve High Mobility Thin Film Transistors by Direct Deposition of Silicon Using 13.56 Mhz RF PECVD?, IEDM Technical Digest, International Electron Device, Meet, Dec. 2006, pp. 295-298.

* cited by examiner

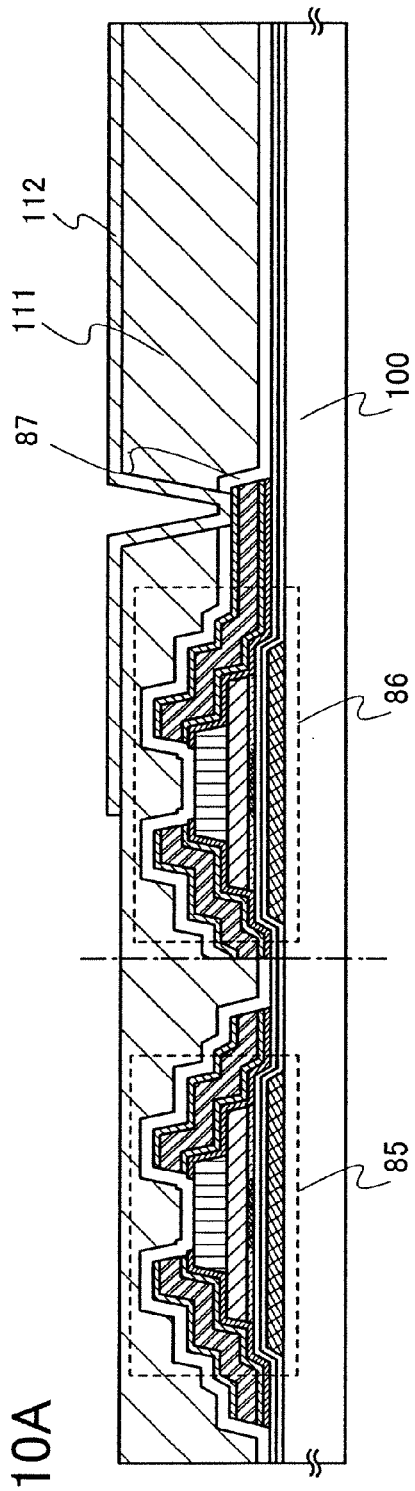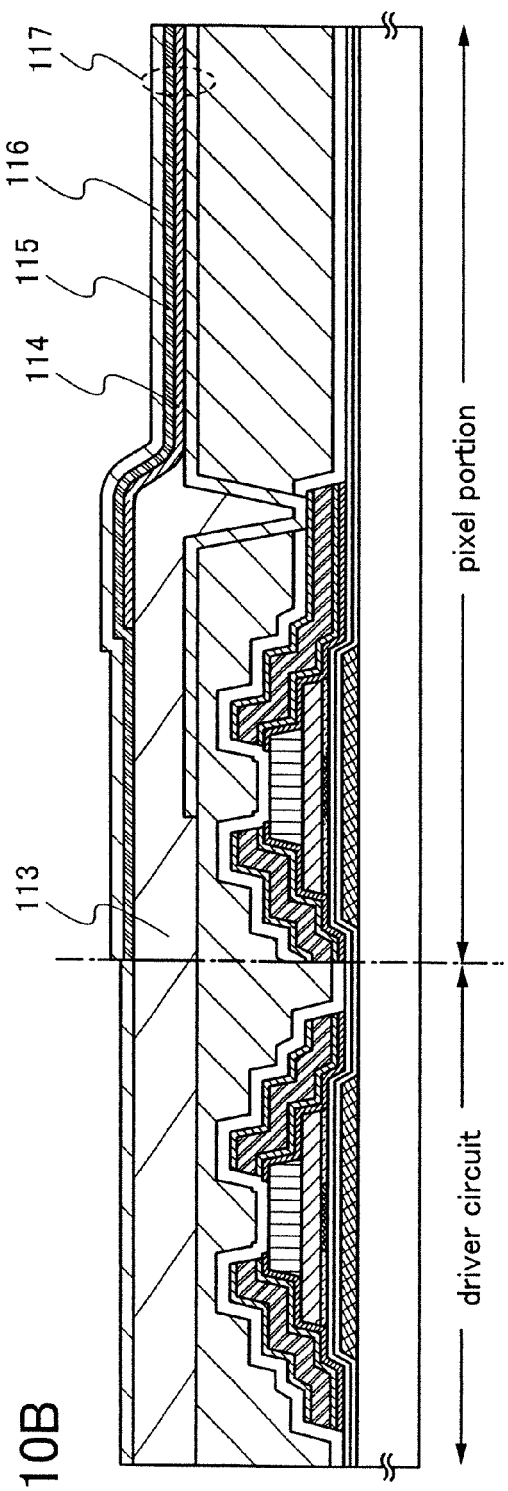

DISPLAY DEVICE HAVING A BUFFER LAYER FORMED OVER A CHANNEL PROTECTIVE LAYER

BACKGROUND OF THE INVENTION

1. Field of the Invention

The present invention relates to a display device in which a thin film transistor is used at least in a pixel portion and a method for manufacturing the display device.

2. Description of the Related Art

In recent years, technology that is used to form a thin film transistor using a semiconductor thin film (with a thickness of several nm to several hundreds nm) that is formed over a substrate having an insulating surface has attracted attention. The thin film transistor is widely applied to electronic devices such as ICs and electro-optical devices. Development of a thin film transistor particularly as a switching element of an image display device has been accelerated.

As a switching element in an image display device, a thin film transistor using an amorphous semiconductor film, a thin film transistor using a polycrystalline semiconductor film, or the like is used. As a method for forming a polycrystalline semiconductor film, there is known a technique in which a pulsed excimer laser beam is shaped into a linear laser beam by an optical system and an amorphous silicon film is scanned and irradiated with the linear beam so that the amorphous silicon film is crystallized.

Further, as a switching element in an image display device, a thin film transistor using a microcrystalline semiconductor film is used (see Patent Document 1: Japanese Published Patent Application No. Hei4-242724 and Patent Document 2: Japanese Published Patent Application No. 2005-49832).

A known conventional method for manufacturing a thin film transistor is that an amorphous silicon film is formed over a gate insulating film; a metal film is formed thereover; and the metal film is irradiated with a diode laser beam to change the amorphous silicon film into a microcrystalline silicon film (see, for example, Non-Patent Document 1: Toshiaki Arai et al., SID 07 DIGEST, 2007, pp. 1370-1373). According to this method, the metal film formed over the amorphous silicon film is provided to convert optical energy of the diode laser beam into thermal energy and is needed to be removed in a later step to complete a thin film transistor. That is, the method is that an amorphous semiconductor film is heated only by conduction heating from a metal film to form a microcrystalline semiconductor film.

SUMMARY OF THE INVENTION

A thin film transistor using a polycrystalline semiconductor film is advantageous in that the mobility is higher than that of a thin film transistor using an amorphous semiconductor film by two or more digits, and a pixel portion and a peripheral driver circuit of a display device can be formed over the same substrate. However, the manufacturing process of the thin film transistor using a polycrystalline semiconductor film is complex compared to the case of the thin film transistor using an amorphous semiconductor film due to crystallization of a semiconductor film; accordingly, there are problems in that yield is decreased and cost is increased.

In view of the above-described problems, it is an object of the present invention to propose a display device including a thin film transistor with high electric characteristics and high reliability.

The present invention is a display device including an inverted-staggered (bottom-gate) transistor in which a channel protective layer is provided over a microcrystalline semiconductor film included in a channel formation region. A summary of the present invention lies in that an impurity element of one conductivity type is contained in the channel formation region of the microcrystalline semiconductor film which is not overlapped with a source and drain electrodes and is overlapped with the channel protective layer, at a lower concentration than in a source and drain regions.

In the present invention, a channel-stop inverted-staggered thin film transistor in which a microcrystalline semiconductor film is used for a channel formation region is included. In an inverted-staggered thin film transistor, a gate insulating film is formed over a gate electrode, and a microcrystalline semiconductor film (also called a semiamorphous semiconductor film) which functions as a channel formation region is formed over the gate insulating film. A channel protective layer is formed in a region which is overlapped with the channel formation region of the microcrystalline semiconductor film. Further, a buffer layer is formed between the microcrystalline semiconductor film and the channel protective layer or over them. Pair of source and drain regions are formed over the channel protective layer and the buffer layer, and a pair of source and drain electrodes which are in contact with the source and drain regions are formed. In the channel formation region of the microcrystalline semiconductor film, an impurity region containing an impurity element of one conductivity type is provided selectively in a region which is not overlapped with the source and drain electrodes.

According to one feature of a display device of the present invention, a transistor is included. The transistor includes a gate electrode, a gate insulating film over the gate electrode, and a microcrystalline semiconductor film including a channel formation region over the gate insulating film. A buffer layer over the microcrystalline semiconductor film, and a channel protective layer in a region which is overlapped with the channel formation region of the microcrystalline semiconductor film, over the buffer layer are included. A source and drain regions over the channel protective layer and the buffer layer, and a source and drain electrodes over the source and drain regions are included. An impurity region containing an impurity element which imparts one conductivity type is provided selectively in the channel formation region of the microcrystalline semiconductor film.

According to one feature of a display device of the present invention, a transistor is included. The transistor includes a gate electrode, a gate insulating film over the gate electrode, and a microcrystalline semiconductor film including a channel formation region over the gate insulating film. A channel protective layer is included in a region which is overlapped with the channel formation region of the microcrystalline semiconductor film. A buffer layer is included over the microcrystalline semiconductor film and the channel protective layer. A source and drain regions over the buffer layer, and a source and drain electrodes over the source and drain regions are included. An impurity region containing an impurity element which imparts one conductivity type is provided selectively in the channel formation region of the microcrystalline semiconductor film.

According to one feature of a manufacturing method of a display device of the present invention, a gate electrode, a gate insulating film, and a microcrystalline semiconductor film are formed. A buffer layer is formed over the microcrystalline semiconductor film, and a channel protective layer is formed in a region which is overlapped with a channel formation region of the microcrystalline semiconductor film, over the buffer layer. A source and drain regions are formed over the channel protective layer and the buffer layer, and a source and drain electrodes are formed over the source and drain regions. An impurity element which imparts one conductivity type is added selectively in the channel formation region of the microcrystalline semiconductor film, through the buffer layer and the channel protective layer with the use of the source and drain electrodes as masks.

According to one feature of a manufacturing method of a display device of the present invention, a gate electrode, a gate insulating film, and a microcrystalline semiconductor film are formed. A channel protective layer is formed in a region which is overlapped with a channel formation region of the microcrystalline semiconductor film, and a buffer layer is formed over the microcrystalline semiconductor film and the channel protective layer. A source and drain regions are formed over the buffer layer, and a source and drain electrodes are formed over the source and drain regions. An impurity element which imparts one conductivity type is added selectively in the channel formation region of the microcrystalline semiconductor film, through the channel protective layer with the use of the source and drain electrodes as masks.

According to one feature of a manufacturing method of a display device of the present invention, a gate electrode, a gate insulating film, and a microcrystalline semiconductor film are formed. A channel protective layer is formed in a region which is overlapped with a channel formation region of the microcrystalline semiconductor film, and a buffer layer is formed over the microcrystalline semiconductor film and the channel protective layer. A source and drain regions are formed over the buffer layer, and a source and drain electrodes are formed over the source and drain regions. An impurity region is formed by selectively adding an impurity element which imparts one conductivity type in the channel formation region of the microcrystalline semiconductor film, through the channel protective layer with the use of the source and drain electrodes as masks. The impurity region of the microcrystalline semiconductor film is irradiated with laser light through the channel protective layer with the use of the source and drain electrodes as masks.

According to the present invention, a display device including a thin film transistor with high electric characteristics and high reliability can be provided.

BRIEF DESCRIPTION OF THE DRAWINGS

FIGS. 10A and 10B are views describing a display device of the present invention.

DETAILED DESCRIPTION OF THE INVENTION

Figure 1:
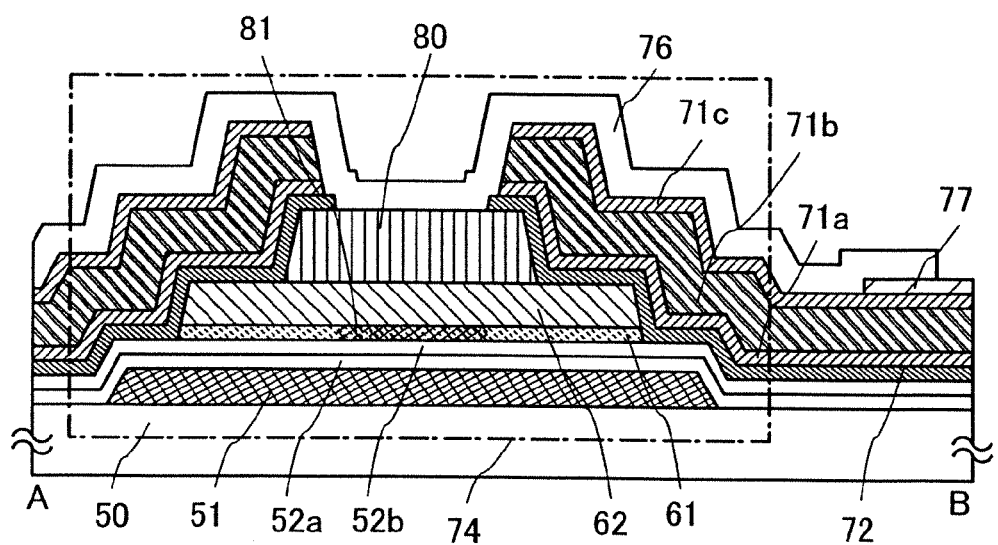
FIG. 1 is a view describing a display device of the present invention.

The embodiment modes according to the present invention will hereinafter be described in detail, using the accompanying drawings. It is easily understood by those who skilled in the art that the embodiment modes and details herein disclosed can be modified in various ways without departing from the purpose and scope of the present invention. Therefore, the present invention is not construed as being limited to the description of the following embodiment modes. Note that the same portions or portions having similar functions are denoted by the same reference numerals throughout the diagrams in structures of the present invention described hereinafter, and repetitive description thereof is omitted.

(Embodiment Mode 1)

In this embodiment mode, a thin film transistor which is used for a display device and a manufacturing process of the thin film transistor will be described using FIG. 1, FIGS. 2A to 2E, FIGS. 3A to 3C, and FIGS. 4A to 4D. FIG. 1, FIGS. 2A to 2E, and FIGS. 3A to 3C are cross-sectional views showing a thin film transistor and a manufacturing process thereof, and FIGS. 4A to 4D are plan views each showing a region in a pixel where the thin film transistor and a pixel electrode are connected to each other. FIG. 1, FIGS. 2A to 2E, and FIGS. 3A to 3C are cross-sectional views showing the thin film transistor along line A-B in FIGS. 4A to 4D, and a manufacturing process thereof.

As for a thin film transistor including a microcrystalline semiconductor film, an n-channel thin film transistor has higher mobility than a p-channel thin film transistor; thus, an n-channel thin film transistor is more suitable for a driver circuit. In this embodiment mode, either an n-channel thin film transistor or a p-channel thin film transistor can be used. Regardless of whether the thin film transistor is n-channel type or p-channel type, it is preferable that all the thin film transistors formed over the same substrate have the same conductivity type so that the number of manufacturing steps is suppressed. In this embodiment mode, description will be made using an n-channel thin film transistor.

A channel-stop-type (also called a channel-protective-type) bottom-gate thin film transistor 74 of this embodiment mode is shown in FIG. 1.

In FIG. 1, the channel-stop-type thin film transistor 74 is provided over a substrate 50. The channel-stop-type thin film transistor 74 includes a gate electrode 51, gate insulating films 52a and 521), a microcrystalline semiconductor film 61, a buffer layer 62, a channel protective layer 80, a source and drain regions 72, and source and drain electrodes 71a, 71b, and 71c. A pixel electrode 77 is provided so as to be in contact with the source and drain electrodes 71c. An insulating film 76 is provided so as to cover the thin film transistor 74 and part of the pixel electrode 77. Note that FIG. 1 corresponds to FIG. 4D.

Furthermore, in a channel formation region of the microcrystalline semiconductor film 61, an impurity region 81 containing an impurity element of one conductivity type is provided selectively in a region which is not overlapped with the source and drain electrodes 71a, 71b, and 71c.

In this embodiment mode, channel doping is selectively (partly) performed in the channel formation region of the microcrystalline semiconductor film 61. After the formation of the source and drain electrodes 71a, 71b, and 71c, an impurity element of one conductivity type is added to the microcrystalline semiconductor film 61 through the buffer layer 62 and the channel protective layer 80 which is exposed between the source and drain electrodes 71a, 71b, and 71c, with the source and drain electrodes 71a, 71b, and 71c (or a mask layer) used as masks (or a mask), whereby an added region and a non-added region of the impurity element of one conductivity type are generated in a self-aligned manner in the channel formation region of the microcrystalline semiconductor film 61 which is covered with the channel protective layer 80, so that the impurity region 81 can be formed selectively.

The microcrystalline semiconductor film has low n-type conductivity when an impurity element for controlling valence electrons is not added thereto intentionally. Therefore, by addition of an impurity element which imparts p-type conductivity to the microcrystalline semiconductor film which functions as a channel formation region of a thin film transistor, the threshold voltage can be controlled. A typical example of the impurity element which imparts p-type conductivity is boron; and an impurity gas such as $B_2H_6$ or $BF_3$ may be added to silicon hydride at 1 ppm to 1000 ppm, preferably, 1 ppm to 100 ppm. The concentration of boron may be set to $1 \times 10^{14}$ to $6 \times 10^{16}$ atoms/cm$^3$.

A thin film transistor is a switching element that is turned on when a certain voltage (referred to as a threshold value or a threshold voltage) is applied to a gate electrode and is turned off when a voltage which is less than the certain voltage is applied. Therefore, it is very important to control a threshold value precisely in terms of accurate operation of a circuit.

However, the threshold voltage of a TFT may be moved (shifted) in the negative direction or the positive direction by an indefinite factor such as an effect of a movable ion due to contamination or an effect of difference in work function or interface electric charge in the periphery of a gate of the TFT.

As a technique proposed as a means for solving such a phenomenon, there is a channel doping method. The channel doping method is a technique in which an impurity element which imparts one conductivity type (typically, P, As, B, or the like) is added to a channel formation region of a TFT so that the threshold voltage is shifted intentionally to be controlled.

In the present invention, channel doping is selectively (partly) performed in a channel formation region of a microcrystalline semiconductor film. In this specification, an impurity region which is formed in the channel formation region by a channel doping step is also called a channel doping region. After formation of source and drain electrodes, an impurity element of one conductivity type is added to the microcrystalline semiconductor film through a buffer layer and a channel protective layer which is exposed between the source and drain electrodes, with the source and drain electrodes (or a mask layer) used as masks (or a mask), whereby an added region and a non-added region of the impurity element of one conductivity type are generated in a self-aligned manner in the channel formation region of the microcrystalline semiconductor film which is covered with the channel protective layer so that an impurity region can be formed selectively.

The microcrystalline semiconductor film has low n-type conductivity when an impurity element for controlling valence electrons is not added thereto intentionally. Therefore, by addition of an impurity element which imparts p-type conductivity to the microcrystalline semiconductor film which functions as a channel formation region of a thin film transistor, the threshold voltage can be controlled. A typical example of the impurity element which imparts p-type conductivity is boron; and an impurity gas such as $B_2H_6$ or $BF_3$ may be added to silicon hydride at 1 ppm to 1000 ppm, preferably, 1 ppm to 100 ppm. The concentration of boron may be set to $1 \times 10^{14}$ to $6 \times 10^{16}$ atoms/cm$^3$.

In the present invention, since the addition of the impurity element to the microcrystalline semiconductor film is performed through the channel protective layer, damage (e.g., surface roughness) to the microcrystalline semiconductor film by the addition can be reduced. Note that, in the present invention, the addition of the impurity element to the microcrystalline semiconductor film is performed so that a desired concentration peak of the impurity element exists in the microcrystalline semiconductor film, and the impurity element may also be added to the buffer layer in the case where the addition of the impurity element to the microcrystalline semiconductor film is performed through the channel protective layer and the buffer layer.

Control of the threshold voltage by a channel doping method is carried out by the concentration of an impurity element. In this embodiment mode, channel doping is performed not on the whole of the channel formation region but so as to selectively form a channel doping region. Therefore, in the present invention, the threshold voltage can be controlled more precisely by controlling the area of the channel formation region. In the case where the impurity is added to the microcrystalline semiconductor film through the channel protective layer, it is difficult to control the concentration of the impurity element in the microcrystalline semiconductor film which exists deep in a film-thickness direction and the control tends to be varied, and there is a fear of damage to the film because the addition needs to be performed at energy high enough to pass the impurity element through the channel protective layer. According to the present invention, film damage to the microcrystalline semiconductor film can be prevented and the threshold value can be controlled more accurately and uniformly. Accordingly, high reliability and high performance can be achieved in a thin film transistor and a display device including the thin film transistor.

With the structure in which the channel protective layer (also referred to as simply a protective layer) is provided over the channel formation region of the microcrystalline semiconductor film with the buffer layer interposed therebetween, which is one mode of the present invention, damage which is caused in the manufacturing process, to the buffer layer over the channel formation region of the microcrystalline semiconductor film (e.g., reduction in film thickness due to plasma or an etching agent in etching, or oxidation) can be prevented. Therefore, reliability of a thin film transistor can be improved. Further, since the buffer layer over the channel formation region of the microcrystalline semiconductor film is not etched, the buffer layer is not needed to be formed thickly, and thus film deposition time of the buffer layer can be shortened. Note that the channel protective layer functions as an etching stopper in etching for forming a source and drain regions and thus can also be referred to as a channel stopper layer.

As an example of the buffer layer, an amorphous semiconductor film is given; it is preferable that an amorphous semiconductor film containing at least one of nitrogen, hydrogen, and halogen be used. By containing at least one of nitrogen, hydrogen, and halogen in the amorphous semiconductor film, oxidation of crystals included in the microcrystalline semiconductor film can be reduced. While the microcrystalline semiconductor film has an energy gap of 1.1 to 1.5 eV, the buffer layer has a large energy gap of 1.6 to 1.8 eV and low mobility. The mobility of the buffer layer is typically ⅕ to ⅒ as small as that of the microcrystalline semiconductor film. Thus, the channel formation region is formed of a microcrystalline semiconductor film, and the buffer layer is a high-resistance region. Note that the concentration of each of carbon, nitrogen, and oxygen contained in the microcrystalline semiconductor film is set to less than or equal to $3\times10^{19}$ atoms/cm$^3$, preferably, less than or equal to $5\times10^{18}$ atoms/cm$^3$. The thickness of the microcrystalline semiconductor film is preferably 2 to 50 nm, more preferably, 10 nm to 30 nm.

The buffer layer can be formed by a plasma CVD method, a sputtering method, or the like. Further, a buffer layer can also be formed as follows; an amorphous semiconductor film is formed, and then, a surface of the amorphous semiconductor film is nitrided, hydrogenated, or halogenated by performing nitrogen plasma treatment, hydrogen plasma treatment, or halogen plasma treatment to the surface of the amorphous semiconductor film.

The buffer layer provided on a surface of the microcrystalline semiconductor film can reduce oxidation of crystal grains included in the microcrystalline semiconductor film, and thus, deterioration of electric characteristics of the thin film transistor can be reduced.

The microcrystalline semiconductor film can be directly formed over a substrate, unlike a polycrystalline semiconductor film. Specifically, the microcrystalline semiconductor film can be formed using silicon hydride as a source gas with a microwave plasma CVD apparatus with a frequency of 1 GHz or more. The microcrystalline semiconductor film formed by the above method also includes a microcrystalline semiconductor film which has crystal grains with a diameter of 0.5 to 20 nm in an amorphous semiconductor. Thus, unlike the case of using a polycrystalline semiconductor film, there is no need to perform a crystallization step after formation of a semiconductor film. The number of steps in manufacturing a thin film transistor can be reduced, a yield of a display device can be increased, and cost can be suppressed. Further, plasma generated by using microwaves with a frequency of 1 GHz or more has high electron density, and thus, silicon hydride which is a source gas can be easily dissociated. Therefore, compared to a high frequency plasma CVD method with a frequency of several tens to several hundreds of megahertz, the microcrystalline semiconductor film can be formed more easily and film deposition rate can be increased. Thus, the mass productivity of liquid crystal display devices can be increased.

Further, a thin film transistor (TFT) is manufactured using a microcrystalline semiconductor film, and a display device is manufactured using the thin film transistor for a pixel portion, and further, for a driver circuit. The thin film transistor using a microcrystalline semiconductor film has a mobility of 1 to 20 cm$^2$/V·sec, which is 2 to 20 times as high as that of a thin film transistor using an amorphous semiconductor film. Therefore, part of or the whole of the driver circuit can be formed over the same substrate as the pixel portion, so that a system-on-panel can be formed.

The gate insulating film, the microcrystalline semiconductor film, the buffer layer, the channel protective layer, and the semiconductor film to which an impurity element which imparts one conductivity type is added to form in a source and drain regions may be formed in either the same reaction chamber, or different reaction chambers depending on the kind of a film.

Before a substrate is carried into a reaction chamber to perform film formation, it is preferable to perform cleaning, flush (washing) treatment (e.g., hydrogen flush using hydrogen as a flush substance, or silane flush using silane as a flush substance), and/or coating by which the inner wall of each reaction chamber is coated with a protective film (the coating is also referred to as pre-coating treatment). Pre-coating treatment is treatment in which plasma treatment is performed by flowing of a deposition gas in a reaction chamber to coat the inner wall of the reaction chamber with a thin protective film which is a film to be formed, in advance. By the flush treatment and/or the pre-coating treatment, a film to be formed can be prevented from being contaminated by an impurity such as oxygen, nitrogen, or fluorine in the reaction chamber.

Since the channel protective layer 80 is provided over the channel formation region of the microcrystalline semiconductor film 61 with the buffer layer 62 interposed therebetween, damage (e.g., reduction in film thickness due to plasma or an etching agent in etching, or oxidation) which is caused in the manufacturing process, to the buffer layer 62 over the channel formation region of the microcrystalline semiconductor film 61 can be prevented. Therefore, reliability of the thin film transistor 74 can be improved. Further, the buffer layer 62 over the channel formation region of the microcrystalline semiconductor film 61 is not etched, so that the buffer layer 62 is not needed to be formed thickly and film deposition time can be shortened.

Figure 2A:
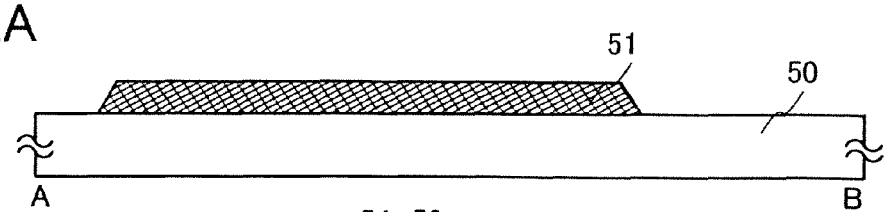
FIGS. 2A to 2E are views describing a manufacturing method of a display device of the present invention.

Hereinafter, a manufacturing method will be described in detail. The gate electrode 51 is formed over the substrate 50 (see FIGS. 2A and 4A). FIG. 2A is a cross-sectional view taken along line A-B in FIG. 4A. As the substrate 50, a plastic substrate having sufficient heat resistance to withstand a processing temperature of a manufacturing process, or the like as well as a non-alkaline glass substrate manufactured by a fusion method or a float method, such as a substrate of barium borosilicate glass, aluminoborosilicate glass, or aluminosilicate glass, a ceramic substrate can be used. Alternatively, a metal substrate such as a stainless steel alloy substrate which is provided with an insulating film on its surface may be used. As for the size of the substrate 50, the following can be given; 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

The gate electrode 51 is formed of a metal material such as titanium, molybdenum, chromium, tantalum, tungsten, or aluminum, or an alloy material thereof. The gate electrode 51 can be formed in the following manner: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrode 51 can be formed by discharging a conductive nanopaste of silver, gold, copper, or the like by an ink-jet method and baking it. Note that, as barrier metal which improve adhesion of the gate electrode 51 and prevents diffusion to a base and a substrate, a nitride film of the above-described metal material may be provided between the substrate 50 and the gate electrode 51. Further, the gate electrode 51 may have a stacked-layer structure; a structure can be used in which, from the substrate 50 side, an aluminum film and a molybdenum film are stacked, a copper film and a molybdenum film are stacked, a copper film and a titanium nitride film are stacked, a copper film and a tantalum nitride film are stacked, or the like. In the above-described stacked-layer structure, the molybdenum film or the nitride film such as the titanium nitride film or the tantalum nitride film which is formed as the upper layer has an effect as a barrier metal.

Note that, since a semiconductor film and/or a wiring are/is formed over the gate electrode 51, the gate electrode 51 is preferably processed to have a tapered end portion so that the semiconductor film and/or the wiring thereover are/is not disconnected due to a step. Further, although not shown, a wiring connected to the gate electrode can also be formed at the same time when the gate electrode 51 is formed.

Figure 2B:
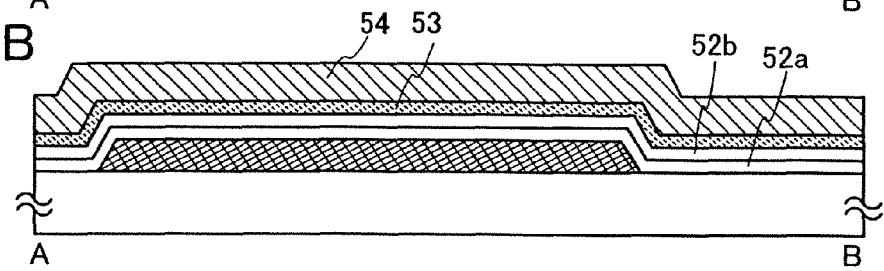

Next, the gate insulating films 52a and 52b, a microcrystalline semiconductor film 53, and a buffer layer 54 are formed in sequence over the gate electrode 51 (see FIG. 2B).

The microcrystalline semiconductor film 53 may be formed on the surface of the gate insulating film 52b either while being subjected to hydrogen plasma or after the gate insulating film 52b is subjected to hydrogen plasma. By forming the microcrystalline semiconductor film over the gate insulating film which has been subjected to hydrogen plasma, crystal growth of microcrystals can be promoted. Further, lattice distortion at an interface between the gate insulating film and the microcrystalline semiconductor film can be reduced, and thus, interface characteristics of the gate insulating film and the microcrystalline semiconductor film can be improved. Consequently, a microcrystalline semiconductor film with excellent electric characteristics and high reliability can be obtained.

Note that the gate insulating films 52a and 52b, the microcrystalline semiconductor film 53, and the buffer layer 54 may be formed successively without being exposed to the air. By successively forming the gate insulating films 52a and 52b, the microcrystalline semiconductor film 53, and the buffer layer 54 without being exposed to the air, the films can be formed without any contamination of each interface between the films with an air constituent or an impurity element floating in the air. Thus, variations in characteristics of thin film transistors can be reduced.

The gate insulating films 52a and 52b can each be formed by a CVD method, a sputtering method, or the like using a silicon oxide film, a silicon nitride film, a silicon oxynitride film, or a silicon nitride oxide film. In this embodiment mode, a mode in which either a silicon nitride film or a silicon nitride oxide film and either a silicon oxide film or a silicon oxynitride film are stacked sequentially as the gate insulating film 52a and the gate insulating film 52b, respectively is described. Note that the gate insulating film is not limited to have a two-layer structure but may have a three-layer structure in which either a silicon nitride film or a silicon nitride oxide film, either a silicon oxide film or a silicon oxynitride film, and either a silicon nitride film or a silicon nitride oxide film are stacked sequentially from the substrate side. Alternatively, the gate insulating film can be formed of a single layer of a silicon oxide film, a silicon nitride film, a silicon oxynitride film, or a silicon nitride oxide film. Furthermore, the gate insulating film is preferably formed by a microwave plasma CVD apparatus with a frequency of 1 GHz or more. A silicon oxynitride film and a silicon nitride oxide film which are formed by a microwave plasma CVD apparatus each have high withstand voltage, and thus, reliability of a thin film transistor can be improved.

As an example of the three-layer structure of the gate insulating film, over the gate electrode, a silicon nitride film or a silicon nitride oxide film may be formed as a first layer, a silicon oxynitride film may be formed as a second layer, and a silicon nitride film may be formed as a third layer. The microcrystalline semiconductor film may be formed over the silicon nitride film that is a top layer. In this case, the silicon nitride film or the silicon nitride oxide film that is the first layer is preferably thicker than 50 nm and has an effect as a barrier which blocks impurities such as sodium, an effect of preventing a hillock of the gate electrode, an effect of preventing oxidation of the gate electrode, and the like. The silicon nitride film that is the third layer has an effect of improving adherence of the microcrystalline semiconductor film and an effect of preventing oxidation in LP treatment in which the microcrystalline semiconductor film is irradiated with a laser beam.

By forming a nitride film such as a silicon nitride film which is very thin as the top layer of the gate insulating film, as described above, adherence of the microcrystalline semiconductor film can be improved. The nitride film may be formed by a plasma CVD method, or by nitridation treatment performed by treatment with plasma which is generated by microwaves and has high density and low temperature. Further, a silicon nitride film or a silicon nitride oxide film may be formed when a reaction chamber is subjected to silane flush treatment.

In this specification, the silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, the silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The microcrystalline semiconductor film 53 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size, seen from the film surface, of 0.5 to 20 nm grown in the direction of a normal line with respect to the surface of the substrate. In addition, a microcrystalline semiconductor and an amorphous semiconductor are mixed. Microcrystalline silicon, which is a typical example of a microcrystalline semiconductor, has a Raman spectrum which is shifted to a lower wave number side than 521 cm$^{-1}$ that represents single-crystalline silicon. That is, the peak of a Raman spectrum of microcrystalline silicon exists between 521 cm$^{-1}$ that represents single-crystalline silicon and 480 cm$^{-1}$ that represents amorphous silicon. Further, microcrystalline silicon is made to contain hydrogen or halogen at at least 1 at. % for termination of dangling bonds. Moreover, a rare gas element such as helium, argon, krypton, or neon may be included to further promote lattice distortion, so that the stability is enhanced and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens to several hundreds of megahertz or a microwave plasma CVD method with a frequency of 1 GHz or more. The microcrystalline semiconductor film can be typically formed by a dilution of silicon hydride such as $SiH_4$, $Si_2H_6$, $SiH_2Cl_2$, $SiHCl_3$, $SiCl_4$, or $SiF_4$ with hydrogen. Further, by a dilution with one or plural kinds of rare gas elements selected from helium, argon, krypton, and neon in addition to silicon hydride and hydrogen, the microcrystalline semiconductor film can be fainted as well. The flow ratio of hydrogen to silicon hydride at this time is set to 5:1 to 200:1, preferably, 50:1 to 150:1, more preferably, 100:1.

Preferably, the microcrystalline semiconductor film contains oxygen at a concentration of $5\times10^{19}$ atoms/cm$^3$ or less, more preferably, $1\times10^{19}$ atoms/cm$^3$ or less, and nitrogen and carbon each at a concentration of $1\times10^{18}$ atoms/cm$^3$ or less. By decreasing the concentrations of oxygen, nitrogen, and carbon in the microcrystalline semiconductor film, the microcrystalline semiconductor film can be prevented from having n-type conductivity.

The microcrystalline semiconductor film 53 is formed with a thickness which is greater than 0 nm and less than or equal to 50 nm, preferably, greater than 0 nm and less than or equal to 20 nm.

The microcrystalline semiconductor film 53 functions as a channel formation region of a thin film transistor. By forming the microcrystalline semiconductor film 53 to have a thickness within the above-described range, a fully depleted thin film transistor can be formed. Further, since the microcrystalline semiconductor film is formed of microcrystals, the microcrystalline semiconductor film has lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. Further, with the use of the microcrystalline semiconductor film in a channel formation region of a thin film transistor, fluctuation of a threshold value of a thin film transistor can be suppressed. Therefore, a display device with less variation of electrical characteristics can be manufactured.

Further, the microcrystalline semiconductor film has a higher mobility than an amorphous semiconductor film. Thus, by using, as a switch of a display element, a thin film transistor in which a channel formation region is formed of a microcrystalline semiconductor film, the area of the channel formation region, that is, the area of the thin film transistor can be reduced. Accordingly, the area occupied by the thin film transistor per pixel is decreased, and an aperture ratio of the pixel can be increased. As a result of this, a device with high resolution can be manufactured.

Further, the microcrystalline semiconductor film has a needle-like crystal which has grown longitudinally from the lower side. The microcrystalline semiconductor film has amorphous and crystalline structures which are mixed, and it is likely that a crack is generated and a gap is formed between the crystalline region and the amorphous region due to local stress. A radical may be interposed into this gap and cause crystal growth. Because the upper crystal face becomes larger, crystals are likely to grow upward into a needle shape. Even if the microcrystalline semiconductor film grows longitudinally as described above, the deposition rate is one-tenth to one-hundredth as large as that of an amorphous semiconductor film.

The buffer layer 54 can be formed by a plasma CVD method using a silicon gas (a silicon hydride gas or a silicon halide gas) such as $SiH_4$, $Si_2H_6$, $SiH_2Cl_2$, $SiHCl_3$, $SiCl_4$, or $SiF_4$. Alternatively, a dilution of silane mentioned above with one or plural kinds of rare gas elements selected from helium, argon, krypton, and neon can be used to form an amorphous semiconductor film. Further alternatively, an amorphous semiconductor film containing hydrogen can be formed using hydrogen with a flow rate of 1 to 20 times inclusive, preferably, 1 to 10 times inclusive, more preferably, 1 to 5 times inclusive as high as that of silicon hydride. Further alternatively, an amorphous semiconductor film containing nitrogen can be formed using the silicon hydride and either nitrogen or ammonia. Further alternatively, an amorphous semiconductor film containing fluorine, chlorine, bromine, or iodine can be formed using the above silicon hydride, and a gas containing fluorine, chlorine, bromine, or iodine (e.g., $F_2$, $Cl_2$, $Br_2$, $I_2$, HF, HCl, HBr, or HI).

Alternatively, as the buffer layer 54, an amorphous semiconductor film can be formed by sputtering with hydrogen or a rare gas, using an amorphous semiconductor as a target. At this time, by containing ammonia, nitrogen, or $N_2O$ in the atmosphere, an amorphous semiconductor film containing nitrogen can be formed. Further alternatively, by containing a gas containing fluorine, chlorine, bromine, or iodine (e.g., $F_2$, $Cl_2$, $Br_2$, $I_2$, HF, HCl, HBr, or HI) in the atmosphere, an amorphous semiconductor film containing fluorine, chlorine, bromine, or iodine can be formed.

Further alternatively, the buffer layer 54 may be formed as follows: an amorphous semiconductor film is formed on the surface of the microcrystalline semiconductor film 53 by a plasma CVD method or a sputtering method and then the surface of the amorphous semiconductor film is hydrogenised, nitrided, or halogenated by performing plasma treatment with hydrogen plasma, nitrogen plasma, halogen plasma, or plasma of a rare gas (helium, argon, krypton, or neon) on the surface of the amorphous semiconductor film.

The buffer layer 54 is preferably formed of an amorphous semiconductor film. Therefore, if the buffer layer 54 is formed by a high-frequency plasma CVD method with a frequency of several tens to several hundreds of megahertzs, or a microwave plasma CVD method, it is preferable to control the film deposition condition so that an amorphous semiconductor film can be formed as the buffer layer 54.

The buffer layer 54 is preferably formed with a thickness greater than or equal to 10 nm and equal to or less than 50 nm. Further, since the buffer layer 54 over the channel formation region of the microcrystalline semiconductor film 53 is not etched, the buffer layer 54 is not needed to be formed thickly, and thus film deposition time of the buffer layer can be shortened. Further, the total concentration of nitrogen, carbon, and oxygen contained in the buffer layer is preferably set to $1\times10^{20}$ atoms/cm$^3$ to $1.5\times10^{21}$ atoms/cm$^3$. With this concentration, the buffer layer 54 can function as a high-resistance region even when the thickness is greater than or equal to 10 nm and equal to or less than 50 nm.

The buffer layer 54 may be formed with a thickness greater than or equal to 150 nm and equal to or less than 200 nm, and the concentration of each of carbon, nitrogen, and oxygen contained in the buffer layer 54 may be set to less than or equal to $3\times10^{19}$ atoms/cm$^3$, preferably, less than or equal to $5\times10^{18}$ atoms/cm$^3$.

By forming, as a buffer layer, an amorphous semiconductor film or an amorphous semiconductor film containing hydrogen, nitrogen, or halogen on the surface of the microcrystalline semiconductor film 53, the surfaces of crystal grains contained in the microcrystalline semiconductor film 53 can be prevented from being naturally oxidized. That is, by formation of the buffer layer on the surface of the microcrystalline semiconductor film 53, microcrystal grains can be prevented from being oxidized. Since the buffer layer includes hydrogen and/or fluorine, oxygen can be prevented from entering the microcrystalline semiconductor film.

Further, the buffer layer 54, which is formed of an amorphous semiconductor film or an amorphous semiconductor film containing hydrogen, nitrogen, or halogen, has higher resistance than the microcrystalline semiconductor film which functions as a channel formation region. Therefore, in a thin film transistor, the buffer layer which is formed between a source and drain regions and the microcrystalline semiconductor film functions as a high-resistance region. Accordingly, the off current of the thin film transistor can be reduced. When the thin film transistor is used as a switching element of a display device, the contrast of the display device can be improved.

Figure 2C:
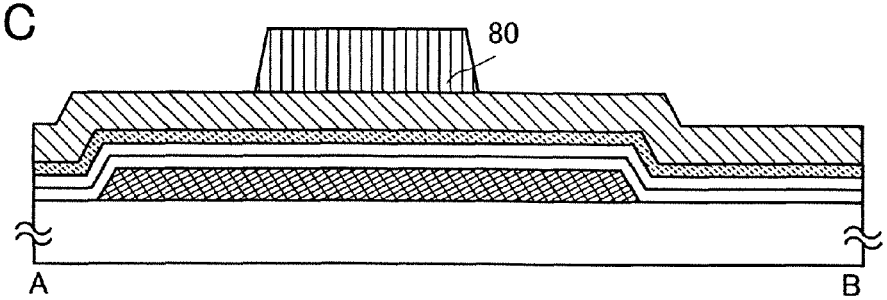

Next, the channel protective layer 80 is formed over the buffer layer 54 so as to overlap with the channel formation region of the microcrystalline semiconductor film 53 (see FIG. 2C). The channel protective layer 80 may also be formed successively after the gate insulating films 52a and 52b, the microcrystalline semiconductor film 53, and the buffer layer 54 are formed, without being exposed to the air. Successive formation of the thin films stacked improves productivity.

The channel protective layer 80 can be formed of an inorganic material (e.g., silicon oxide, silicon nitride, silicon oxynitride, or silicon nitride oxide). Alternatively, a photosensitive or non-photosensitive organic material (organic resin material, such as polyimide, acrylic, polyamide, polyimideamide, resist, or benzocyclobutene), a film made of plural kinds of these materials, or a stacked-layer film of them may be used. Further alternatively, siloxane may be used. As a formation method, a vapor deposition method such as a plasma CVD method or a thermal CVD method, or a sputtering method can be used. Alternatively, a coating method such as a spin coating method or a droplet discharging method which is a wet method, a printing method (such as screen printing or offset printing by which a pattern is formed), or the like can be used. The channel protective layer 80 may be patterned by etching after the film formation, or may be formed selectively by a droplet discharging method or the like.

Figure 2D:
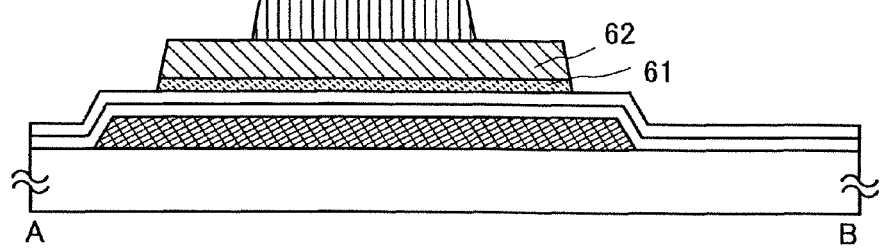
Figure 20:
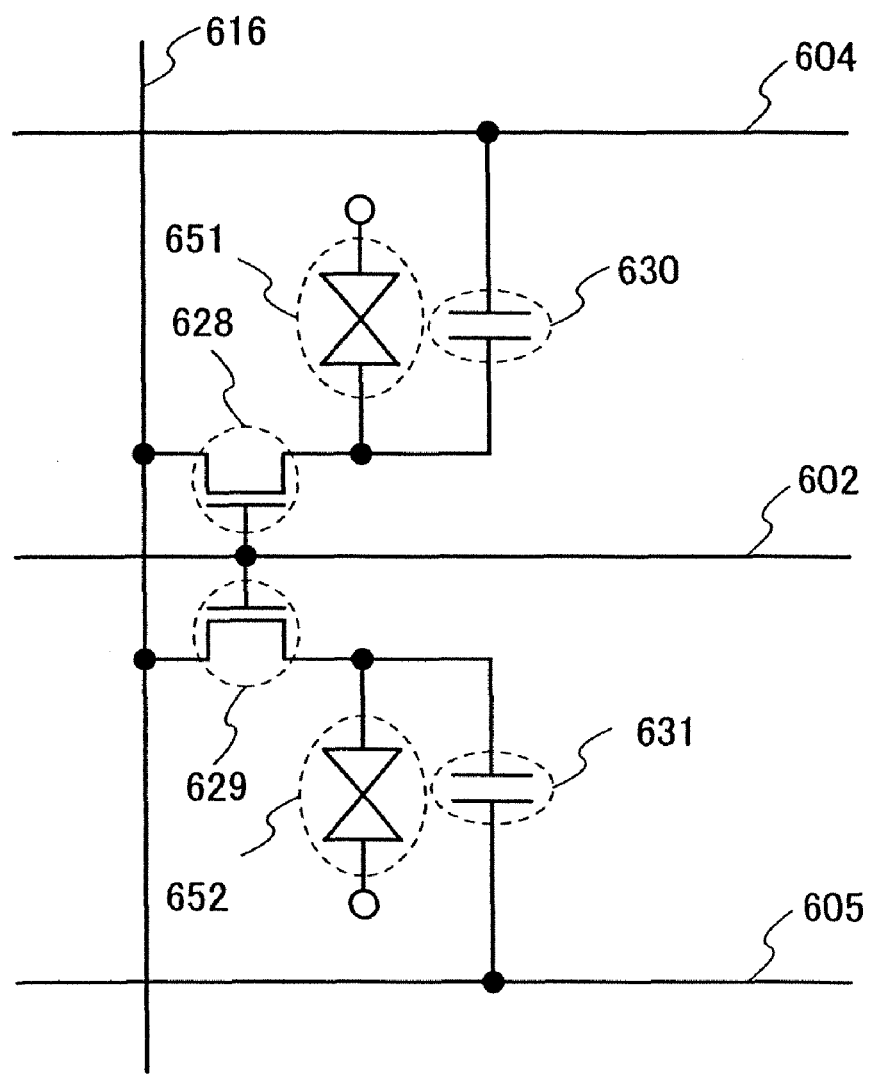
FIG. 20 is a diagram describing a display device of the present invention.

Next, the microcrystalline semiconductor film 53 and the buffer layer 54 are patterned by etching, thereby forming a stacked-layer of the microcrystalline semiconductor film 61 and the buffer layer 62 (see FIG. 2D). The microcrystalline semiconductor film 61 and the buffer layer 62 can he formed by fowling a mask by a photolithography technique or a droplet discharging method and etching the microcrystalline semiconductor film 53 and the buffer layer 54 with the use of the mask. Note that FIG. 20 is a cross-sectional view taken along line A-B in FIG. 4B.

The end portions of the microcrystalline semiconductor film 61 and the buffer layer 62 are etched to have tapered shapes. The angle of each of the end portions is 30° to 90°, preferably, 45° to 80°. Thus, disconnection of a wiring due to a step can be prevented.

Figure 2E:
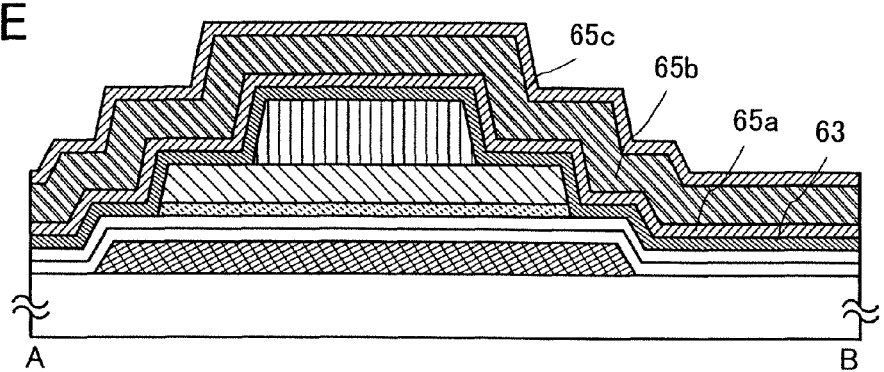

Next, the semiconductor film 63 to which an impurity element which imparts one conductivity type is added and conductive films 65a to 65c are formed over the gate insulating film 52b, the microcrystalline semiconductor film 61, the buffer layer 62, and the channel protective layer 80 (see FIG. 2E). A mask 66 is formed over the semiconductor film 63 to which an impurity which imparts one conductivity type is added and the conductive films 65a to 65c. The mask 66 is formed by a photolithography technique or an ink-jet method.

In the case where an n-channel thin film transistor is formed, phosphorus may be added as a typical impurity element to the semiconductor film 63 to which an impurity which imparts one conductivity type is added; for example, an impurity gas such as $PH_3$ is added to silicon hydride. On the other hand, in the case where a p-channel thin film transistor is formed, boron may be added as a typical impurity element to the semiconductor film 63 to which an impurity which imparts one conductivity type is added; for example, an impurity gas such as $B_2H_6$ is added to silicon hydride. The semiconductor film 63 to which an impurity which imparts one conductivity type is added can he formed of a microcrystalline semiconductor or an amorphous semiconductor. The semiconductor film 63 to which an impurity which imparts one conductivity type is added is preferably formed to have a thickness of 2 to 50 nm (preferably, 10 to 30 nm).

The conductive films are each preferably formed of a single layer or a stacked layer of aluminum, copper, and/or an aluminum alloy to which an clement to improve heat resistance or an element to prevent a hillock such as silicon, titanium, neodymium, scandium, or molybdenum is added. Further, a stacked-layer structure in which a film in contact with the semiconductor film to which an impurity which imparts one conductivity type is added is formed of titanium, tantalum, molybdenum, or tungsten, or nitride of such an element, and aluminum or an aluminum alloy is formed thereover may also be used. Further alternatively, a stacked-layer structure in which an aluminum film or an aluminum alloy film is sandwiched between upper and lower films of titanium, tantalum, molybdenum, tungsten, or nitride of any of these elements may be used. In this embodiment mode, a conductive film having a structure in which three layers of the conductive films 65a and 65c are stacked is described as the conductive film; for example, a stacked-layer conductive film in which molybdenum films are used as the conductive films 65a and 65c and an aluminum film is used as the conductive film 65b or a stacked-layer conductive film in which titanium films are used as the conductive films 65a and 65c and an aluminum film is used as the conductive film 65b can be given.

The conductive films 65a to 65c are formed by a sputtering method or a vacuum evaporation method. Alternatively, the conductive films 65a to 65c may be formed by discharging a conductive nanopaste of silver, gold, copper, or the like by a screen printing method, an inkjet method, or the like and baking it.

Figure 3A:
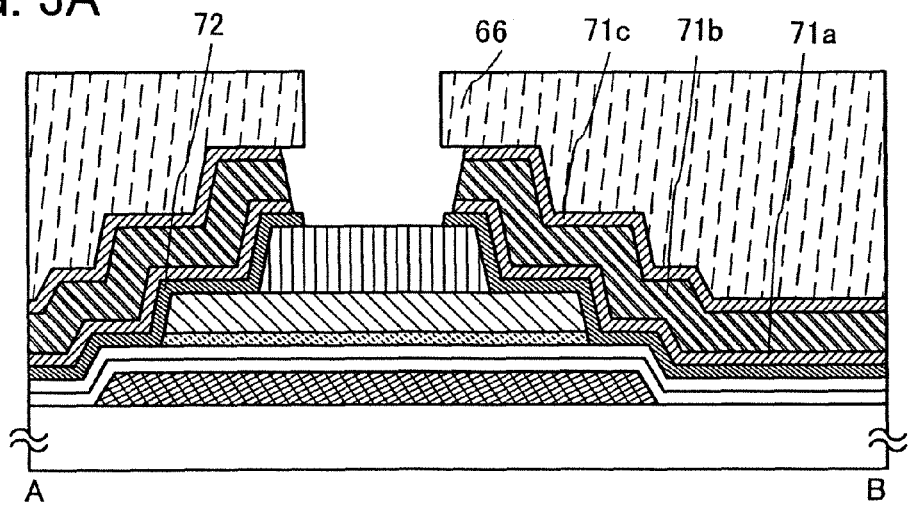
FIGS. 3A to 3C are views describing a manufacturing method of a display device of the present invention.
Figure 3B:
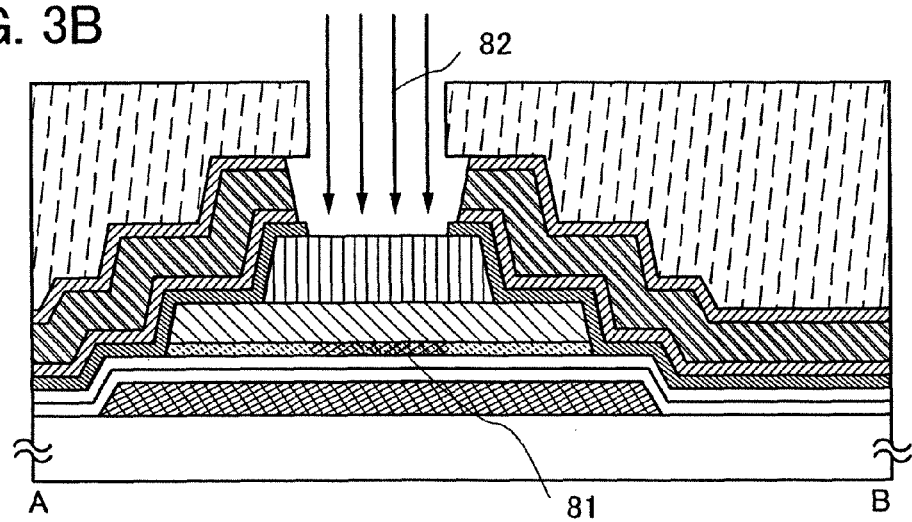
Figure 3C:
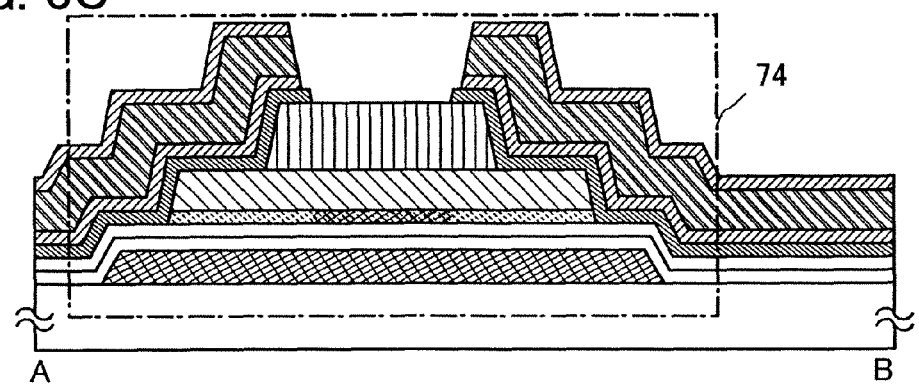
Figure 4A:
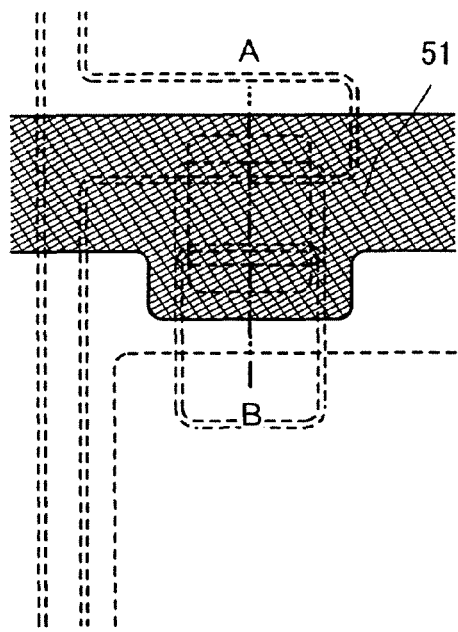
FIGS. 4A to 4D are views describing a manufacturing method of a display device of the present invention.
Figure 4B:
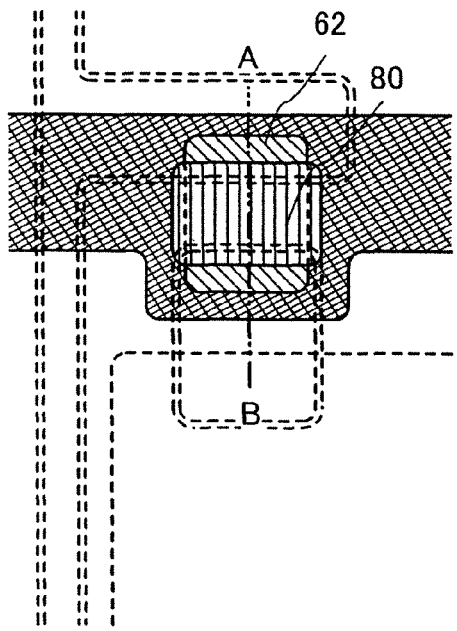
Figure 4C:
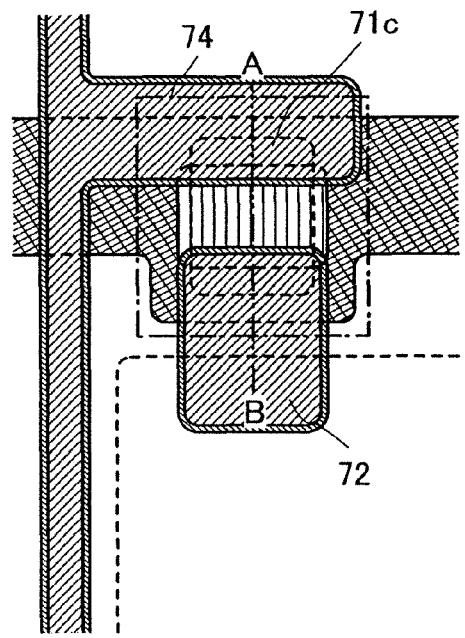
Figure 4D:
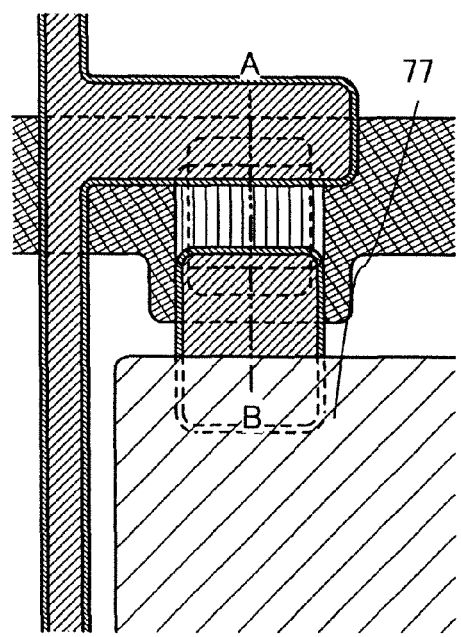

Next, the conductive films 65a to 65c are etched using the mask 66 to form the source and drain electrodes 71a to 71c. When the conductive films 65a to 65c are subjected to wet etching as shown in FIGS. 3A to 3C in this embodiment mode, the conductive films 65a to 65c are isotropically etched, so that end portions of the source and drain electrodes 71a to 71c are not aligned with and are laid back from end portions of the mask 66. Next, the semiconductor film 63 to which an impurity which imparts one conductivity type is added is etched using the mask 66 to form the source and drain regions 72 (see FIG. 3A). Note that the buffer layer 62 is not etched because the channel protective layer 80 functions as a channel stopper.

The end portions of the source and drain electrodes 71a to 71c are not aligned with the end portions of the source and drain regions 72, and the end portions of the source and drain regions 72 are formed outside of the end portions of the source and drain electrodes 71a to 71c.

With the use of the mask 66 as a mask, an impurity element 82 is added to the microcrystalline semiconductor film 61 through the channel protective layer 80 and the buffer layer 62. By the addition of the impurity element 82, the impurity region 81 is selectively formed in the channel formation region of the microcrystalline semiconductor film 61. Since the channel formation region of the microcrystalline semiconductor film 61 is covered with the channel protective layer 80, the impurity region 81 which is a channel doping region is selectively formed in the channel formation region. The impurity element 82 can be added (introduced) by an ion implantation method or an ion doping method.

The addition of the impurity element 82 may also be performed using the source and drain electrodes 71a to 71c as masks after the mask 66 is removed, so that a channel doping region can be selectively formed in the channel formation region of the microcrystalline semiconductor film 61 in a self-aligned manner. Alternatively, the impurity region 81 may be formed using a mask such as a resist mask before the source and drain electrodes 71a to 71c are formed.

In this embodiment mode, since the addition of the impurity element to the microcrystalline semiconductor film 61 is performed through the channel protective layer 80 and the buffer layer 62, damage (e.g., surface roughness) to the microcrystalline semiconductor film by the addition can be reduced. Note that, in the present invention, the addition of the impurity element to the microcrystalline semiconductor film 61 is performed so that a desired concentration peak of the impurity element exists in the microcrystalline semiconductor film 61, and the impurity element may also be added to the buffer layer 62 in the case where the addition of the impurity element to the microcrystalline semiconductor film 61 is performed through the channel protective layer 80 and the buffer layer 62.

After that, the mask 66 is removed. Note that FIG. 3C is a cross-sectional view taken along line A-B in FIG. 4C. It can be seen from FIG. 4C that the end portions of the source and drain regions 72 are positioned outside of the end portions of the source and drain electrodes 71c. Further, it can also be seen that the area of the source and drain regions 72 is larger than that of each of the source and drain electrodes 71a to 71c. Further, one of the source and drain electrodes also functions as a source or drain wiring.

With a shape as shown in FIG. 3C in which the end portions of the source and drain electrodes 71a to 71c are not aligned with the end portions of the source and drain regions 72, the end portions of the source and drain electrodes 71a to 71c are separated from each other; therefore, leakage current and short-circuiting between the source and drain electrodes can be prevented. Further, the source and drain regions 72 extend over the end portions of the source and drain electrodes 71a to 71c, so that the distance between the pair of the source and drain regions 72 is less than that between each pair of the source and drain electrodes 71a to 71c. Accordingly, a thin film transistor with high reliability and high withstand voltage can be manufactured.

Through the above-described process, the channel-stop-type (protective-type) thin film transistor 74 can be formed.

A portion of the buffer layer 62, which is in contact with the source and drain regions 72, and a portion of the buffer layer 62, which is in contact with the channel formation region of the microcrystalline semiconductor film 61 are a continuous film formed of the same material at the same time. The buffer layer 62 over the microcrystalline semiconductor film 61 blocks external air and an etching residue with hydrogen contained therein and protects the microcrystalline semiconductor film 61.

The buffer layer 62 which does not contain an impurity which imparts one conductivity type is provided, whereby an impurity which imparts one conductivity type, contained in the source and drain regions, and an impurity which imparts one conductivity type, used for controlling threshold voltage of the microcrystalline semiconductor film 61, can be prevented from being mixed with each other. If the impurities each of which impart one conductivity type are mixed with each other, a recombination center is formed, which leads to flow of leakage current and loss of the effect of reducing off current.

By provision of the buffer layer and the channel protective layer as described above, a channel-stop-type thin film transistor with high withstand voltage, in which leakage current is reduced, can be manufactured. Accordingly, the thin film transistor has high reliability and can be suitably used for a liquid crystal display device where a voltage of 15 V is applied.

Next, the pixel electrode 77 is formed so as to be in contact with the source or drain electrode 71c. The insulating film 76 is formed over the source and drain electrodes 71a to 71c, the source and drain regions 72, the channel protective layer 80, the gate insulating film 52b, and the pixel electrode 77. The insulating film 76 can be formed in a similar manner to the gate insulating films 52a and 52b. Note that the insulating film 76 is provided to prevent entry of a contaminant impurity such as an organic substance, a metal substance, or moisture floating in the air and is preferably a dense film.

The buffer layer 62 is preferably formed with a thickness greater than or equal to 10 nm and equal to or less than 50 nm. Further, the total concentration of nitrogen, carbon, and oxygen contained in the buffer layer is preferably set to $1 \times 10^{20}$ atoms/cm$^3$ to $1.5 \times 10^{21}$ atoms/cm$^3$. With this concentration, the buffer layer 62 can function as a high-resistance region even when the thickness is greater than or equal to 10 nm and equal to or less than 50 nm.

Alternately, the buffer layer 62 may be formed with a thickness greater than or equal to 150 nm and equal to or less than 200 nm, and the concentration of each of carbon, nitrogen, and oxygen contained in the buffer layer 62 may be set to less than or equal to $3 \times 10^{19}$ atoms/cm$^3$, preferably, less than or equal to $5 \times 10^{18}$ atoms/cm$^3$. In this case, by using a silicon nitride film as the insulating film 76, the oxygen concentration in the buffer layer 62 can be less than or equal to $5 \times 10^{19}$ atoms/cm$^3$, preferably, less than or equal to $1 \times 10^{19}$ atoms/cm$^3$.

Next, the insulating film 76 is etched so that part of the pixel electrode 77 is exposed. A display element is formed to be in contact with an exposed region of the pixel electrode 77, so that the thin film transistor 74 and the display element can be electrically connected to each other. For example, a light-emitting layer may be formed over the pixel electrode 77, and a counter electrode may be formed over the light-emitting layer.

The pixel electrode 77 can be formed of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 77 can be formed of a conductive composition containing a conductive high molecule (also referred to as a conductive polymer). It is preferable that the pixel electrode formed of a conductive composition have a sheet resistance less than or equal to 10000 Ω/square and a light transmittance equal to or greater than 70% at a wavelength of 550 nm. In addition, the resistance of the conductive high molecule which is contained in the conductive composition is desirably less than or equal to 0.1 Ω·cm.

As the conductive high molecule, a so-called π electron conjugated high molecule can be used. For example, polyaniline or a derivative thereof, polypyrrole or a derivative thereof, polythiophenc or a derivative thereof, and a copolymer of two or more kinds of them can be given.

Figure 14:
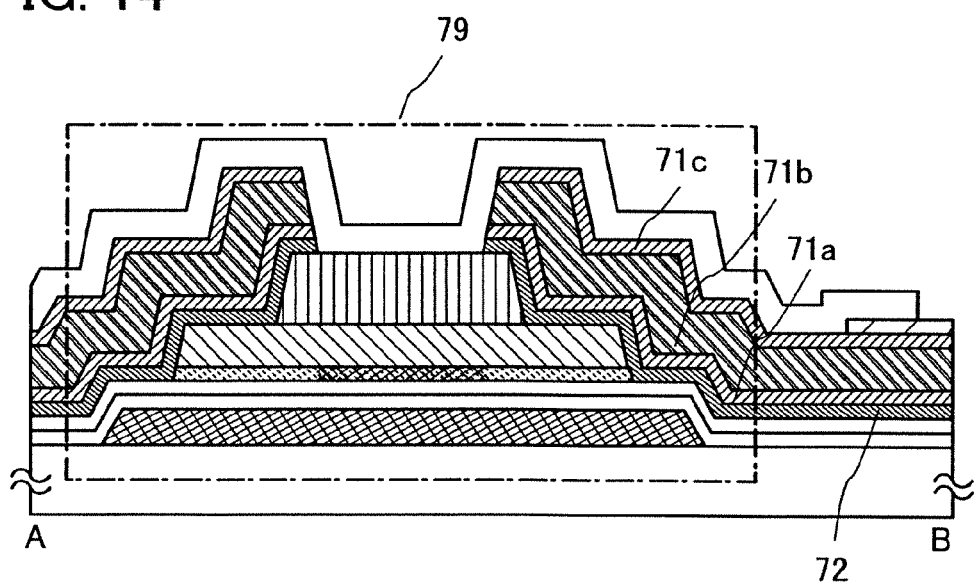
FIG. 14 is a view describing a display device of the present invention.

Further, a shape in which the end portions of a source and drain regions and the end portions of source and drain electrodes are aligned with each other may also be employed. A channel-stop-type thin film transistor 79 in which the end portions of a source and drain regions and the end portions of source and drain electrodes are aligned with each other is shown in FIG. 14. By performing etching of the source and drain electrodes and the source and drain regions with dry etching, the thin film transistor 79 with the above-described shape can be obtained. Further, by etching a semiconductor film to which an impurity which imparts one conductivity type is added, with the source and drain electrodes as masks to form the source and drain regions, the thin film transistor 79 with the above-described shape can also be obtained.

A display device includes a display element. A liquid crystal element (also referred to as a liquid crystal display element) or a light-emitting element (also referred to as a light-emitting display element) can be used as the display element. The light-emitting element includes, in its category, an element whose luminance is controlled by a current or voltage, and specifically includes an inorganic electroluminescent (EL) element, an organic EL element, and the like. Further, a display medium whose contrast is changed by an electric effect, such as an electronic ink, can be applied as well.

Further, the display device includes a panel in which a display element is sealed, and a module in which an IC and the like including a controller are mounted on the panel. The present invention further relates to one mode before the display element is completed in a manufacturing process of the display device, i.e., an element substrate, and the element substrate is provided with a means for supplying current to the display element for each pixel. The element substrate may be specifically in a state where only a pixel electrode of a display element is formed or in a state after a conductive film to be a pixel electrode is formed and before the conductive film is etched to form a pixel electrode, and can have any mode.

Note that a display device in this specification means an image display device, a display device, or a light source (including a lighting device). Further, the display device includes any of the following modules in its category: a module including a connector such as an flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip on glass (COG) method.

By forming a channel-stop-type thin film transistor as a thin film transistor, reliability of the thin film transistor can be improved. Further, by forming a channel formation region with the use of a microcrystalline semiconductor film, a field-effect mobility of 1 to 20 cm$^2$/V·sec can be achieved. Accordingly, this thin film transistor can be used as a switching element of a pixel in a pixel portion and as an element included in a scanning line (gate line) driver circuit.

According to this embodiment mode, a display device having a thin film transistor with high electric characteristics and high reliability can be manufactured.

(Embodiment Mode 2)

An example in which the shape of a thin film transistor is different in Embodiment Mode 1 will be described in this embodiment mode. Except the shape, the thin film transistor can be formed in a similar manner to Embodiment Mode 1; thus, repetitive description of the same components as or components having similar functions to Embodiment Mode 1 and manufacturing steps for forming those components will be omitted.

Figure 5:
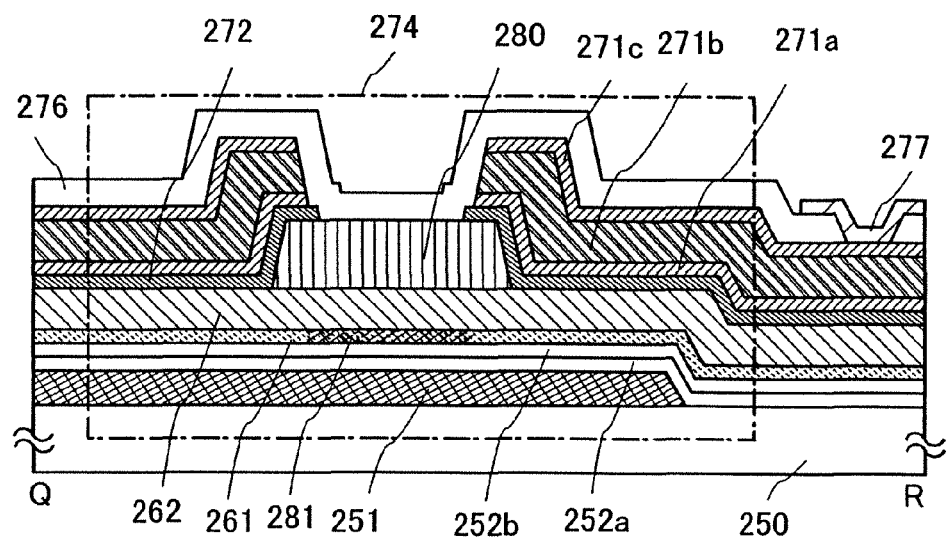
FIG. 5 is a view describing a display device of the present invention.
Figure 15:
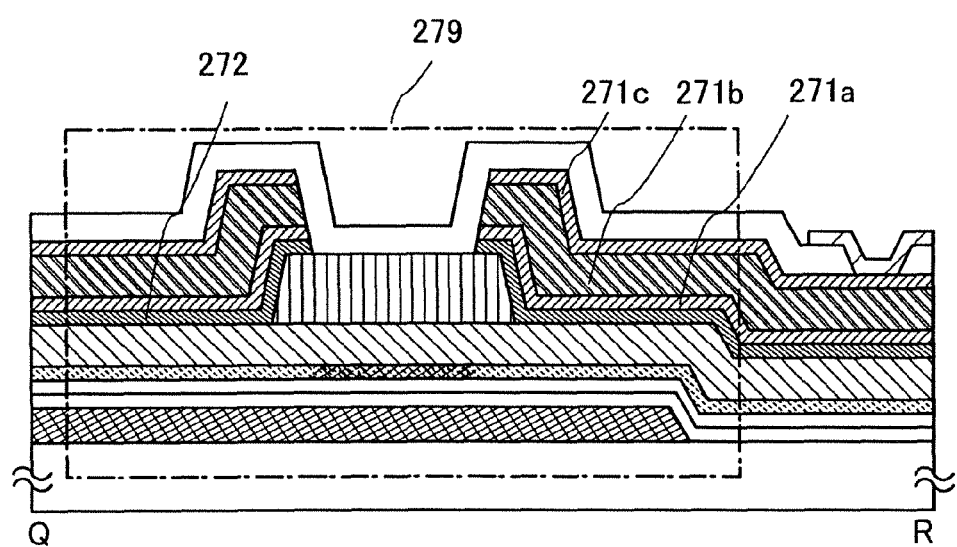
FIG. 15 is a view describing a display device of the present invention.

A thin film transistor which is used for a display device and a manufacturing process of the thin film transistor will be described with reference to FIG. 5, FIGS. 6A to 6D, and FIG. 15 in this embodiment mode. FIG. 5 and FIG. 15 are cross-sectional views showing a thin film transistor and a pixel electrode, and FIGS. 6A to 6D are plane views showing a region in a pixel where the thin film transistor and the pixel electrode are connected to each other. FIG. 5 and FIG. 15 are cross-sectional views showing the thin film transistor along line Q-R in FIGS. 6A to 6D, and a manufacturing process thereof.

A channel-stop-type (also called a channel-protective-type) bottom-gate thin film transistor 274 of this embodiment mode is shown in FIG. 5 and FIGS. 6A to 6D.

In FIG. 5, the channel-stop-type thin film transistor 274 is provided over a substrate 250. The channel-stop-type thin film transistor 274 includes a gate electrode 251, gate insulating films 252a and 252b, a microcrystalline semiconductor film 261, a buffer layer 262, a channel protective layer 280, a source and drain regions 272, and source and drain electrodes 271a, 271b, and 271c. An insulating film 276 is provided so as to cover the thin film transistor 274. A pixel electrode 277 is provided so as to be in contact with the source or drain electrode 271c in a contact hole formed in the insulating film 276. Note that FIG. 5 corresponds to FIG. 6D.

Furthermore, in a channel formation region of the microcrystalline semiconductor film 261, an impurity region 281 containing an impurity element of one conductivity type is provided selectively in a region which is not overlapped with the source and drain electrodes 271a, 271b, and 271c.

In this embodiment mode, channel doping is selectively (partly) performed in the channel formation region of the microcrystalline semiconductor film 261. After the formation of the source and drain electrodes 271a, 271b, and 271c, an impurity element of one conductivity type is added to the microcrystalline semiconductor film 261 through the buffer layer 262 and the channel protective layer 280 which is exposed between the source and drain electrodes 271a, 271b, and 271c, with the source and drain electrodes 271a, 271b, and 271c (or a mask layer) used as masks (or a mask), whereby an added region and a non-added region of the impurity element of one conductivity type are generated in a self-aligned manner in the channel formation region of the microcrystalline semiconductor film 261 which is covered with the channel protective layer 280, so that the impurity region 281 can formed selectively.

The microcrystalline semiconductor film has low n-type conductivity when an impurity element for controlling valence electrons is not added thereto intentionally. Therefore, by addition of an impurity element which imparts p-type conductivity to the microcrystalline semiconductor film which functions as a channel formation region of a thin film transistor, the threshold voltage can he controlled. A typical example of the impurity element which imparts p-type conductivity is boron; and an impurity gas such as $B_2H_6$ or $BF_3$ may he added to silicon hydride at 1 ppm to 1000 ppm, preferably, 1 ppm to 100 ppm. The concentration of boron may be set to $1 \times 10^{14}$ to $6 \times 10^{16}$ atoms/cm$^3$.

Control of the threshold voltage by a channel doping method is carried out by the concentration of an impurity element. In the present invention, channel doping is performed not on the whole of the channel formation region but so as to selectively form a channel doping region. Therefore, in the present invention, the threshold voltage can be controlled more precisely by controlling the area of the channel formation region. In the case where the impurity is added to the microcrystalline semiconductor film through the channel protective layer, it is difficult to control the concentration of the impurity element in the microcrystalline semiconductor film which exists deep in a film-thickness direction and the control tends to be varied, and there is a fear of damage to the film because the addition needs to be performed at energy high enough to pass the impurity element through the channel protective layer. According to the present invention, film damage to the microcrystalline semiconductor film can be prevented and the threshold value can be controlled more accurately and uniformly. Accordingly, high reliability and high performance can be achieved in a thin film transistor and a display device including the thin film transistor.

With the structure in which the channel protective layer 280 is provided over the channel formation region of the microcrystalline semiconductor film 261 with the buffer layer 262 interposed therebetween, damage which is caused in the manufacturing process, to the buffer layer 262 over the channel formation region of the microcrystalline semiconductor film 261 (e.g., reduction in film thickness due to a plasma radical or an etching agent in etching, or oxidation) can be prevented. Therefore, reliability of the thin film transistor 274 can be improved. Further, since the buffer layer 262 over the channel formation region of the microcrystalline semiconductor film 261 is not etched, the buffer layer 262 is not needed to be formed thickly, and thus film deposition time of the buffer layer can be shortened.

Hereinafter, a manufacturing method thereof will be described with reference to FIGS. 6A to 6D. The gate electrode 251 is formed over the substrate 250 (see FIG. 6A). The gate insulating films 252a and 252b are formed over the gate electrode 251, and the microcrystalline semiconductor film 261 and the buffer layer 262 are formed thereover. Over the buffer layer 262, the channel protective layer 280 is formed so as to overlap with the channel formation region of the microcrystalline semiconductor film 261 (see FIG. 6B).

An example in which, after formation of the channel protective layer 80, the microcrystalline semiconductor film 53 and the buffer layer 54 are processed into the island-shaped microcrystalline semiconductor film 61 and the island-shaped buffer layer 62, respectively, by etching is described in Embodiment Mode 1. On the other hand, an example in which the microcrystalline semiconductor film and the buffer layer are etched at the same time when source and drain electrodes and a semiconductor film to which an impurity which imparts one conductivity type is added are etched will be described in this embodiment mode. Therefore, the microcrystalline semiconductor film, the buffer layer, the semiconductor film to which an impurity which imparts one conductivity type is added, and the source and drain electrodes are formed while reflecting the same shape. If they are etched by one etching process as described above, the manufacturing process can be simplified, and the number of masks used in the etching process can be reduced.

A microcrystalline semiconductor film, a buffer layer, a semiconductor film to which an impurity which imparts one conductivity type is added, and conductive films are etched, so that the microcrystalline semiconductor film 261, the buffer layer 262, the source and drain regions 272, and the source and drain electrodes 271a to 271c are formed.

An impurity element which imparts one conductivity type is added to the microcrystalline semiconductor film 261 with the source and drain electrodes 271a to 271c as masks through the channel protective layer 280 and the buffer layer 262. By the addition of the impurity element, the impurity region 281 is selectively formed in the channel formation region of the microcrystalline semiconductor film 261. Since the channel formation region of the microcrystalline semiconductor film 261 is covered with the channel protective layer 280, the impurity region 281 that is a channel doping region is selectively formed in the channel formation region. The impurity element can be added (introduced) by an ion implantation method or an ion doping method.

In this embodiment mode, since the addition of the impurity element to the microcrystalline semiconductor film 261 is performed through the channel protective layer 280 and the buffer layer 262, damage (e.g., surface roughness) to the microcrystalline semiconductor film 261 by the addition can be reduced.

Figure 6A:
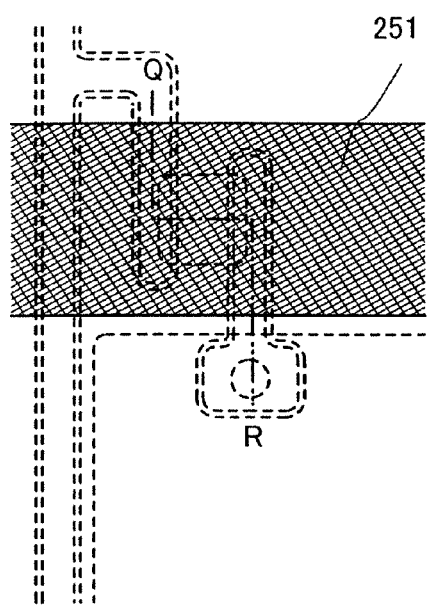
FIGS. 6A to 6D are views describing a manufacturing method of a display device of the present invention.
Figure 6B:
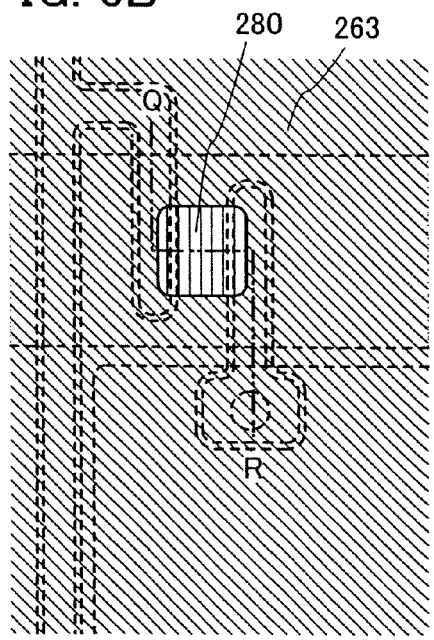
Figure 6C:
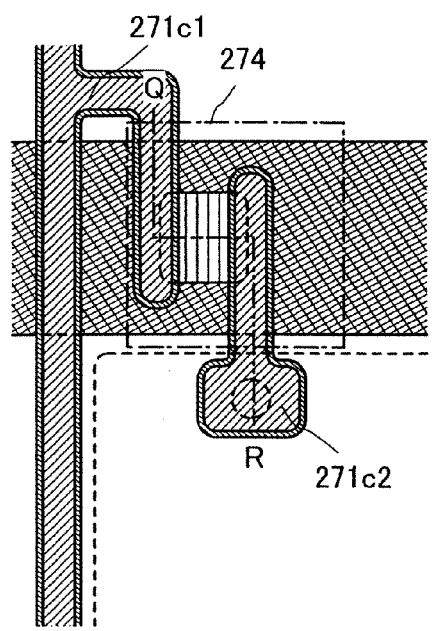
Figure 6D:
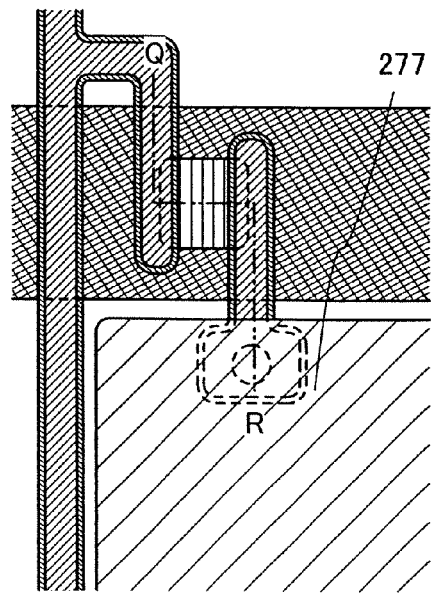

Through the above process, the channel-top-type thin film transistor 274 is formed (see FIG. 6C). The insulating film 276 is formed so as to cover the thin film transistor 274, and a contact hole which reaches the source or drain electrode 271c is formed. The pixel electrode 277 is formed in the contact hole, so that the thin film transistor 274 and the pixel electrode 277 are electrically connected to each other (see FIG. 6D).

Further, a shape in which the end portions of a source and drain regions and the end portions of source and drain electrodes are aligned with each other and successive may also be employed. A channel-stop-type thin film transistor 279 in which the end portions of a source and drain regions and the end portions of source and drain electrodes are aligned with each other and successive is shown in FIG. 15. By performing etching of the source and drain electrodes and the source and drain regions with dry etching, the thin film transistor 279 with the above-described shape can be obtained. Further, by etching a semiconductor film to which an impurity which imparts one conductivity type is added, with the source and drain electrodes as masks to form the source and drain regions, the thin film transistor 279 with the above-described shape can also be obtained.

By forming a channel-stop-type thin film transistor as a thin film transistor, reliability of the thin film transistor can be improved. Further, by forming a channel formation region with the use of a microcrystalline semiconductor film, a field-effect mobility of 1 to 20 cm$^2$/V·sec can be achieved. Accordingly, this thin film transistor can be used as a switching element of a pixel in a pixel portion and as an element included in a scanning line (gate line) driver circuit.

According to this embodiment mode, a display device having a thin film transistor with excellent electric characteristics and high reliability can be manufactured.

(Embodiment Mode 3)

An example of a manufacturing process in which a microcrystalline semiconductor film is irradiated with laser light will be described in this embodiment mode.

A gate electrode is formed over a substrate, and a gate insulating film is formed so as to cover the gate electrode. Then, a microcrystalline silicon (SAS) film is deposited as a microcrystalline semiconductor film over the gate insulating film. The thickness of the microcrystalline semiconductor film is greater than or equal to 1 nm and less than 15 nm, preferably, 2 to 10 nm inclusive. In particular, the microcrystalline semiconductor film with a thickness of 5 nm (4 to 8 am) has high absorptance of laser light, and thus, improves productivity.

In the case where the microcrystalline semiconductor film is formed over the gate insulating film by a plasma CVD method or the like, a region which contains more amorphous components than a semiconductor film which contains crystals (here such a region is referred to as an interface region) is formed near the interface between the gate insulating film and the semiconductor film which contains crystals, in some cases. Further, in the case where an ultra-thin microcrystalline semiconductor film with a thickness of about less than or equal to 10 nm is formed by a plasma CVD method or the like, a semiconductor film which contains microcrystal grains can be formed, but it is difficult to obtain a semiconductor film which contains microcrystal grains uniformly with high quality throughout the film, in these cases, a laser process for irradiation with laser light which is described below is effective.

Next, the microcrystalline semiconductor film is irradiated with laser light from the surface side. The irradiation with the laser light is performed with the energy density as low as the microcrystalline semiconductor film is not melted. That is, the laser process (hereinafter also referred to as 'LP') of this embodiment mode is carried out by solid-phase crystal growth which is performed by radiation heating without melting the microcrystalline silicon film. That is, the process utilizes a critical region where a deposited microcrystalline silicon film is not brought into a liquid phase, and in that sense, the process can also be referred to as 'critical growth'.

The laser light can affect a region to the interface between the microcrystalline silicon film and the gate insulating film. Accordingly, using crystals on the surface side of the microcrystalline silicon film as seeds, solid-phase crystal growth proceeds from the surface toward the interface with the gate insulating film, and roughly columnar crystals grow. Solid-phase crystal growth by an LP process does not increase a crystal diameter but improves the crystallinity in a film-thickness direction.

In the LP process, for example, a microcrystalline silicon film over a glass substrate of 730 mm×920 mm can be processed with one laser beam scan, by collecting a laser beam into a long rectangular shape (a linear laser beam). In this case, the proportion of overlap of linear laser beams (the overlap rate) is set to 0 to 90% (preferably, 0 to 67%). Accordingly, process time for each substrate can be shortened, and productivity can be increased. The shape of the laser beam is not limited to a linear shape, and similar processing can be conducted using a planar laser beam. Further, the LP process of this embodiment mode is not limited to be used for the glass substrate with the above-described size and can be used for substrates with various sizes.

The LP process has effects in improving crystallinity of an interface region with the gate insulating film and improving electric characteristics of a thin film transistor having a bottom-gate structure like the thin film transistor of this embodiment mode.

Such critical growth also has a feature in that roughness (a projection called a ridge) of a surface, which is observed in the case of conventional low-temperature polysilicon, is not formed and the smoothness of a silicon surface is maintained even after the LP process.

A crystalline silicon film which is obtained by the action of the laser beam directly on the microcrystalline silicon film after the formation as in this embodiment mode is distinctly different in growth mechanism and film quality from a conventional microcrystalline silicon film which is obtained by being just deposited and a microcrystalline silicon film which is modified by conduction heating (the one disclosed in Reference 1). In this specification, a crystalline semiconductor film which is obtained through the LP process performed to a microcrystalline semiconductor film after being deposited is referred to as an LPSAS film.

After the microcrystalline semiconductor film such as an LPSAS film is formed, an amorphous silicon (a-Si:H) film is formed as a buffer layer by a plasma CVD method at 300° C. to 400° C. By the formation of the amorphous silicon film, hydrogen is supplied to the LPSAS film, and the same effect as hydrogenation of the LPSAS film can be achieved. That is, by deposition of the amorphous silicon film over the LPSAS film, hydrogen is diffused into the LPSAS film, so that a dangling bond can be terminated.

Subsequent steps are similar to those in Embodiment Mode 1, so that a channel protective layer is formed, and a mask is formed thereover. Next, the microcrystalline semiconductor film and the buffer layer are etched using the mask. Then, a semiconductor film to which an impurity which imparts one conductivity type is added and a conductive film are formed, and a mask is formed over the conductive film. Next, using the mask, the conductive film is etched to be divided to form a source and drain electrodes. Further, using the same mask, the semiconductor film to which an impurity which imparts one conductivity type is added is etched using the channel protective layer as an etching stopper, so that a source and drain regions are formed. Furthermore, using the same mask or the source and drain electrodes as a mask or masks, an impurity element which imparts one conductivity type is added to the microcrystalline semiconductor film through the channel protective layer, so that an impurity region that is a channel doping region is formed selectively in the channel formation region of the microcrystalline semiconductor film.

Through the above-described process, a channel-stop-type thin film transistor can be formed, and a display device having the channel-stop-type thin film transistor can be manufactured.

Further, this embodiment mode can be combined with Embodiment Mode 1 or 2 as appropriate.

(Embodiment Mode 4)

An example in which the shape of a thin film transistor is different in Embodiment Mode 1 will be described in this embodiment mode. Except the shape, the thin film transistor can be formed in a similar manner to Embodiment Mode 1; thus, repetitive description of the same components as or components having similar functions to Embodiment Mode 1 and manufacturing steps for forming those components will be omitted.

Figure 31:
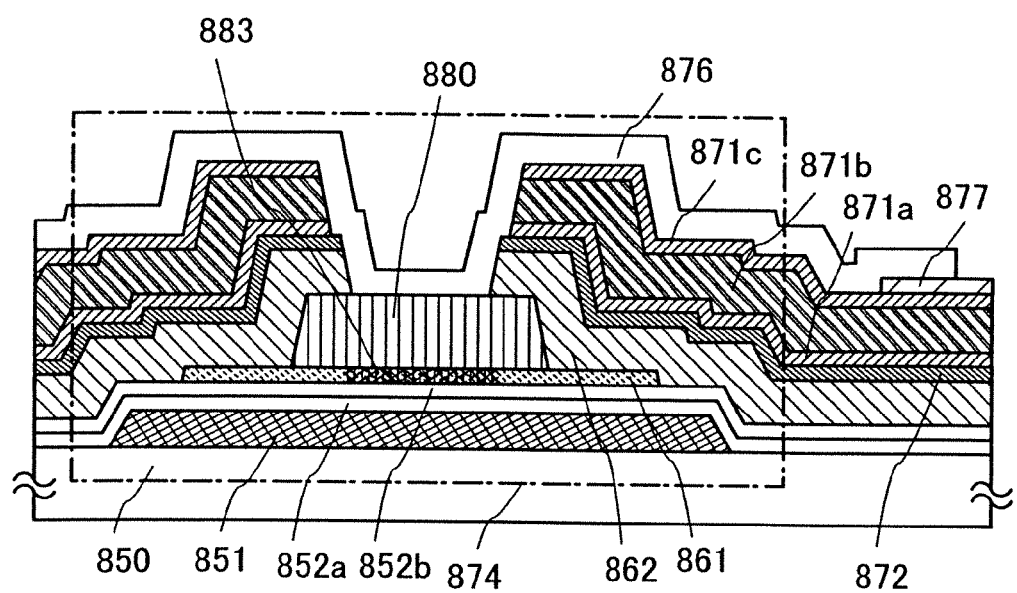
FIG. 31 is a view describing a manufacturing method of a display device of the present invention.

A channel-stop-type bottom-gate thin film transistor 874 of this embodiment mode is shown in FIG. 31.

In FIG. 31, the channel-stop-type thin film transistor 874 is provided over a substrate 850. The channel-stop-type thin film transistor 874 includes a gate electrode 851, gate insulating films 852a and 852b, a microcrystalline semiconductor film 861, a channel protective layer 880, a buffer layer 862, a source and drain regions 872, and source and drain electrodes 871a, 871b, and 871c. An insulating film 876 is provided so as to cover the thin film transistor 874. A pixel electrode 877 is formed so as to be in contact with the source or drain electrode 871c in a contact hole formed in the insulating film 876.

Furthermore, in a channel formation region of the microcrystalline semiconductor film 861, an impurity region 883 containing an impurity element of one conductivity type is provided selectively in a region which is not overlapped with the source and drain electrodes 871a, 871b, and 871c.

Further, in this embodiment mode, the channel protective layer 880 is formed in contact with the channel formation region of the microcrystalline semiconductor film 861, and the buffer layer 862 is formed over the channel protective layer 880 and the microcrystalline semiconductor film 861. In this embodiment mode, the impurity region 883 is irradiated with light after an impurity element is added, so that an effect by channel doping is further improved.

This embodiment mode is one feature of the present invention and a structure in which a channel protective layer is formed in contact with a channel formation region of a microcrystalline semiconductor film and a buffer layer is formed over the channel protective layer and the microcrystalline semiconductor film. In this case, an impurity region which is selectively formed in the channel formation region of the microcrystalline semiconductor film can be irradiated with laser light through the channel protective layer. Activation and improvement of crystallinity of the impurity region can be performed by the laser light irradiation, so that the effect of channel doping can be improved. Further, the channel protective layer functions as an antireflection film with respect to laser light, so that more efficient laser irradiation can be performed on the microcrystalline semiconductor film.

A method for manufacturing a display device having the thin film transistor of this embodiment mode shown in FIG. 31 will be described using FIGS. 32A to 32C and FIGS. 33A to 33C. The gate electrode 851 is formed over the substrate 850, the gate insulating films 852a and 852b are formed over the gate electrode 851, and the microcrystalline semiconductor film 861 is formed thereover. The channel protective layer 880 is formed in a region which is overlapped with a channel formation region of the microcrystalline semiconductor film 861 (see FIG. 32A). In this embodiment mode, the channel protective layer 880 is formed on the microcrystalline semiconductor film 861 so as to be in contact with each other.

The laser light irradiation process described in Embodiment Mode 3 may be performed on the microcrystalline semiconductor film 861.

Figure 32A:
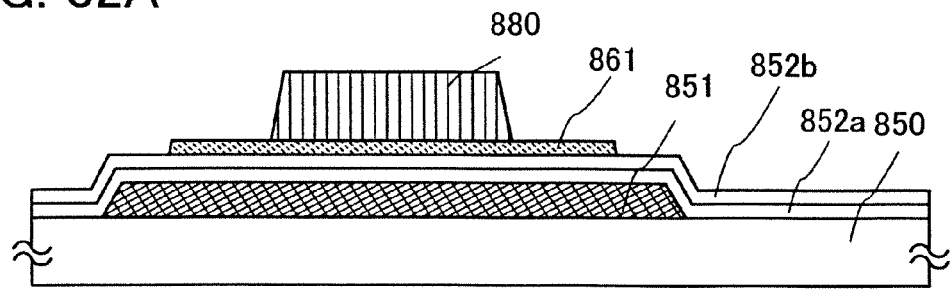
FIGS. 32A to 32C are views describing a manufacturing method of a display device of the present invention.
Figure 32B:
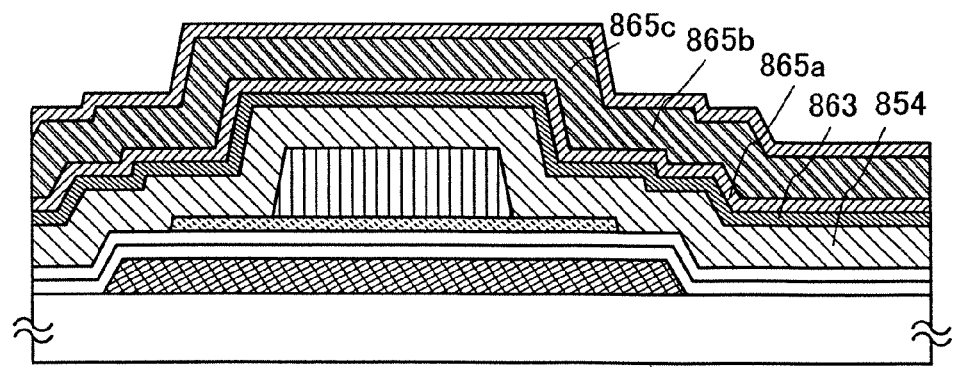
Figure 32C:
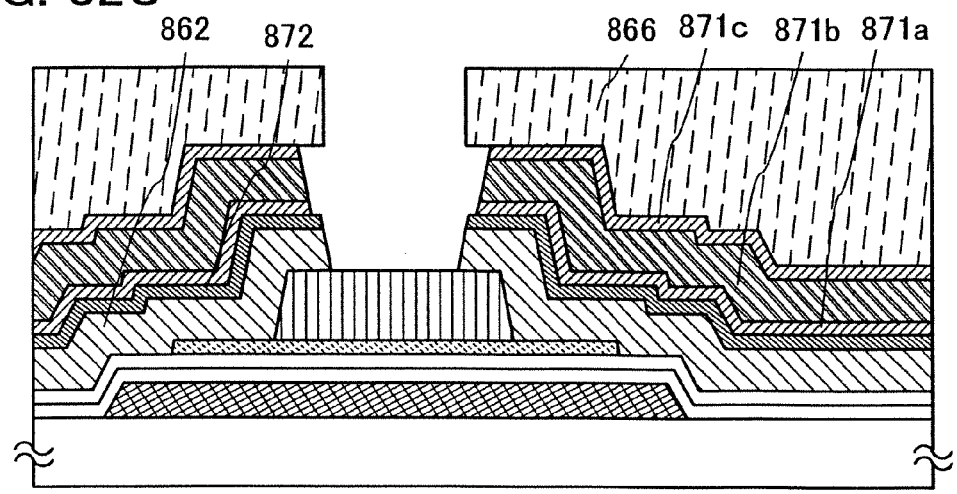

Over the microcrystalline semiconductor film 861 and the channel protective layer 880, a buffer layer 854, a semiconductor film 863 to which an impurity which imparts one conductivity type is added, and conductive films 865a, 865b, and 865c are stacked (see FIG. 32B).

With the use of a mask 866, the buffer layer 854, the semiconductor film 863 to which an impurity which imparts one conductivity type is added, and the conductive films 865a, 865b, and 865c are etched, so that the buffer layer 862, the source and drain regions 872, and the source and drain electrodes 871a, 871b, and 971c are formed. In this embodiment mode, the conductive films 865a, 865b, and 865c are etched by wet etching, and the buffer layer 854 and the semiconductor film 863 to which an impurity which imparts one conductivity type is added are etched by dry etching.

An example in which the buffer layer, the source and drain electrodes, and the semiconductor film to which an impurity which imparts one conductivity type is added are etched by the same step is described in this embodiment mode. Therefore, the buffer layer, the semiconductor film to which an impurity which imparts one conductivity type is added, and the source and drain electrodes are formed while reflecting almost the same shape. If they are etched by one etching process as described above, the manufacturing process can be simplified, and the number of masks used in the etching process can be reduced.

An impurity element 882 which imparts one conductivity type is added to the microcrystalline semiconductor film 861 with the mask 866 through the channel protective layer 880 which is exposed between the source and drain electrodes 871a to 871c. By the addition of the impurity element 882, an impurity region 881 is selectively formed in the channel formation region of the microcrystalline semiconductor film 861. Since the channel formation region of the microcrystalline semiconductor film 861 is covered with the channel protective layer 880, the impurity region 881 that is a channel doping region is selectively formed in the channel formation region. The impurity element 882 can be added (introduced) by an ion implantation method or an ion doping method.

In this embodiment mode, since the addition of the impurity element to the microcrystalline semiconductor film 861 is performed through the channel protective layer 880, damage (e.g., surface roughness) to the microcrystalline semiconductor film 861 by the addition can be reduced.

Control of the threshold voltage by a channel doping method is carried out by the concentration of an impurity element. In this embodiment mode, channel doping is performed not on the whole of the channel formation region but so as to selectively form a channel doping region. Therefore, in the present invention, the threshold voltage can be controlled more precisely by controlling the area of the channel formation region. In the case where the impurity is added to the microcrystalline semiconductor film through the channel protective layer, it is difficult to control the concentration of the impurity element in the microcrystalline semiconductor film which exists deep in a film-thickness direction and the control tends to be varied, and there is a fear of damage to the film because the addition needs to be performed at energy high enough to pass the impurity element through the channel protective layer. According to the present invention, film damage to the microcrystalline semiconductor film can be prevented and the threshold value can be controlled more accurately and uniformly. Accordingly, high reliability and high performance can be achieved in a thin film transistor and a display device including the thin film transistor.

The microcrystalline semiconductor film has low n-type conductivity when an impurity element for controlling valence electrons is not added thereto intentionally. Therefore, by addition of an impurity element which imparts p-type conductivity to the microcrystalline semiconductor film which functions as a channel formation region of a thin film transistor, the threshold voltage can be controlled. A typical example of the impurity element which imparts p-type conductivity is boron; and an impurity gas such as $B_2H_6$ or $BF_3$ may be added to silicon hydride at 1 ppm to 1000 ppm, preferably, 1 ppm to 100 ppm. The concentration of boron may be set to $1\times10^{14}$ to $6\times10^{16}$ atoms/cm$^3$.

Further, in this embodiment mode, the channel protective layer 880 is formed in contact with the channel formation region of the microcrystalline semiconductor film 861 and the buffer layer 862 is formed over the channel protective layer 880 and the microcrystalline semiconductor film 861. In this case, the impurity region 881 which is selectively formed in the channel formation region of the microcrystalline semiconductor film 861 can be irradiated with laser light 884 through the channel protective layer. The impurity region 881 can be reformed to be the impurity region 883 by the irradiation with the laser light 884 (see FIG. 3B). Activation and improvement of crystallinity of the impurity region can be performed by the laser light irradiation, so that the effect of channel doping can be improved. Further, the channel protective layer 880 functions as an antireflection film against the laser light 884, so that more efficient laser irradiation can be performed on the microcrystalline semiconductor film 861. Further, the channel protective layer 880 functions also as a protective layer, so that damage to the microcrystalline semiconductor film 861 due to laser irradiation, such as surface roughness or deformation of a film can be prevented.

Irradiation conditions (e.g., light energy, wavelength, and irradiation period of time) of light irradiation of an impurity region that is a channel doping region of a microcrystalline semiconductor film may be set as appropriate in accordance with a material or a thickness of a channel protective layer through which light passes, a material, thickness, and the like of the microcrystalline semiconductor film.

As a laser for emitting the laser light 884, a continuous wave laser, a pseudo continuous wave laser, or a pulsed laser can be used. For example, a gas laser such as an excimer laser such as a KrF laser, and a gas laser such as art Ar laser, or a Kr laser can be given. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like can be given. Note that an excimer laser is a pulsed laser, and some solid-state lasers such as a YAG laser can be used as any of a continuous wave laser, a pseudo continuous wave laser, and a pulsed laser. Note that, in a solid-state laser, the second to fifth harmonics can be preferably used. Further alternatively, a semiconductor laser such as a GaN laser, a GaAs laser, a GaAlAs laser, or an InGaAsP laser can be used.

Further, lamp light may be used as well. For example, light emitted from an ultraviolet ray lamp, a black-light, a halogen lamp, a metal halide lamp, a xenon arc lamp, a carbon arc lamp, a high-pressure sodium vapor lamp, or a high-pressure mercury vapor lamp may be used.

Figure 33A:
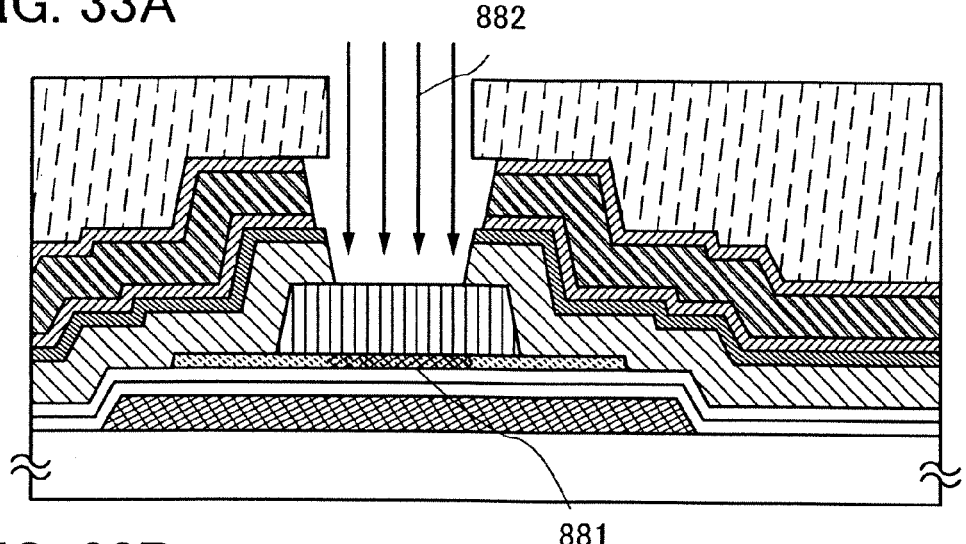
FIGS. 33A to 33C are views describing a manufacturing method of a display device of the present invention.
Figure 33B:
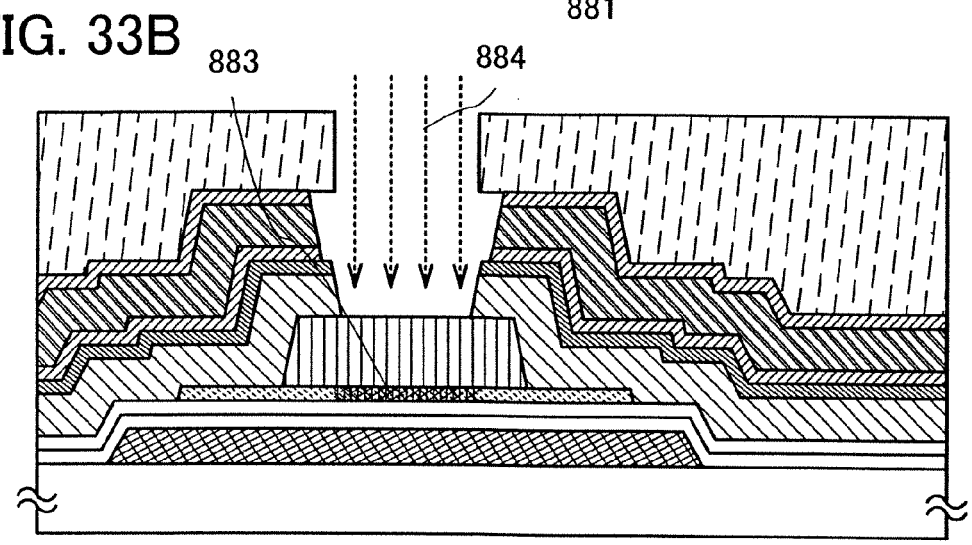
Figure 33C:
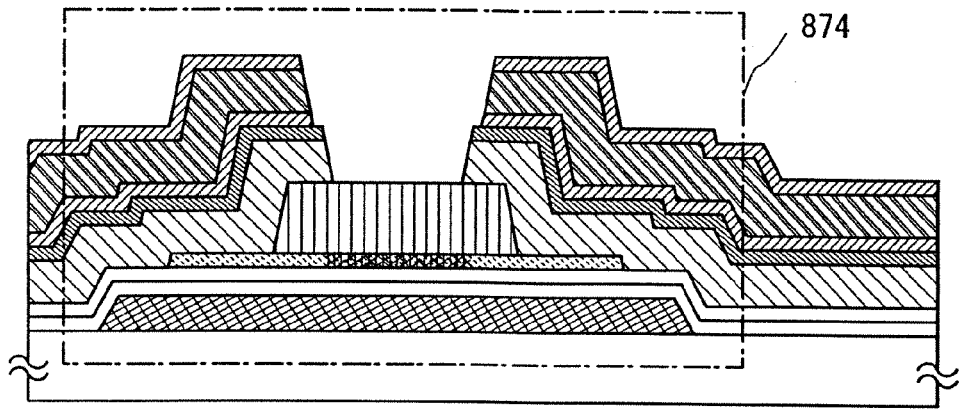

Through the above-described process, the channel-stop-type thin film transistor 874 is formed (see FIG. 33C). The insulating film 876 is formed so as to cover the thin film transistor 874, and the contact hole which reaches the source or drain electrode 871c is formed. The pixel electrode 877 is formed in the contact hole, so that the thin film transistor 874 and the pixel electrode 877 are electrically connected to each other (see FIG. 31).

Further, a shape in which the end portions of a buffer layer, a source and drain regions, and source and drain electrodes are aligned with each other may also be employed. A thin film transistor in which the end portions of a buffer layer, a source and drain regions, and source and drain electrodes are aligned with each other can be formed as follows: etching of source and drain electrodes and etching of a buffer layer and a source and drain regions are performed with dry etching; or etching of a buffer layer and a semiconductor film to which an impurity which imparts one conductivity type is added, is performed with source and drain electrodes as masks to form the buffer layer and the source and drain regions.

By forming a channel-stop-type thin film transistor as a thin film transistor, reliability of the thin film transistor can be improved. Further, by forming a channel formation region with the use of a microcrystalline semiconductor film, a field-effect mobility of 1 to 20 $cm^2/V \cdot sec$ can be achieved. Accordingly, this thin film transistor can be used as a switching element of a pixel in a pixel portion and as an element included in a scanning line (gate line) driver circuit.

According to this embodiment mode, a display device having a thin film transistor with high electric characteristics and high reliability can be manufactured.

(Embodiment Mode 5)

An example of the manufacturing process of the display device described in any of Embodiment Modes 1 to 4 will be described in detail in this embodiment mode. Therefore, repetitive description of the same components as or components having similar functions to Embodiment Modes 1 to 4 and manufacturing steps for forming those components will be omitted.

In Embodiment Modes 1 to 4, before the microcrystalline semiconductor film is formed, a reaction chamber may be subjected to cleaning and/or flush (washing) treatment (e.g., hydrogen flush using hydrogen as a flush substance or silane flush using silane as a flush substance). By the flush treatment, a film to be formed can be prevented from being contaminated by an impurity such as oxygen, nitrogen, or fluorine in the reaction chamber.

The flushing treatment can remove impurities such as oxygen, nitrogen, and fluorine in the reaction chamber. For example, flush treatment is performed in the following manner: a plasma CVD apparatus is used, and monosilane is used as a flush substance and introduced into a chamber at a gas flow rate of 8 to 10 SLM for 5 to 20 minutes, preferably, 10 to 15 minutes to perform silane flush treatment. Note that 1 SLM is 1000 sccm, that is, 0.06 $m^3/h$.

Cleaning can be performed with the use of, for example, fluorine radicals. Note that the inside of the reaction chamber can be cleaned by introduction of fluorine radicals into the reaction chamber, which are generated by introduction of carbon fluoride, nitrogen fluoride, or fluorine into a plasma generator provided outside of the reaction chamber and by dissociation thereof.

Flush treatment may also be performed before the gate insulating film, the buffer layer, the channel protective layer, and the semiconductor film to which an impurity which imparts one conductivity type is added are formed. Note that it is effective that flush treatment is performed after cleaning.

Before a substrate is carried into a reaction chamber to perform film formation, the inner wall of each reaction chamber may be coated with a protective film that is a film to be formed (this coating is also referred to as pre-coating treatment). Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 to 0.4 μm. Flush treatment (hydrogen flush, silane flush, or the like) may also be performed after pre-coating treatment. In the case of performing cleaning and/or pre-coating treatment, it is necessary that a substrate is carried out from a reaction chamber. However, in the case of performing flush treatment (hydrogen flush, silane flush, or the like), a substrate may be kept in a reaction chamber because plasma treatment is not performed.

A protective film formed of an amorphous silicon film is formed in a reaction chamber in which a microcrystalline silicon film is to be formed, and hydrogen plasma treatment is performed before film formation, whereby the protective film is etched and an extremely small amount of silicon is deposited on a substrate and can be a nucleus of crystal growth.

By the pre-coating treatment, a film to be formed can be prevented from being contaminated by an impurity such as oxygen, nitrogen, or fluorine in the reaction chamber.

Pre-coating treatment may also be performed before formation of a gate insulating film and a semiconductor film to which an impurity which imparts one conductivity type is added.

Furthermore, an example of a method for forming a gate insulating film, a microcrystalline semiconductor film, and a buffer layer will be described in detail.

Figure 13A:
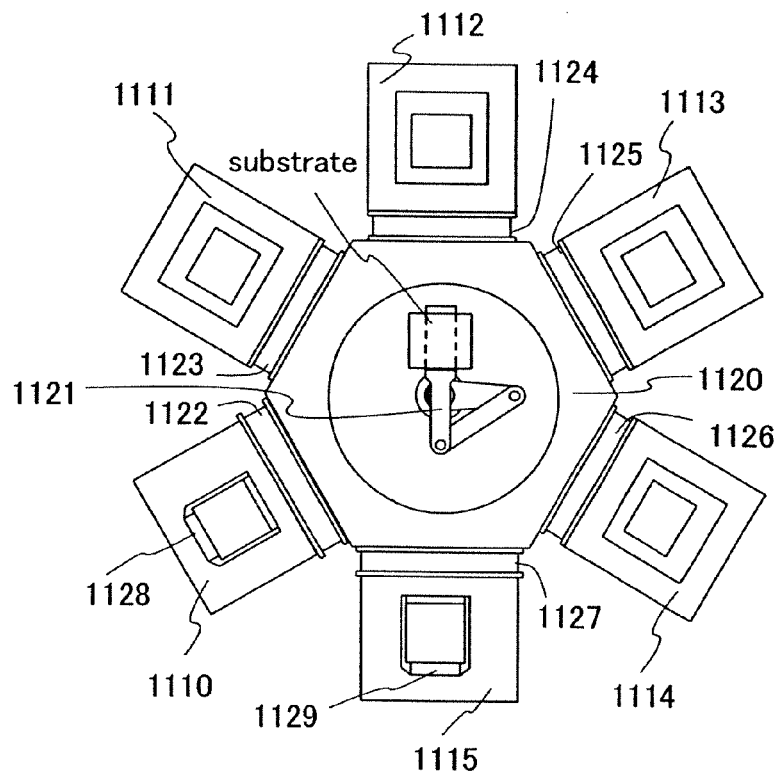
FIGS. 13A and 13B are plan views each describing a plasma CVD apparatus of the present invention.
Figure 13B:
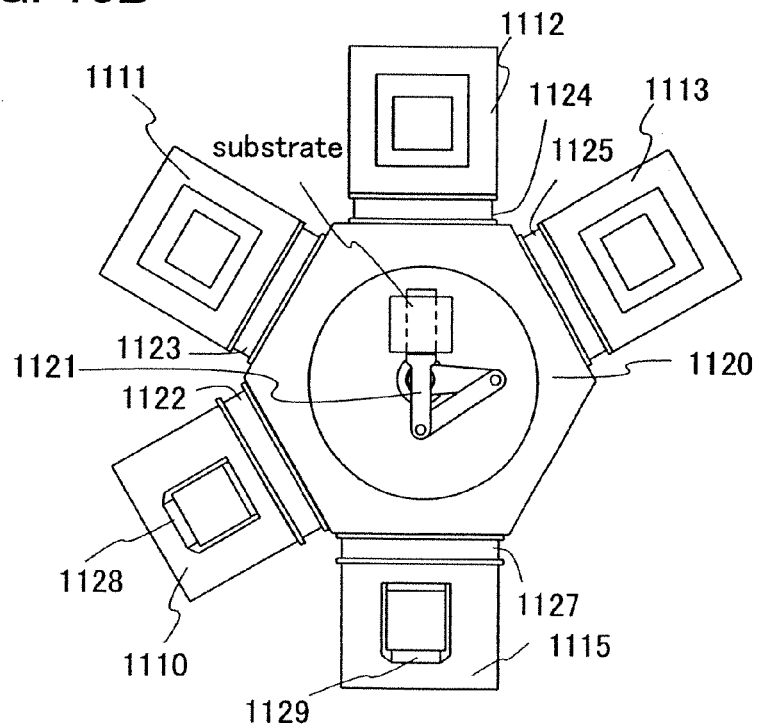

Examples of a plasma CVD apparatus which can be used in the present invention will be described using FIGS. 13A and 13B. FIGS. 13A and 13B each show a microwave plasma CVD apparatus which can perform successive film formation. FIGS. 13A and 13B are plane views each schematically showing an upper cross-section of a microwave plasma CVD apparatus. A loading chamber 1110, an unloading chamber 1115, and reaction chambers (1) to (4), 1111 to 1114, are provided around a common chamber 1120. Gate valves 1122 to 1127 are provided between the common chamber 1120 and the chambers so that treatment in each chamber does not have influence on treatment in other chambers. Note that the number of reaction chambers is not limited to four; and the number of reaction chambers may be more than four or less than four. When the number of reaction chambers is large, reaction chambers can be allocated according to the kind of a film to be stacked; thus, the number of cleaning of the reaction chamber can be reduced. FIG. 13A shows an example of a microwave plasma CVD apparatus having four reaction chambers, and FIG. 13B shows an example of a microwave plasma CVD apparatus having three reaction chambers.

An example will be described in which a gate insulating layer, a microcrystalline semiconductor film, a buffer layer, and a channel protective layer are formed using the plasma CVD apparatus shown in FIG. 13A. Substrates are loaded into a cassette 1128 in the loading chamber 1110 and a cassette 1129 in the unloading chamber 1115 and carried to the reaction chambers (1) to (4), 111 to 1114, with a transport means 1121 of the common chamber 1120. In this apparatus, a reaction chamber can be allocated for each of different kinds of deposition films, so that a plurality of different films can be formed successively without exposure to the air. Further, the reaction chamber may also be used as a reaction chamber for performing an etching process or a laser irradiation process, as well as a film-formation process. By providing reaction chambers for various processes, various processes can be performed without exposure to the air.

In each of the reaction chambers (1) to (4), the gate insulating film, the microcrystalline semiconductor film, the buffer layer, and the channel protective layer are stacked. In this case, different kinds of films can be stacked successively by switching a material gas. In this case, after the gate insulating films are formed, silicon hydride such as silane is introduced into the reaction chamber, so that residual oxygen and silicon hydride are reacted with each other, and the reactant is exhausted from the reaction chamber, whereby the concentration of residual oxygen in the reaction chamber can be decreased. Accordingly, the concentration of oxygen to be contained in the microcrystalline semiconductor film can be decreased. Further, crystal grains in the microcrystalline semiconductor film can be prevented from being oxidized.

Further, in a plasma CVD apparatus, films of one kind may be formed in a plurality of reaction chambers in order to improve productivity. If films of one kind can be formed in a plurality of reaction chambers, films can be formed over a plurality of substrates at the same time. For example, in FIG. 13A, the reaction chambers (1) and (2) are used as reaction chambers in each of which a microcrystalline semiconductor film is formed, the reaction chamber (3) is used as a reaction chamber in which an amorphous semiconductor film is formed, and the reaction chamber (4) is used as a reaction chamber in which a channel protective layer is formed. In the case where a plurality of substrates is treated at the same time, as described above, a plurality of reaction chambers may be provided, in each of which a film whose deposition rate is low is formed, so that productivity can be improved.

Before a substrate is carried into a reaction chamber to perform film formation, cleaning and/or flush (washing) treatment (hydrogen flush, silane flush, or the like) are/is preferably performed, and the inner wall of each reaction chamber is preferably coated with a protective film that is a film to be formed (this coating is also referred to as pre-coating treatment). Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 to 0.4 Flush treatment (hydrogen flush, silane flush, or the like) may also be performed after pre-coating treatment. In the case of performing cleaning and/or pre-coating treatment, it is necessary that a substrate is carried out from a reaction chamber. However, in the case of performing flush treatment (hydrogen flush, silane flush, or the like), a substrate may be kept in a reaction chamber because plasma treatment is not performed.

A protective film formed of an amorphous silicon film is formed on the inner wall of a reaction chamber in which a microcrystalline silicon film is to be formed, and hydrogen plasma treatment is performed before film formation, whereby the protective film is etched and an extremely small amount of silicon is deposited on a substrate and can be a nucleus of crystal growth.

In this manner, with the microwave plasma CVD apparatus in which a plurality of chambers is connected, the gate insulating film, the microcrystalline semiconductor film, the buffer layer, the channel protective layer, and the semiconductor film to which an impurity which imparts one conductivity type is added can be formed at the same time; thus, the mass productivity can be enhanced. Further, even when maintenance or cleaning is performed in one of reaction chambers, film deposition can be performed in the other reaction chambers, whereby tact time for film formation can be shortened. Furthermore, each interface between stacked layers can be formed without being contaminated by an air constituent or a contaminant impurity element floating in the air. Thus, variations in characteristics of thin film transistors can be reduced.

With the use of a microwave plasma CVD apparatus having such a structure, films of similar kinds or films of one kind can be formed in each reaction chamber and can be formed successively without exposure to the air. Therefore, each interface between stacked layers can be formed without being contaminated by a residue of a previously formed film or an impurity element floating in the air.

Further, a microwave generator and a high frequency wave generator may be provided; thus, the gate insulating film, the microcrystalline semiconductor film, the channel protective layer, and the semiconductor film to which an impurity which imparts one conductivity type is added may be formed by the microwave plasma CVD method, and the buffer layer may be formed by the high frequency plasma CVD method.

Note that, although the microwave plasma CVD apparatuses in FIGS. 13A and 13B are each provided with the loading chamber and the unloading chamber separately, a loading chamber and an unloading chamber may be combined to provide a loading and unloading chamber. Further, a spare chamber may be provided for the microwave plasma CVD apparatus. By pre-heating a substrate in the spare chamber, it is possible to shorten heating time before film deposition in each reaction chamber, so that the throughput can be improved. In the film-formation treatment, a gas supplied from a gas supply portion may be selected in accordance with its purpose.

This embodiment mode can be implemented as appropriate in combination with any of the structures described in the other embodiment modes.

(Embodiment Mode 6)

Next, a process for manufacturing a display device will be described using FIGS. 10A and 10B and FIGS. 11A to 11C. As a display element included in a display device, a light-emitting element utilizing electroluminescence will be described in this embodiment mode. Light-emitting elements that use electroluminescence are differentiated by whether a light-emitting material is an organic compound or an inorganic compound; generally, light-emitting elements using an organic compound as a light-emitting material are called organic EL elements, and light-emitting elements using an inorganic compound as a light-emitting material are called inorganic EL elements. Further, thin film transistors 85 and 86 used in a display device are thin film transistors which have high electric characteristics and high reliability and can be manufactured in a similar manner to the thin film transistor 74 described in Embodiment Mode 1. Alternatively, the thin film transistor 274 or 874 described in Embodiment Mode 2 or 4 can be employed as each of the thin film transistors 85 and 86.

In an organic EL element, by application of a voltage to a light-emitting element, electrons and holes are separately injected from a pair of electrodes into a layer containing a light-emitting organic compound, and current flows. Then, by recombination of these carriers (electrons and holes), the organic compound with a light-emitting property forms an excited state, and light is emitted when the excited state returns to a ground state. Due to such mechanism, such a light-emitting element is called a current-excitation light-emitting element.

Inorganic EL elements are classified depending on an element structure into dispersion type inorganic EL elements and thin-film inorganic EL elements. A dispersion type inorganic EL element has a light-emitting layer where particles of a light-emitting material are dispersed in a binder, and its light emission mechanism is donor-acceptor recombination type light emission that utilizes a donor level and an acceptor level. In a thin-film inorganic EL element, a light-emitting layer is sandwiched between dielectric layers, and the dielectric layers are sandwiched between electrodes. Its light emission mechanism is localized-type light emission that utilizes inner shell electronic transition of metal ions. Note that description will be made using an organic EL element as a light-emitting element in this embodiment mode. Further, the channel-stop-type thin film transistor shown in FIG. 1 in Embodiment Mode 1 is used as a thin film transistor for controlling driving of a light-emitting element in this embodiment mode.

Through a similar process to that shown in FIG. 1, FIGS. 2A to 2E, FIGS. 3A to 3C, and FIGS. 4A to 4D, the thin film transistors 85 and 86 are formed over a substrate 100, and an insulating film 87 which functions as a protective film is formed over the thin film transistors 85 and 86 as shown in FIGS. 10A and 10B. Next, a planarizing film 111 is formed over the insulating film 87, and a pixel electrode 112 connected to a source or drain electrode of the thin film transistor 86 is formed over the planarizing film 111.

It is preferable that the planarizing film 111 be formed of an organic resin such as acrylic, polyimide, or polyamide, or siloxane.

In FIG. 10A, the thin film transistor of a pixel is an n-channel thin film transistor; thus, it is preferable that a cathode be used as the pixel electrode 112. To the contrary, it is preferable that an anode be used as the pixel electrode 112 in the case of a p-channel thin film transistor. Specifically, as the cathode, a material with low work function, such as Ca, Al, CaF, MgAg, or AlLi can be used.

Next, as shown in FIG. 10B, a bank 113 is formed over the planarizing film 111 and an end portion of the pixel electrode 112. The bank 113 has an opening, in which the pixel electrode 112 is exposed. The bank 113 is formed of an organic resin film, an inorganic insulating film, or an organic polysiloxane film. In particular, it is preferable that the bank 113 be formed of a photosensitive material, and the opening be formed over the pixel electrode, and a side wall of the opening form an inclined surface with a continuous curvature.

Next, a light-emitting layer 114 is formed so as to be in contact with the pixel electrode 112 in the opening of the bank 113. The light-emitting layer 114 may be formed of either a single layer or a stacked layer of a plurality of layers.

Then, a common electrode 115 using an anode is formed to cover the light-emitting layer 114. The common electrode 115 can be formed of a light-transmitting conductive film using any of the light-transmitting conductive materials for the pixel electrode 77 listed in Embodiment Mode 1. The common electrode 115 may also be formed of a titanium nitride film or a titanium film as well as the above-described light-transmitting conductive film. In FIG. 10B, ITO is used for the common electrode 115. In the opening of the bank 113, a light-emitting element 117 is formed by overlapping of the pixel electrode 112, the light-emitting layer 114, and the common electrode 115. After that, a protective film 116 is preferably formed over the common electrode 115 and the bank 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Furthermore, practically, after the steps up to the step of FIG. 10B are completed, it is preferable that packaging (sealing) be performed with a protective film (e.g., an attachment film or an ultraviolet curable resin film) which has high airtightness and causes less degasification, or a covering material, in order to prevent further exposure to external air.

Next, structures of light-emitting elements will be described using FIGS. 11A to 11C. A cross-sectional structure of a pixel will be described by taking an n-channel driving TFT as an example. Driving TFTs 7001, 7011, and 7021 used for display devices shown in FIGS. 11A to 11C have high electric characteristics and high reliability, and can be manufactured in a similar manner to the thin film transistor 74 described in Embodiment Mode 1. Alternatively, the thin film transistor 274 or 874 described in Embodiment Mode 2 or 4 can be employed as each of the MS 7001, 7011, and 7021.

In order to extract light emission, at least one of an anode and a cathode of a light-emitting element is needed to be transparent. There are light-emitting elements having a top emission structure in which light emission is extracted through the surface opposite to the substrate, having a bottom emission structure in which light emission is extracted through the surface on the substrate side, and having a dual emission structure in which light emission is extracted through the surface opposite to the substrate and the surface on the substrate side. A pixel structure of the present invention can be applied to a light-emitting element having any of the emission structures.

A light-emitting element having a top emission structure will be described using FIG. 11A.

Figure 11A:
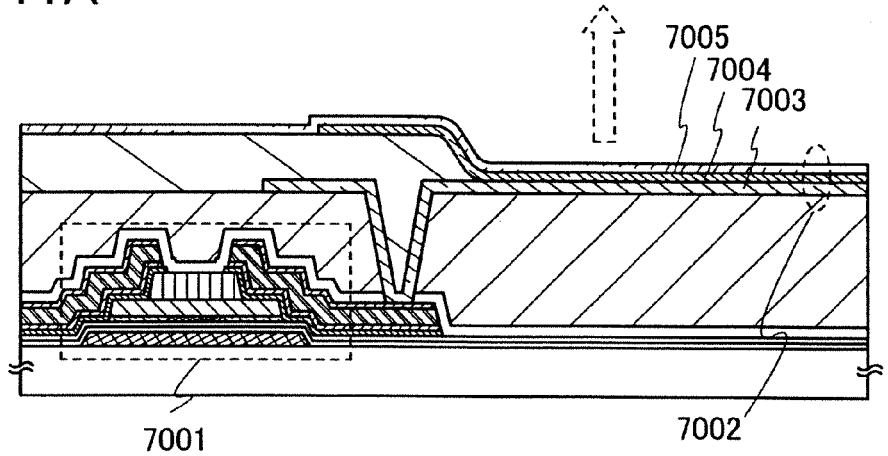
FIGS. 11A to 11C are views each describing a manufacturing method of a display device of the present invention.

FIG. 11A is a cross-sectional view of a pixel in the case where the driving TFT 7001 is an n-channel type and light is emitted from a light-emitting element 7002 to an anode 7005 side. In FIG. 11A, a cathode 7003 of the light-emitting element 7002 is electrically connected to the driving TFT 7001, and a light-emitting layer 7004 and the anode 7005 are stacked in this order over the cathode 7003. The cathode 7003 can be formed of various conductive materials as long as it is a conductive film whose work function is low and which reflects light. For example, Ca, Al, CaF, MgAg, AlLi, or the like is preferably used. Further, the light-emitting layer 7004 may be formed of either a single layer or a stacked layer of a plurality of layers. In the case where the light-emitting layer 7004 is formed of a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that not all the layers are needed to be provided. The anode 7005 is formed of a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel shown in FIG. 11A, light is emitted from the light-emitting element 7002 to the anode 7005 side as indicated by an arrow.

Next, a light-emitting element having a bottom emission structure will be described using FIG. 11B. FIG. 11B is a cross-sectional view of a pixel in the case where a driving TFT 7011 is an n-channel type, and light is emitted from a light-emitting element 7012 to a cathode 7013 side. In FIG. 11B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a shielding film 7016 for reflecting or blocking light may be formed so as to cover the anode 7015 when the anode 7015 has a light-transmitting property. For the cathode 7013, various materials can be used as in the case of FIG. 11A as long as they are conductive materials whose work function is low. It is to be noted that the thickness of the cathode 7013 is set such that light is transmitted therethrough (preferably, about 5 to 30 nm). For example, an aluminum film with a thickness of 20 nm can be used as the cathode 7013. Then, as in the case of FIG. 11A, the light-emitting layer 7014 may be formed of either a single layer or a stacked layer of a plurality of layers. Although the anode 7015 does not need to be able to transmit light, similarly to FIG. 11A, it can be formed of a light-transmitting conductive material. As the shielding film 7016, a metal or the like that reflects light can be used; however, it is not limited to a metal film. For example, a resin or the like to which a black pigment is added can be used.

A region where the light-emitting layer 7014 is sandwiched between the cathode 7013 and the anode 7015 corresponds to the light-emitting element 7012. In the case of the pixel shown in FIG. 11B, light is emitted from the light-emitting element 7012 to the cathode 7013 side as indicated by an arrow.

Next, a light-emitting element having a dual emission structure will be described using FIG. 11C. In FIG. 11C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 11A, the cathode 7023 can be formed of various conductive materials as long as they are conductive materials whose work function is low. It is to be noted that the cathode 7023 has a thickness to transmit light. For example, Al having a film thickness of 20 nm can be used as the cathode 7023. Then, as in FIG. 11A, the light-emitting layer 7024 may be formed of either a single layer or a stacked layer of a plurality of layers. The anode 7025 can be, as in FIG. 11A, formed of a light-transmitting conductive material.

A region where the cathode 7023, the light-emitting layer 7024, and the anode 7025 are overlapped with each other corresponds to the light-emitting element 7022. In the case of the pixel shown in FIG. 11C, light is emitted from the light-emitting element 7022 to both the anode 7025 side and the cathode 7023 side as indicated by arrows.

Note that, although an organic EL element is described as a light-emitting element in this embodiment mode, it is also possible to provide an inorganic EL element as a light-emitting element.

Note that, although the example in which a thin film transistor (a driving TFT) for controlling driving of a light-emitting element is electrically connected to the light-emitting element is described in this embodiment mode, a TFT for controlling current may be connected between the driving TFT and the light-emitting element.

Figure 11B:
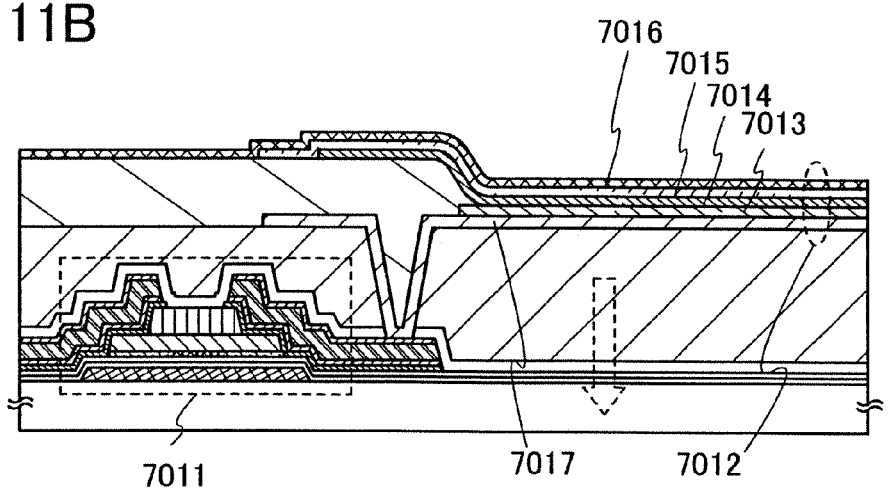
Figure 11C:
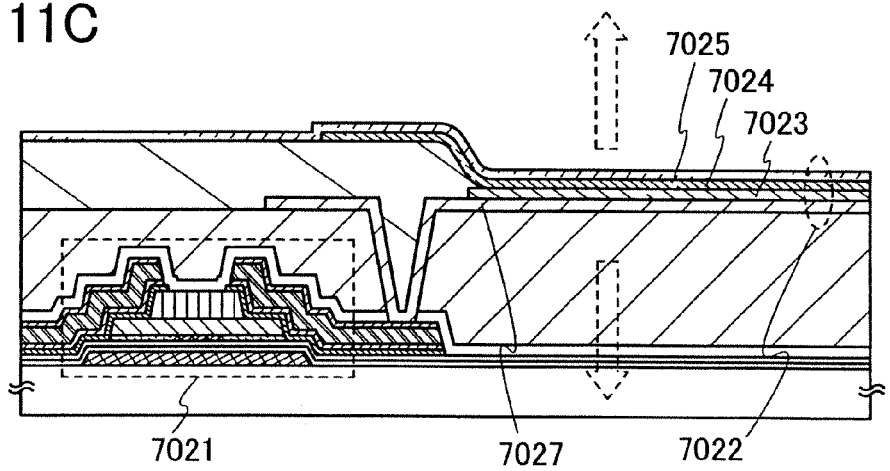

Note that the display device described in this embodiment mode is not limited to have any of the structures shown in FIGS. 11A to 11C, and can be modified in various ways based on the technical idea of the present invention.

Through the above-described process, a light-emitting device can be manufactured as a display device. Since a thin film transistor with high electric characteristics and high reliability is used in the light-emitting device of this embodiment mode, the light-emitting device has high contrast and high visibility.

This embodiment mode can be implemented as appropriate in combination with any of the structures described in the other embodiment modes.

(Embodiment Mode 7)

Examples of a liquid crystal display device including the thin film transistor described in any one of Embodiment Modes 1 to 5 will be described in this embodiment mode using FIGS. 17 to 30. In the examples of a liquid crystal display device described in this embodiment mode using FIGS. 17 to 30, a liquid crystal display element is used as a display element. The thin film transistor described in Embodiment Mode 1, 2, or 4 can be applied to each of a TFT 628 and a TFT 629 used for liquid crystal display devices shown in FIGS. 17 to 30, and the TFTs 628 and 629 are thin film transistors with high electric characteristics and high reliability, which can be manufactured in a similar manner through the process described in Embodiment Modes 3 to 5. The TFT 628 and the TFT 629 include a channel protective layer 608 and a channel protective layer 611, respectively, and are inverted staggered thin film transistors each using a microcrystalline semiconductor film as a channel formation region. Further, the TFT 628 and the TFT 629 each include an impurity region (a so-called channel-doping region) selectively in the channel formation region of the microcrystalline semiconductor film. In each of the TFTs 628 and 629, the impurity region is formed by selectively adding as an impurity which imparts one conductivity type, boron that is an impurity element which imparts p-type conductivity, and the threshold voltage of the TFT is controlled.

First, a vertical alignment (VA) mode liquid crystal display device will be described. The VA mode of a liquid crystal display device is a kind of mode in which alignment of liquid crystal molecules of a liquid crystal display panel is controlled. According to the VA mode liquid crystal display device, liquid crystal molecules are aligned to be vertical to a panel surface when voltage is not applied. In particular, in this embodiment mode, it is devised that a pixel is divided into several regions (sub-pixels) so that molecules are aligned in different directions. This is referred to as multi-domain or multi-domain design. In the following description, a liquid crystal display device with multi-domain design will be described.

Figure 17:
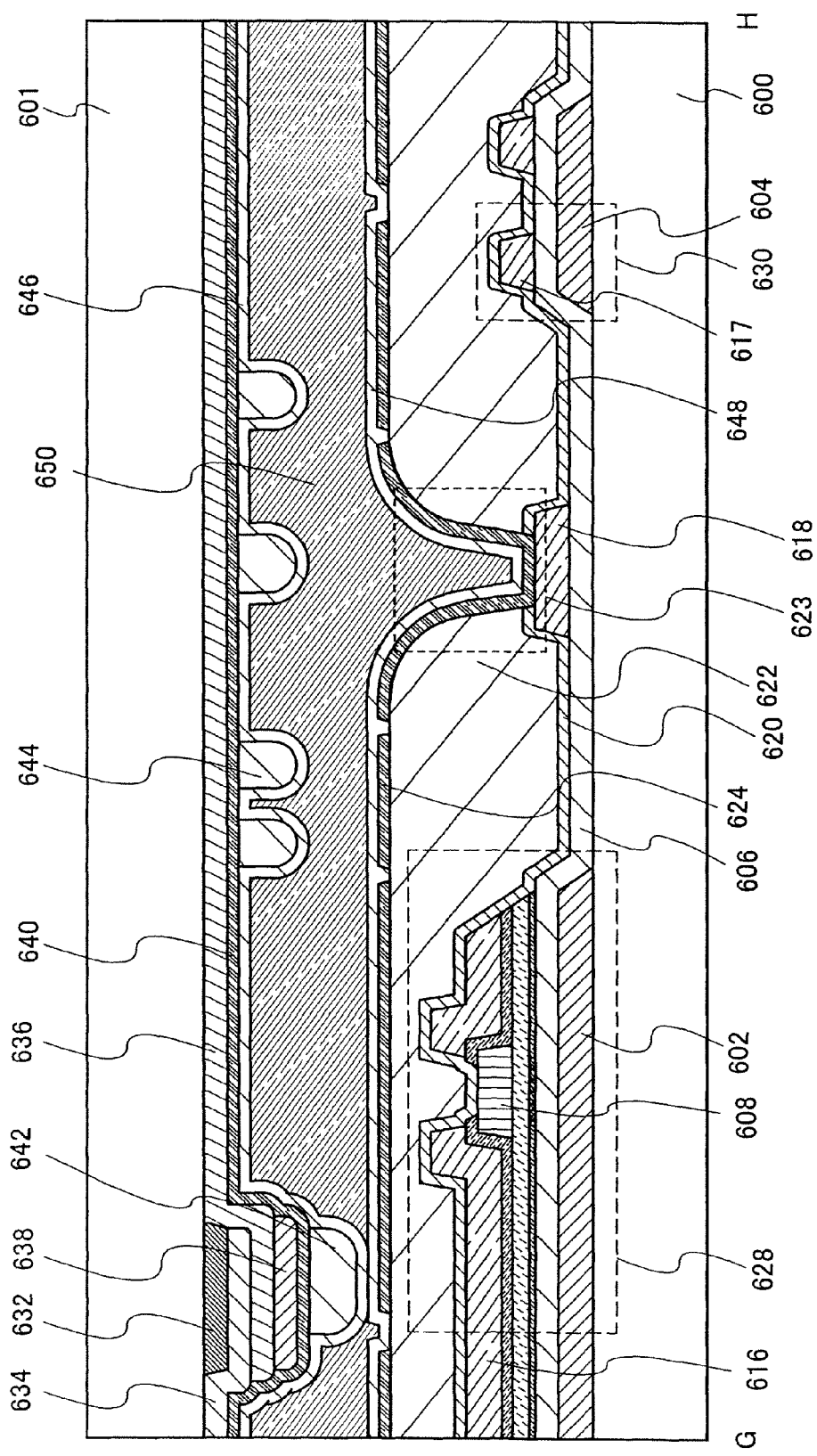
FIG. 17 is a view describing a display device of the present invention.
Figure 18:
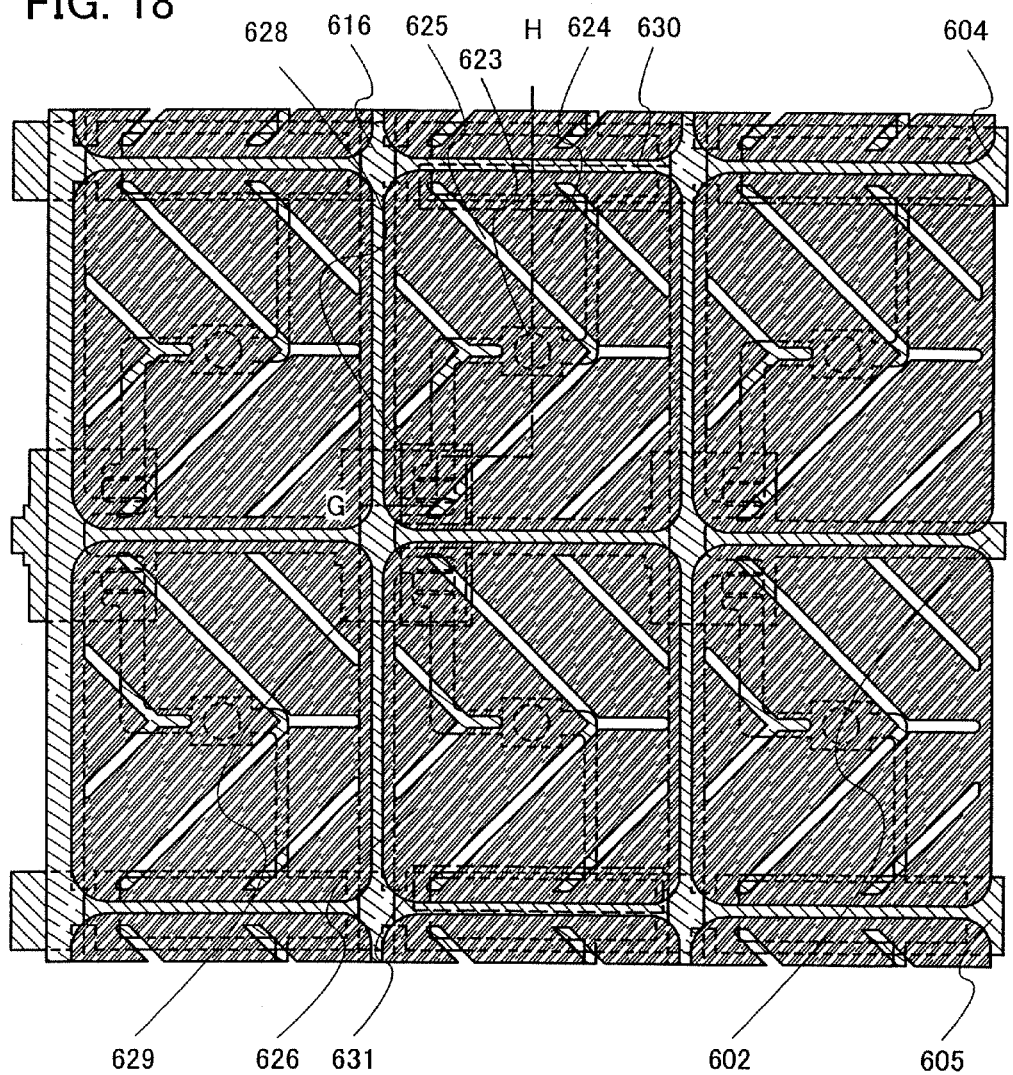
FIG. 18 is a view describing a display device of the present invention.
Figure 19:
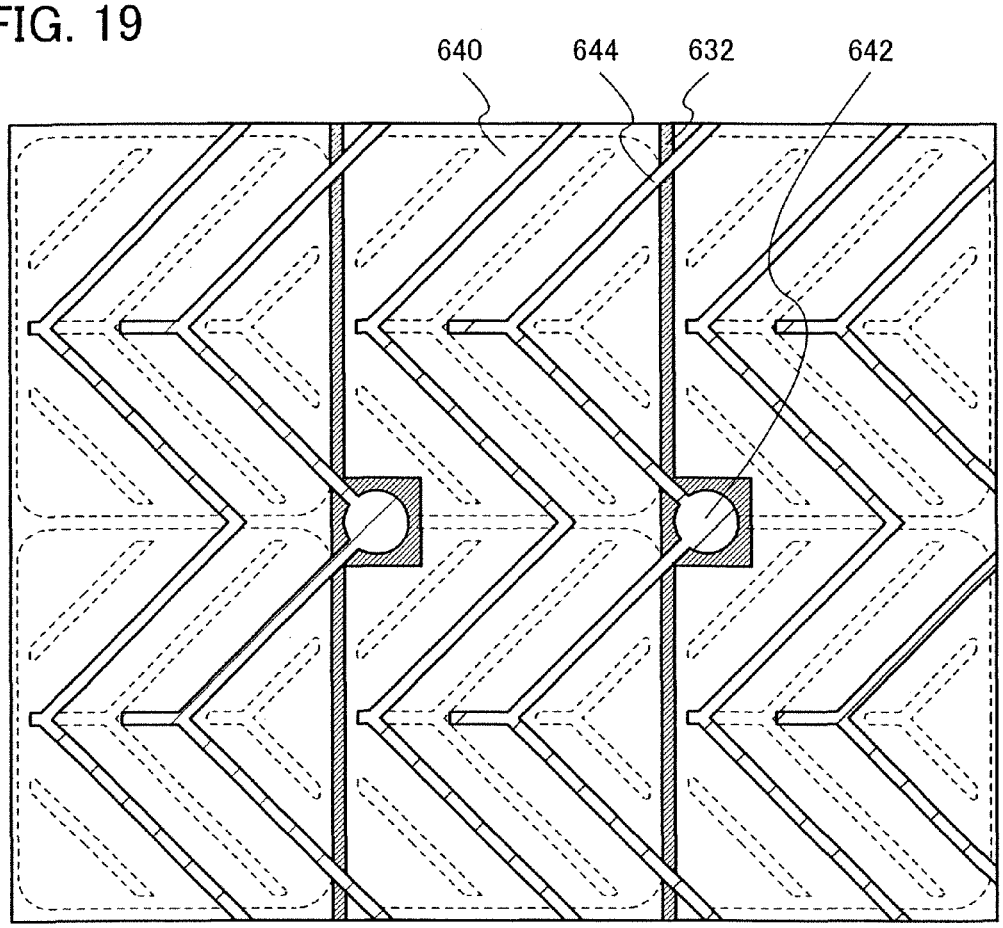
FIG. 19 is a view describing a display device of the present invention.

FIGS. 18 and 19 show a pixel electrode and a counter electrode, respectively. Note that FIG. 18 is a plan view on a substrate side where the pixel electrode is formed. FIG. 17 shows a cross-sectional structure along dashed line G-H in FIG. 18. FIG. 19 is a plan view on a substrate side where the counter electrode is formed. Hereinafter, description will be made with reference to these drawings.

FIG. 17 shows a state in which a substrate 600 provided with the TFT 628, a pixel electrode 624 connected to the TFT 628, and a storage capacitor 630 overlaps with a counter substrate 601 provided with a counter electrode 640 and the like, and liquid crystals are injected.

At the position where a spacer 642 is provided in the counter substrate 601, a light shielding film 632, a first color film 634, a color film 636, a third color film 638, and the counter electrode 640 are formed. With this structure, the height of a projection 644 for controlling alignment of liquid crystals is made different from that of the spacer 642. An alignment film 648 is formed over the pixel electrode 624. Similarly, the counter electrode 640 is also provided with an alignment film 646. A liquid crystal layer 650 is formed between the alignment films 646 and 648.

Although a columnar spacer is used for the spacer 642 in this embodiment mode, bead spacers may be dispersed. Further, the spacer 642 may be formed over the pixel electrode 624 formed over the substrate 600.

The TFT 628, the pixel electrode 624 connected to the TFT 628, and the storage capacitor 630 are formed over the substrate 600. The pixel electrode 624 is connected to a wiring 618 in a contact hole 623 which penetrates an insulating film 620 which covers the TFT 628, the wiring 618, and the storage capacitor 630 and also penetrates an insulating film 622 which covers the insulating film 620. As the TFT 628, the thin film transistor described in Embodiment Mode 1 can be used as appropriate. Further, the storage capacitor 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618. Further, in FIGS. 17 to 20, in the TFT 628, a microcrystalline semiconductor film, a buffer layer, a semiconductor film to which an impurity which imparts one conductivity type is added and which functions as a source and drain regions, and a wiring which also functions as a source and drain electrodes are patterned by the same etching process and stacked with almost the same shape.

A liquid crystal element is formed by overlapping of the pixel electrode 624, the liquid crystal layer 650, and the counter electrode 640.

FIG. 18 shows a structure over the substrate 600. The pixel electrode 624 is formed of a material described in Embodiment Mode 1. The pixel electrode 624 is provided with a slit 625. The slit 625 is for controlling alignment of liquid crystals.

The TFT 629, the pixel electrode 626 connected to the TFT 629, and the storage capacitor 631 shown in FIG. 18 can be formed in a similar manner to the TFT 628, the pixel electrode 624, and the storage capacitor portion 630, respectively. Both the TFTs 628 and 629 are connected to the wiring 616. A pixel of this liquid crystal display panel includes the pixel electrodes 624 and 626. Each of the pixel electrodes 624 and 626 is a sub-pixel.

FIG. 19 shows a structure on a counter substrate side. The counter electrode 640 is formed over the light shielding film 632. The counter electrode 640 is preferably formed of a similar material to the pixel electrode 624. The projection 644 which controls alignment of liquid crystals is formed over the counter electrode 640. Further, the spacer 642 is formed in accordance with the position of the light shielding film 632.

FIG. 20 shows an equivalent circuit of this pixel structure. Both the TFTs 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. That is, alignment of the liquid crystals is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged so as to be engaged with each other, and an oblique electric field is effectively generated to control alignment of liquid crystals, so that a direction of alignment of the liquid crystals varies depending on the position. That is, a viewing angle of a liquid crystal panel is expanded by multi-domain.

Next, a VA mode liquid crystal display device, which is different from the above-described device, will be described with reference to FIGS. 21 to 24.

Figure 21:
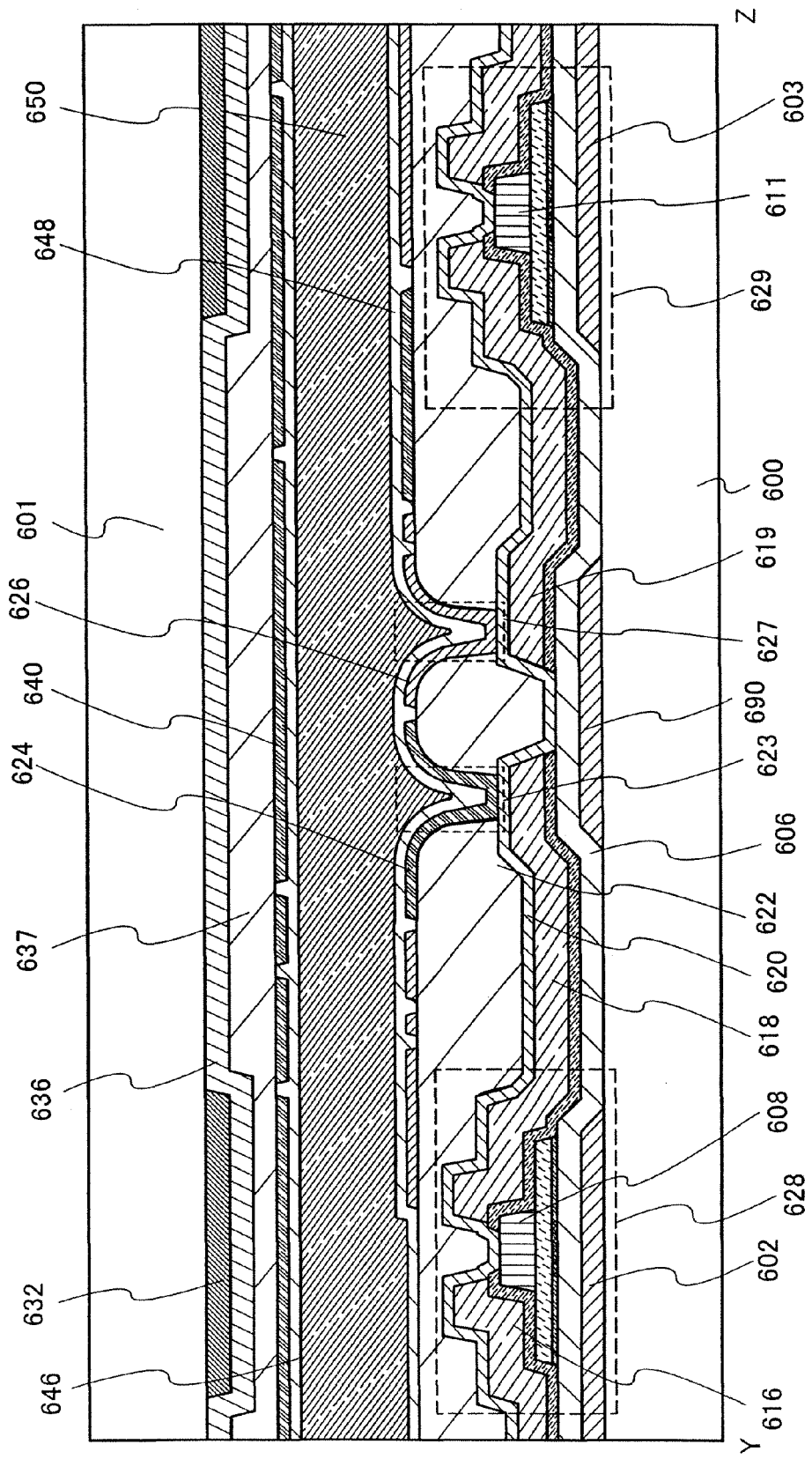
FIG. 21 is a view describing a display device of the present invention.
Figure 22:
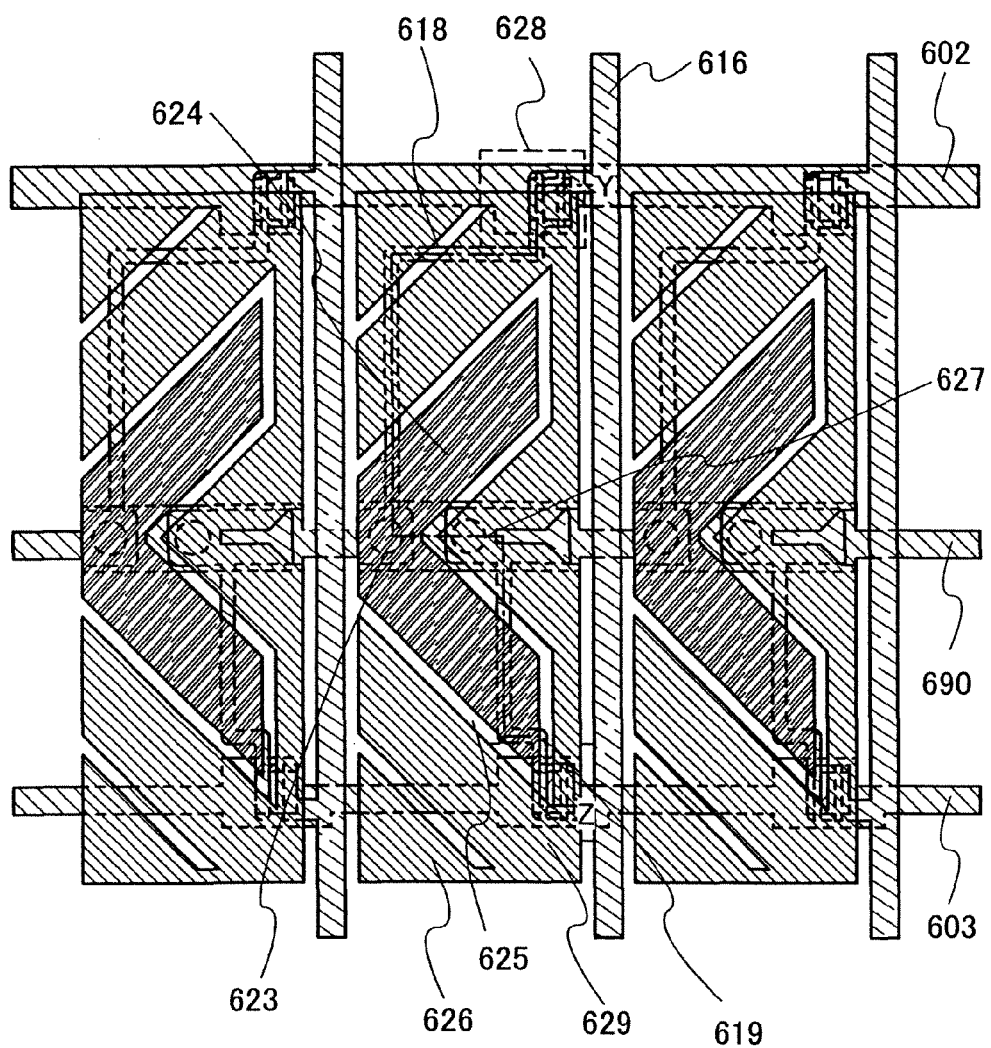
FIG. 22 is a view describing a display device of the present invention.

FIGS. 21 and 22 each show a pixel structure of a VA mode liquid crystal display panel. FIG. 22 is a plan view of the substrate 600. FIG. 21 shows a cross-sectional structure along dashed line Y-Z in FIG. 22. The following explanation will be made with reference to both the drawings.

In this pixel structure, one pixel has a plurality of pixel electrodes, and a TFT is connected to each pixel electrode. Each TFT is formed so as to be driven with a different gate signal. That is, in the pixel of multi-domain design, a signal applied to each pixel electrode is controlled independently.

In the contact hole 623, the pixel electrode 624 is connected to the TFT 628 through the wiring 618. Further, in a contact hole 627, the pixel electrode 626 is connected to the TFT 629 through a wiring 619. The gate wiring 602 of the TFT 628 and a gate wiring 603 of the TFT 629 are separated so that different gate signals can be supplied. In contrast, the wiring 616 which serves as a data line is used in common for the TFTs 628 and 629. As each of the TFTs 628 and 629, the thin film transistor described in Embodiment Mode 1 can be used as appropriate. Further, a capacitor wiring 690 is provided. Further, in FIGS. 21 to 30, in the TFT 628 and the TFT 629, semiconductor films to which an impurity which imparts one conductivity type is added and which function as source and drain regions and wirings which also function as source and drain electrodes are patterned by the same etching process and stacked with almost the same shape.

Figure 24:
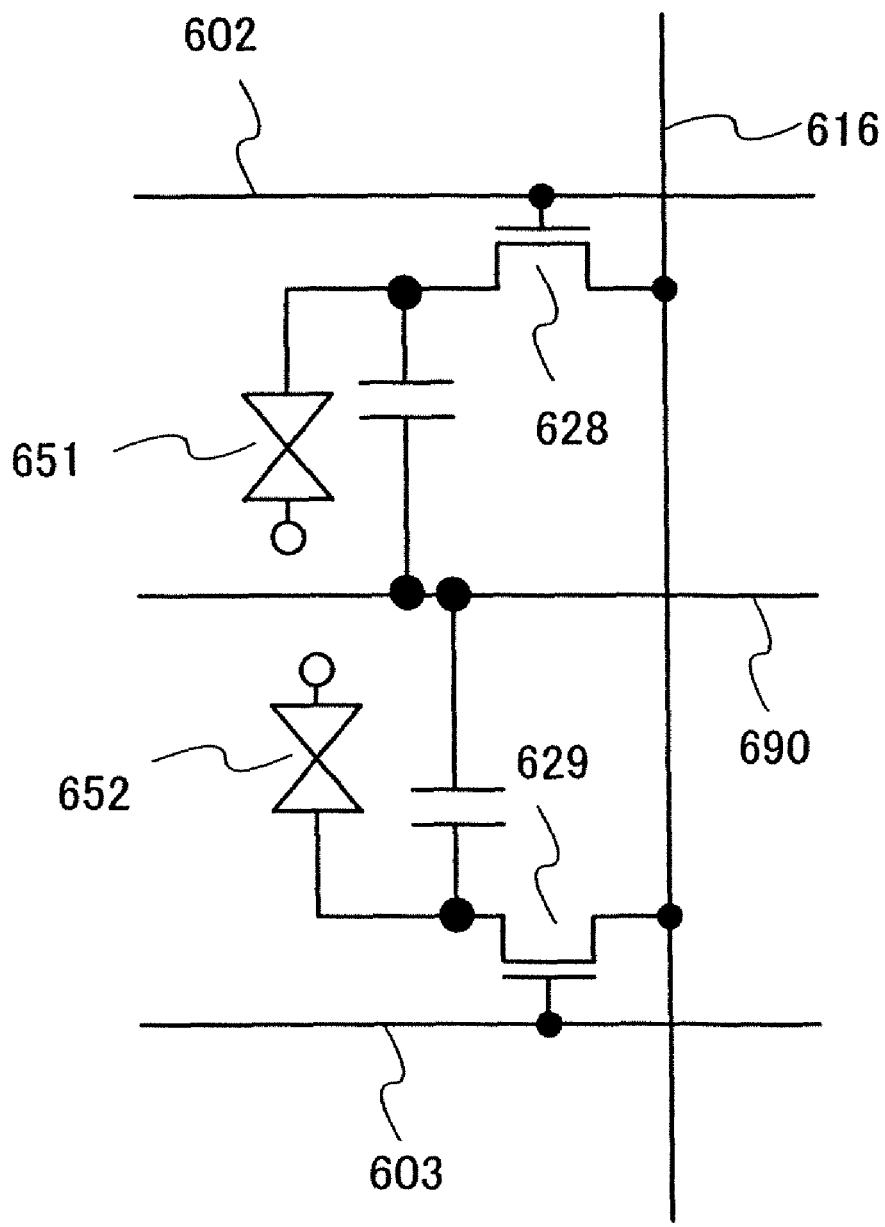
FIG. 24 is a diagram describing a display device of the present invention.

The shape of the pixel electrode 624 is different from that of the pixel electrode 626, and the pixel electrodes are separated by the slit 625. The pixel electrode 626 is formed so as to surround the external side of the pixel electrode 624 which is spread into a V shape. Timing of voltage application is made vary between the pixel electrodes 624 and 626 by the TFTs 628 and 629 in order to control alignment of liquid crystals. FIG. 24 shows an equivalent circuit of this pixel structure. The TFT 628 is connected to the gate wiring 602, and the TFT 629 is connected to the gate wiring 603. By supplying different gate signals to the gate wirings 602 and 603, operation timings of the TFTs 628 and 629 can vary.

Figure 23:
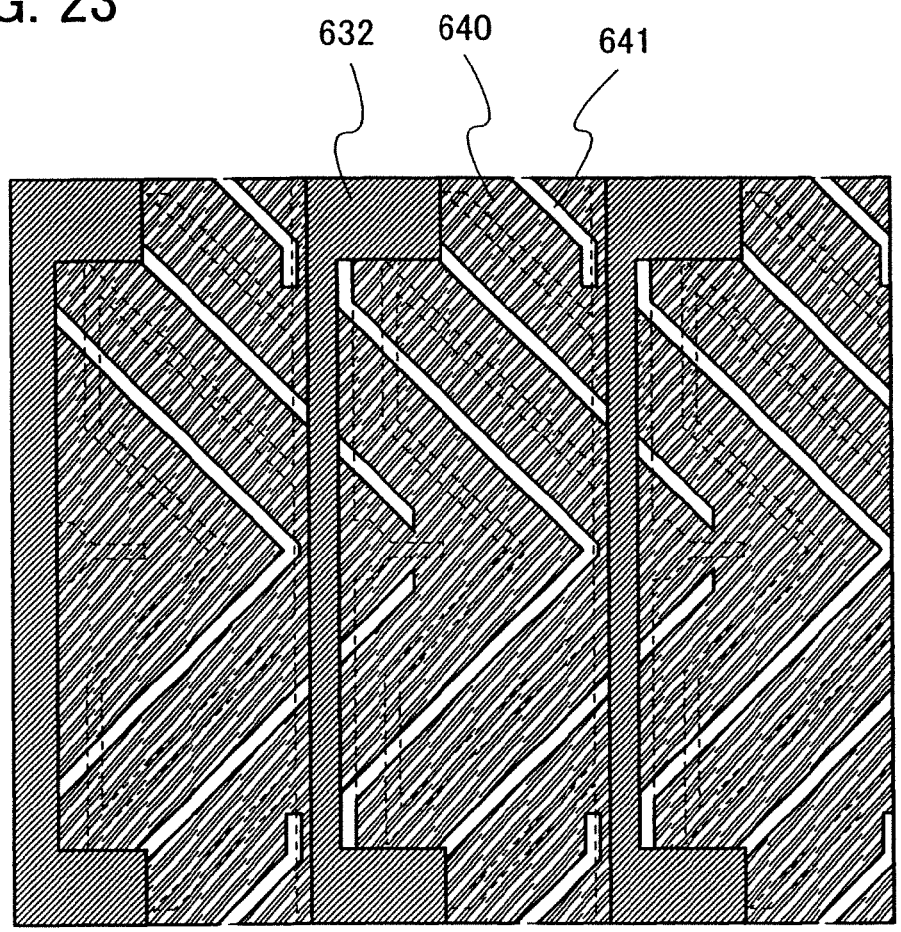
FIG. 23 is a view describing a display device of the present invention.

The counter substrate 601 is provided with the light shielding film 632, the color film 636, and the counter electrode 640. Further, a planarizing film 637 is formed between the color film 636 and the counter electrode 640 to prevent alignment disorder of the liquid crystals. FIG. 23 shows a structure on the counter substrate side. A slit 641 is formed in the counter electrode 640 which is used in common between different pixels. This slit 641 is disposed so as to alternately engage with the slit 625 on the pixel electrodes 624 and 626 side, whereby an oblique electric field is generated effectively to control alignment of the liquid crystals. Accordingly, the alignment of the liquid crystals can be varied depending on the portion, so that the viewing angle is widened.

The pixel electrode 624, the liquid crystal layer 650, and the counter electrode 640 overlap with each other, so that a first liquid crystal element is formed. Further, a second liquid crystal element is formed by overlapping of the pixel electrode 626, the liquid crystal layer 650, and the counter electrode 640. Further, the structure is a multi-domain structure in which the first liquid crystal element and the second liquid crystal element are included in one pixel.

Next, a horizontal electric-field liquid crystal display device will be described. The horizontal electric-field mode is a method in which an electric field is horizontally applied to liquid crystal molecules in a cell, whereby liquid crystals are driven to express a gray scale. According to this method, the viewing angle can be increased to about 180 degrees. Hereinafter, a liquid crystal display device employing the horizontal electric-field mode will be described.

Figure 25:
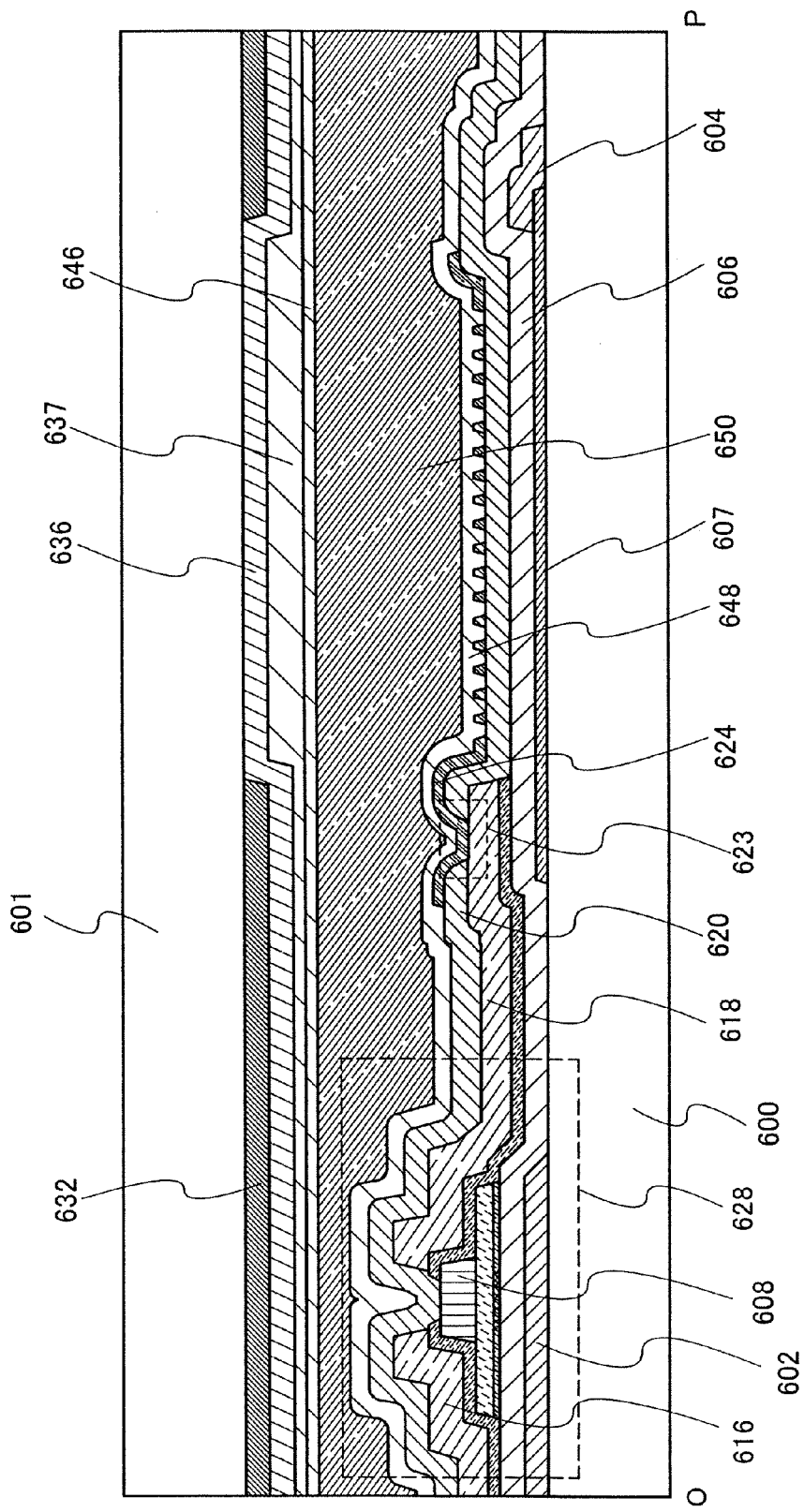
FIG. 25 is a view describing a display device of the present invention.

FIG. 25 illustrates a state in which the substrate 600 provided with the TFT 628 and the second pixel electrode 624 connected to the TFT 628 overlaps with the counter substrate 601, and liquid crystals are injected therebetween. The counter substrate 601 is provided with the light shielding film 632, the color film 636, the planarizing film 637, and the like. Since the pixel electrode is provided on the substrate 600 side, the pixel electrode is not provided on the counter substrate 601 side. The liquid crystal layer 650 is formed between the substrate 600 and the counter substrate 601.

A first pixel electrode 607, a capacitor wiring 604 connected to the first pixel electrode 607, and the TFT 628 described in Embodiment Mode 1 are formed over the substrate 600. The first pixel electrode 607 can be formed of a material similar to the pixel electrode 77 described in Embodiment Mode 1. Further, the first pixel electrode 607 is formed in a shape which is compartmentalized roughly in a pixel shape. Note that the gate insulating film 606 is formed over the first pixel electrode 607 and the capacitor wiring 604.

The wirings 616 and 618 of the TFT 628 are formed over the gate insulating film 606. The wiring 616 serves as a data line extending in one direction, through which a video signal is transmitted in a liquid crystal display panel, and is connected to a source region of the TFT 628 and serves as one of a source electrode and a drain electrode. The wiring 618 serves as the other of the source electrode and the drain electrode, and is connected to the second pixel electrode 624.

The insulating film 620 is formed over the wirings 616 and 618. Further, over the insulating film 620, the second pixel electrode 624 connected to the wiring 618 in a contact hole formed in the insulating film 620 is formed. The second pixel electrode 624 is formed of a material similar to the pixel electrode 77 described in Embodiment Mode 1.

In this manner, the TFT 628 and the second pixel electrode 624 connected to the TFT 628 are formed over the substrate 600. Note that a storage capacitor is formed between the first pixel electrode 607 and the second pixel electrode 624.

Figure 26:
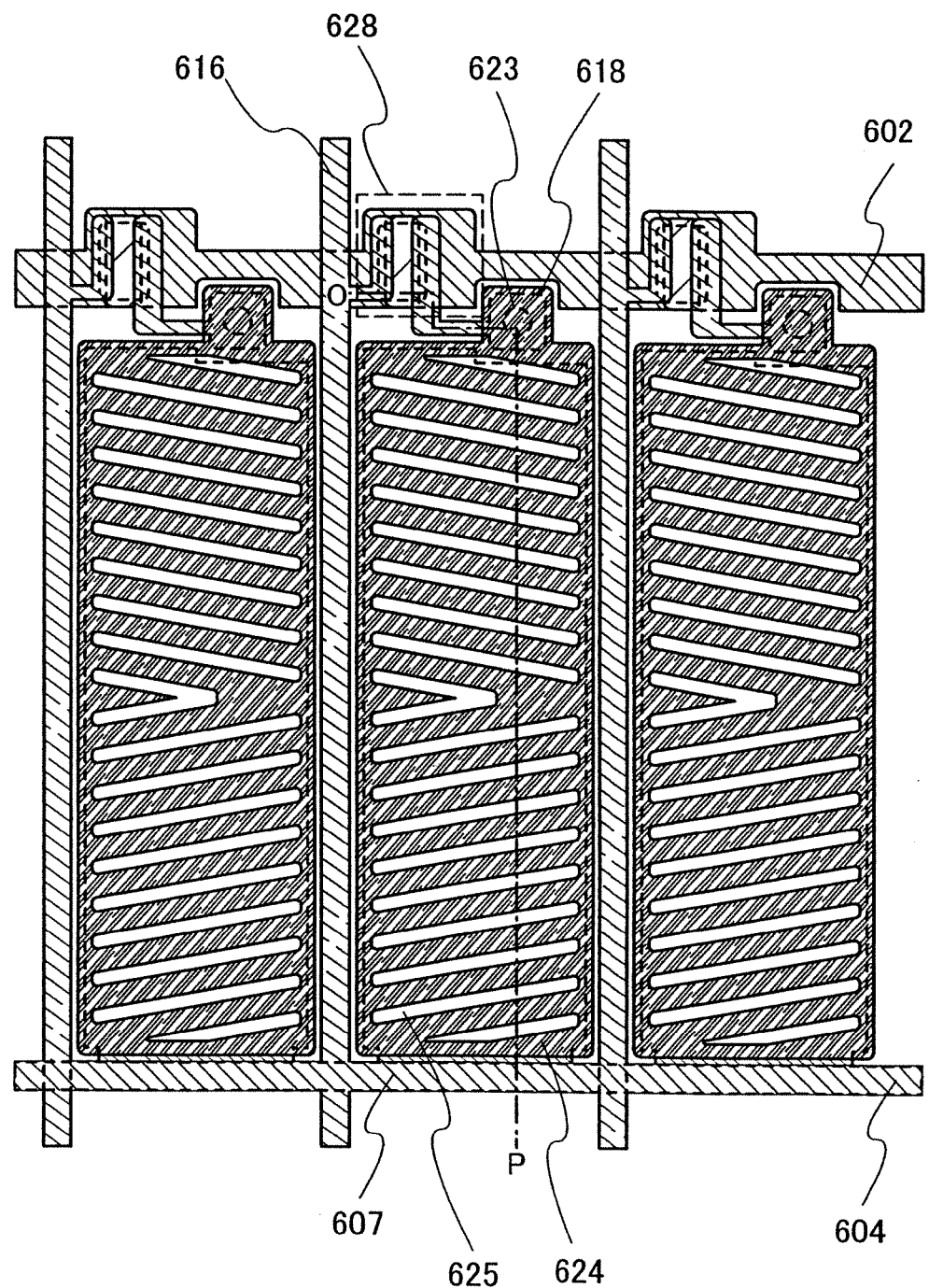
FIG. 26 is a view describing a display device of the present invention.

FIG. 26 is a plan view illustrating a structure of the pixel electrode. FIG. 25 is a cross-sectional structure corresponding to dashed line O-P in FIG. 26. The slit 625 is provided for the second pixel electrode 624. The slit 625 is for controlling alignment of liquid crystals. In this case, an electric field is generated between the first pixel electrode 607 and the second pixel electrode 624. The thickness of the gate insulating film 606 formed between the first pixel electrode 607 and the second pixel electrode 624 is 50 to 200 nm, which is thin enough compared with the liquid crystal layer with a thickness of 2 to 10 µm. Therefore, an electric field is generated substantially in parallel (in a horizontal direction) to the substrate 600. Alignment of liquid crystals is controlled by the electric field. Liquid crystal molecules are horizontally rotated with the use of this electric field in a direction almost parallel to the substrate. In this case, since the liquid crystal molecules are horizontal in any state, there are few effects of contrast or the like depending on the angle in viewing; thus, the viewing angle is expanded. Further, since both the first pixel electrode 607 and the second pixel electrode 624 are light-transmitting electrodes, aperture ratio can be improved.

Next, another example of a horizontal electric-field liquid crystal display device will be described.

Figure 27:
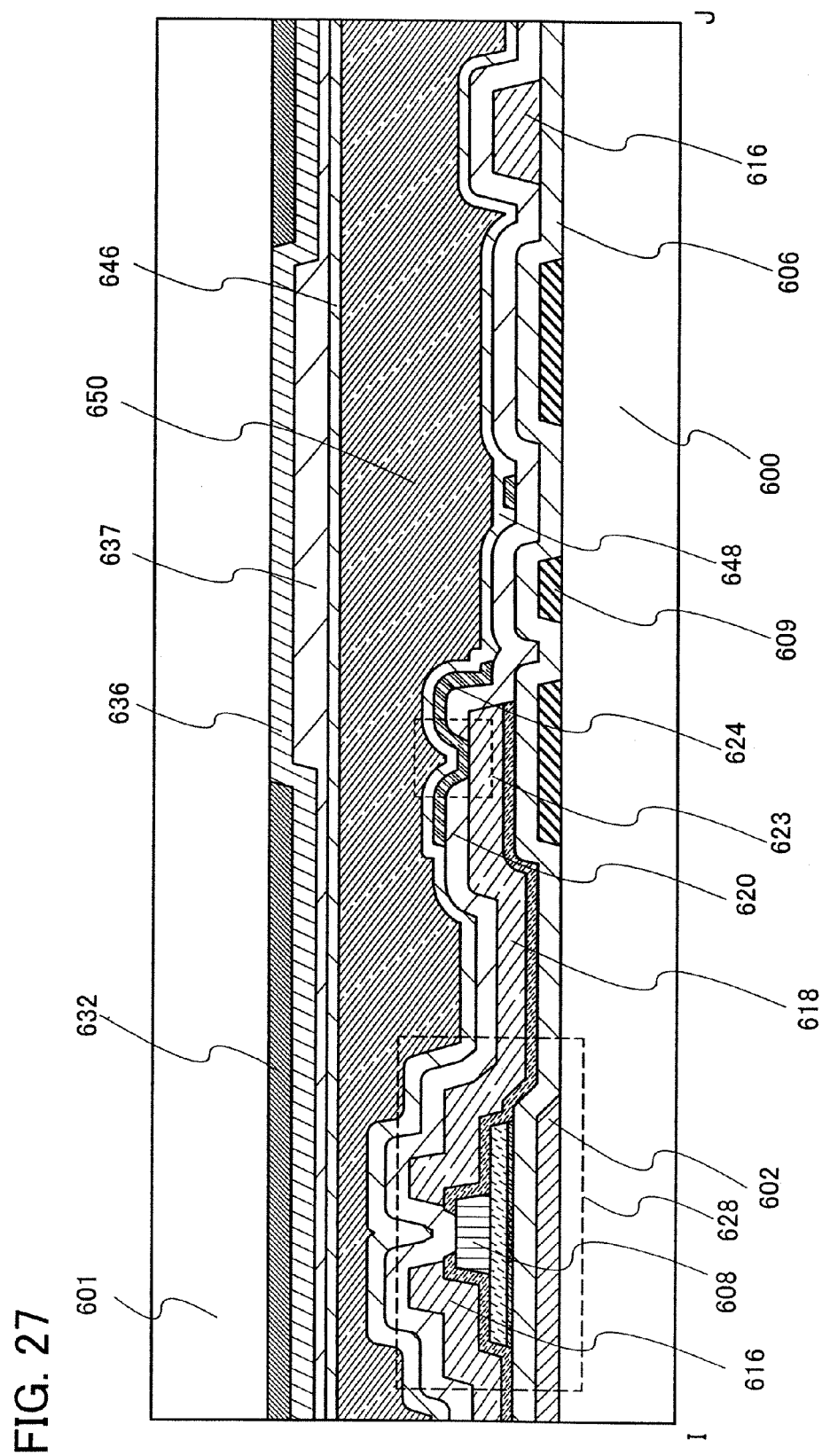
FIG. 27 is a view describing a display device of the present invention.
Figure 28:
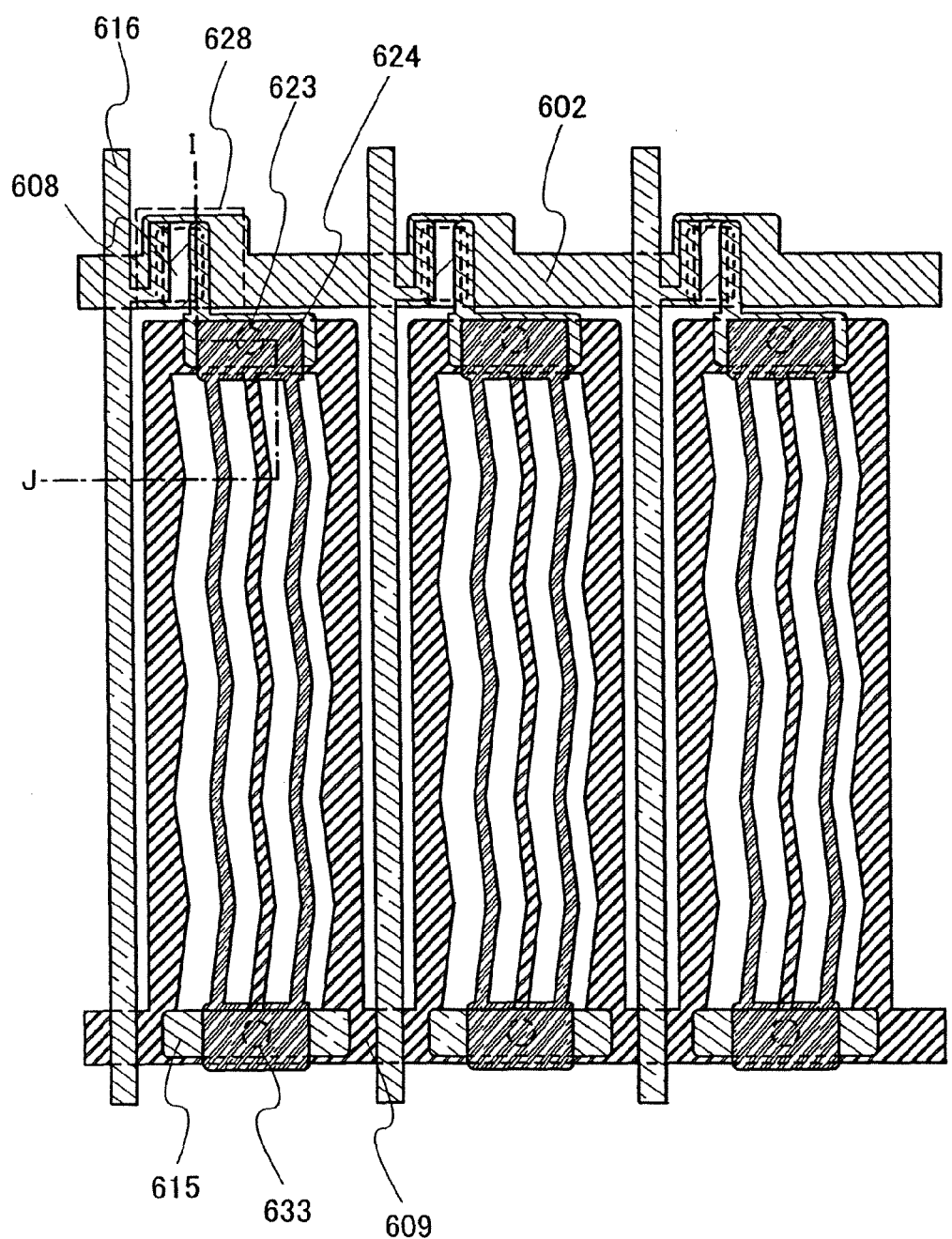
FIG. 28 is a view describing a display device of the present invention.

FIGS. 27 and 28 each show a pixel structure of an IPS mode liquid crystal display device. FIG. 28 is a plan view, and FIG. 27 shows a cross-sectional structure taken along dashed line I-J in FIG. 28. The following explanation will be made with reference to both the drawings.

FIG. 27 shows a state in which the substrate 600 provided with the TFT 628 and the second pixel electrode 624 connected to the TFT 628 overlaps with the counter substrate 601, and liquid crystals are injected therebetween. The counter substrate 601 is provided with the light shielding film 632, the color film 636, the planarizing film 637, and the like. Since the pixel electrode is provided on the substrate 600 side, the pixel electrode is not provided on the counter substrate 601 side. The liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as the gate wiring 602 of the TFT 628. Further, the common potential line 609 is formed in a shape which is compartmentalized roughly in a pixel shape.

The wirings 616 and 618 of the TFT 628 are formed over the gate insulating film 606. The wiring 616 serves as a data line extending in one direction, through which a video signal is transmitted in a liquid crystal display panel, and is connected to a source region of the TFT 628 and serves as one of a source electrode and a drain electrode. The wiring 618 serves as the other of the source electrode and the drain electrode, and is connected to the second pixel electrode 624.

The insulating film 620 is formed over the wirings 616 and 618. Further, over the insulating film 620, the second pixel electrode 624 connected to the wiring 618 in the contact hole 623 formed in the insulating film 620 is formed. The second pixel electrode 624 is formed of a material similar to the pixel electrode 77 described in Embodiment Mode 1. Note that, as shown in FIG. 28, the second pixel electrode 624 is formed so as to generate a horizontal electric field with a comb-shaped electrode which is formed at the same time as the common potential line 609. Further, a comb-like portion of the second pixel electrode 624 and the comb-like electrode that is formed at the same time as the common potential line 609 are formed so as to alternately engage with each other.

When an electric field is generated between the potential applied to the second pixel electrode 624 and the potential of the common potential line 609, the alignment of liquid crystals is controlled by this electric field. Liquid crystal molecules are horizontally rotated with the use of this electric field in a direction almost parallel to this substrate. In this case, since the liquid crystal molecules are horizontal in any state, there are few effects of contrast or the like depending on the angle in viewing; thus, the viewing angle is expanded.

In such a manner, the TFT 628 and the second pixel electrode 624 connected to the TFT 628 are formed over the substrate 600. A storage capacitor is formed by provision of the gate insulating film 606 between the common potential line 609 and a capacitor electrode 615. The capacitor electrode 615 and the second pixel electrode 624 are connected in the contact hole 623.

Next, an IPS mode liquid crystal display device will be described.

Figure 29:
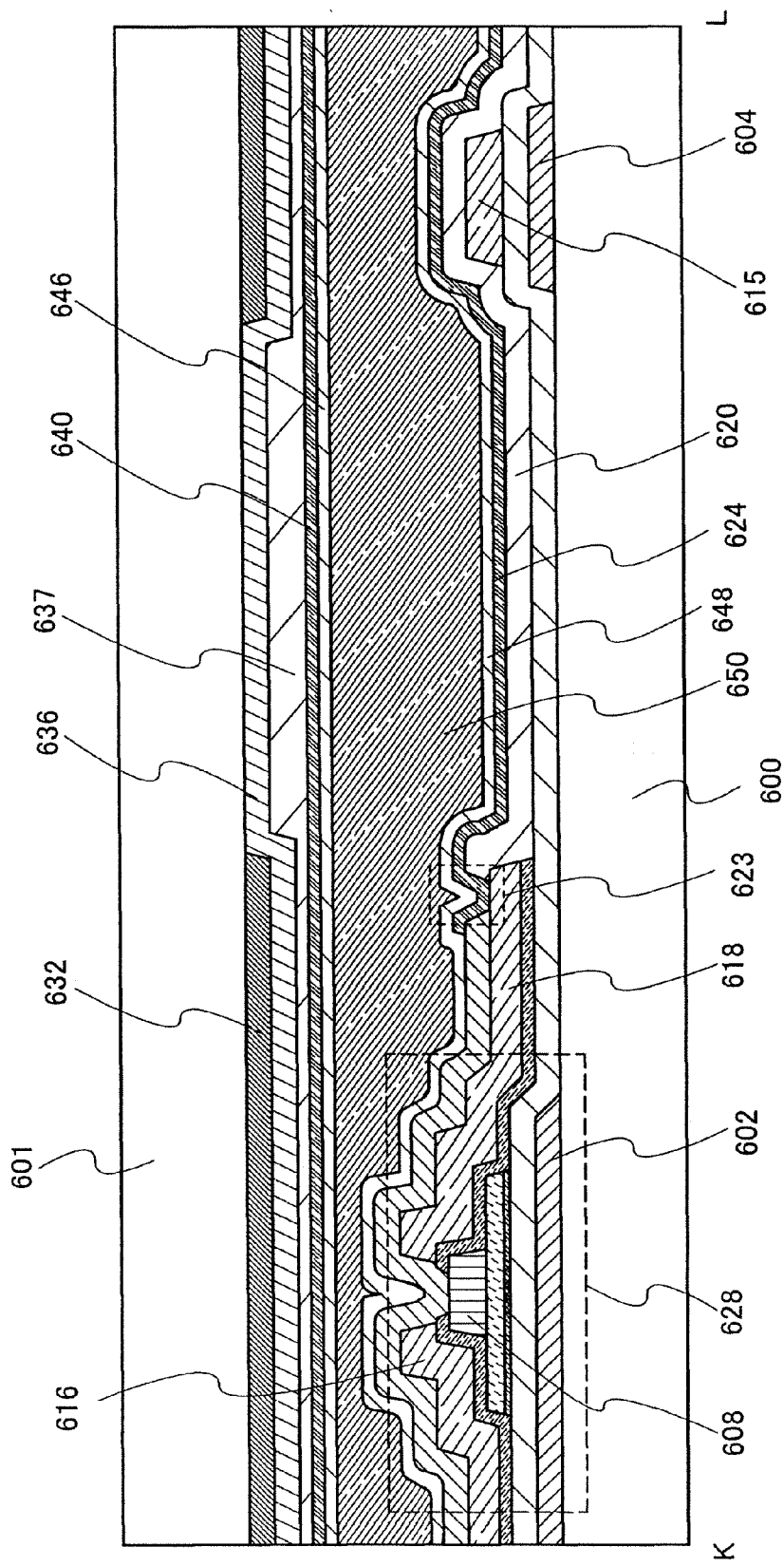
FIG. 29 is a view describing a display device of the present invention.
Figure 30:
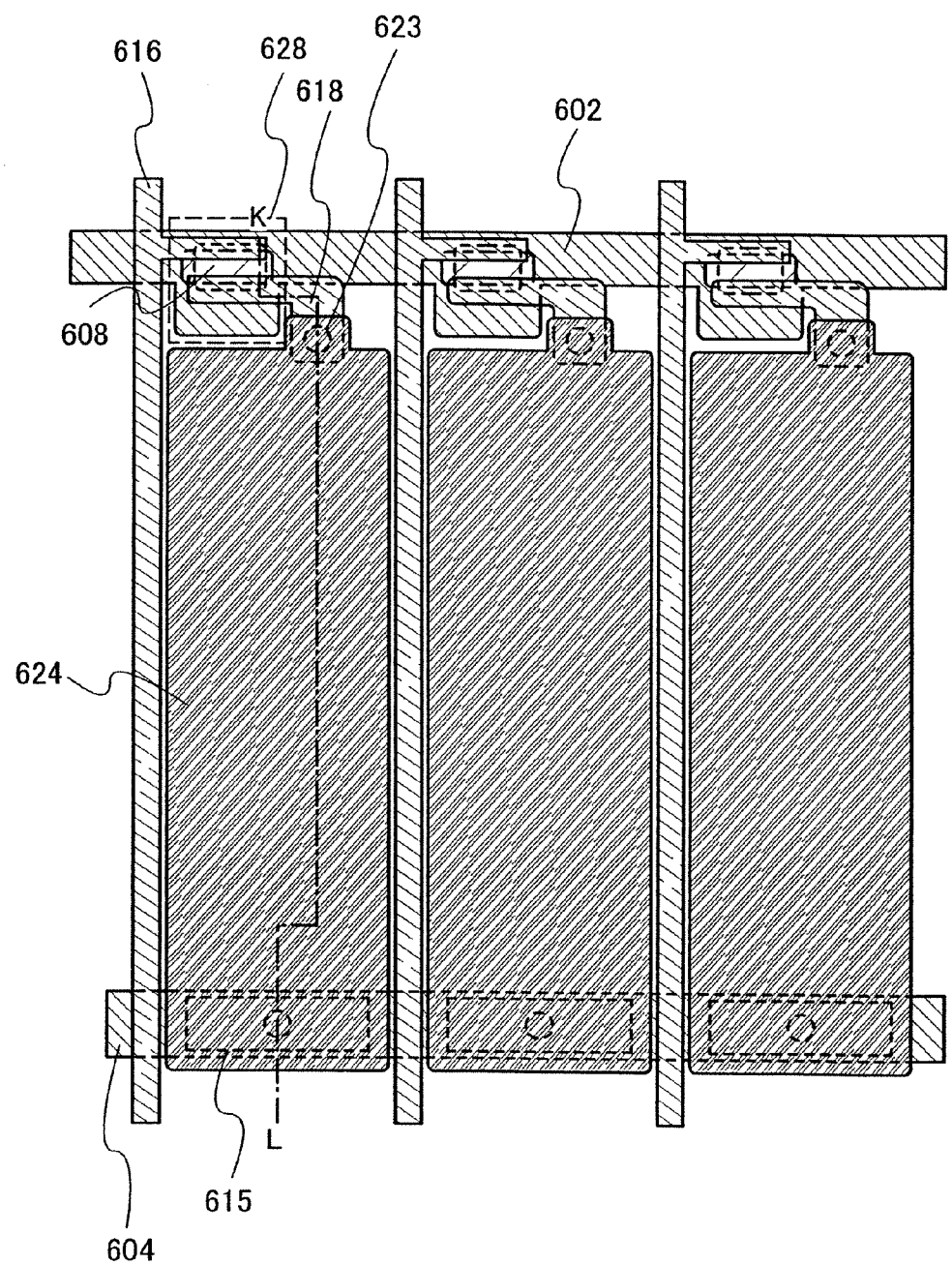
FIG. 30 is a view describing a display device of the present invention.

FIGS. 29 and 30 each show a pixel structure of an IPS mode liquid crystal display device. FIG. 30 is a plan view. FIG. 29 shows a cross-sectional structure along dashed line K-L in FIG. 30. The following explanation will be made with reference to both the drawings.

The second pixel electrode 624 is connected to the TFT 628 through the wiring 618 in the contact hole 623. The wiring 616 which serves as a data line is connected to the TFT 628. As the TFT 628, any of the TFTs described in Embodiment Mode 1 can be used.

The second pixel electrode 624 is formed of the pixel electrode 77 described in Embodiment Mode 1.

The counter substrate 601 is provided with the light shielding film 632, the color film 636, and the counter electrode 640. Further, the planarizing film 637 is formed between the second colored film 636 and the counter electrode 640 to prevent alignment disorder of liquid crystals. The liquid crystal layer 650 is formed between the second pixel electrode 624 and the counter electrode 640, with the alignment films 648 and 649 interposed therebetween.

A liquid crystal element is formed by overlapping the second pixel electrode 624, the liquid crystal layer 650, and the counter electrode 640 with each other.

The substrate 600 or the counter substrate 601 may be provided with a color filter, a shielding film (a black matrix) for preventing disclination, or the like. Further, a polarizing plate is attached to a surface of the substrate 600, which is opposite to a surface provided for the thin film transistor. Moreover, a polarizing plate is attached to a surface of the counter substrate 601, which is opposite to a surface provided for the counter electrode 640.

Through the above-described steps, a liquid crystal display device can be manufactured as a display device. Since a thin film transistor with less off current and with high electric properties and high reliability is used in the liquid crystal display device of this embodiment mode, the liquid crystal display device has high contrast and high visibility.

(Embodiment Mode 8)

Next, a structure of a display panel, which is one mode of the display device of the present invention, will be described below. A liquid crystal display panel which is one mode of a liquid crystal display device having a liquid crystal element as a display element (the liquid crystal display panel is also referred to as a liquid crystal panel) and a light-emitting display panel which is one mode of a display device having a light-emitting element as a display element (the light-emitting display panel is also referred to as a light-emitting panel) will be described in this embodiment mode.

Figure 9A:
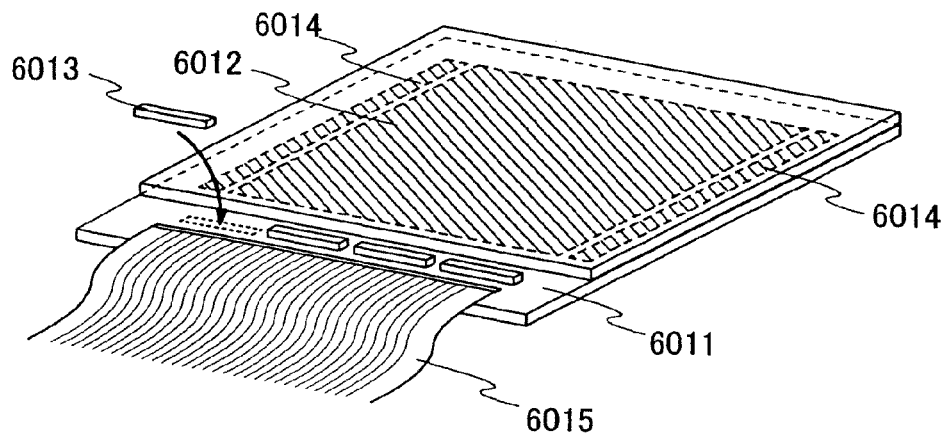
FIGS. 9A to 9C are views each describing a display device of the present invention.

FIG. 9A shows a mode of a light-emitting display panel in which a signal line driver circuit 6013 which is separately formed is connected to a pixel portion 6012 formed over a substrate 6011. The pixel portion 6012 and a scanning line driver circuit 6014 are each formed of thin film transistors including a microcrystalline semiconductor film. By forming the signal line driver circuit of a transistor by which higher mobility can be obtained compared to the thin film transistor including a microcrystalline semiconductor film, operation of the signal line driver circuit, which demands a higher driving frequency than the scanning line driver circuit, can be stabilized. Note that the signal line driver circuit 6013 may be formed of a transistor including a single-crystalline semiconductor, a thin film transistor including a polycrystalline semiconductor, or a transistor including an SOL The pixel portion 6012, the signal line driver circuit 6013, and the scanning line driver circuit 6014 are each supplied with a potential of a power supply, a variety of signals, and the like via an FPC 6015.

Note that the signal driver circuit and the scanning line driver circuit may be formed over the same substrate as the pixel portion.

Figure 9B:
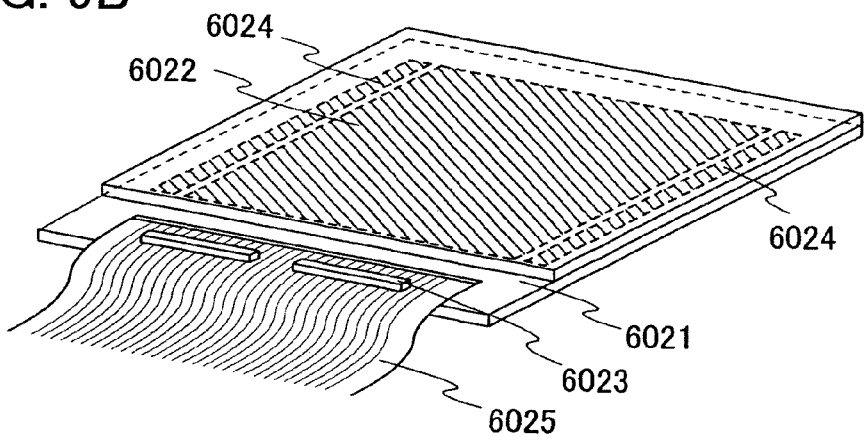

Further, when a driver circuit is separately formed, a substrate provided with the driver circuit is not necessarily attached to a substrate provided with a pixel portion, and may be attached to, for example, an FPC. A mode of a display panel in which a signal line driver circuit 6023 is formed separately and is connected to a pixel portion 6022 and a scanning line driver circuit 6024 that are formed over a substrate 6021 is shown in FIG. 9B. The pixel portion 6022 and the scanning line driver circuit 6024 are each formed of thin film transistors including a microcrystalline semiconductor film. The signal line driver circuit 6023 is connected to the pixel portion 6022 via an FPC 6025. The pixel portion 6022, the signal line driver circuit 6023, and the scanning line driver circuit 6024 are each supplied with a potential of a power source, a variety of signals, and the like via the FPC 6025.

Figure 9C:
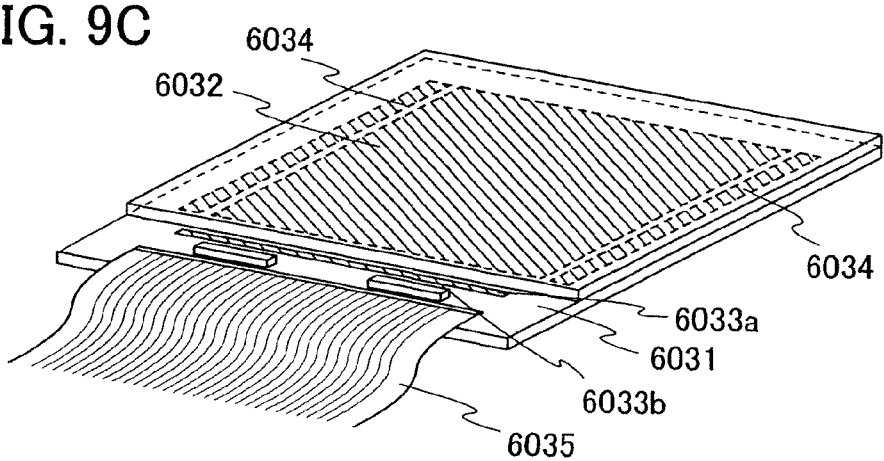

Alternatively, only part of a signal line driver circuit or part of a scanning line driver circuit may be formed over the same substrate as a pixel portion by using a thin film transistor using a microcrystalline semiconductor film, and the other part of the driver circuit may be separately formed and electrically connected to the pixel portion. A mode of a display panel in which an analog switch 6033*a* included in a signal driver circuit is formed over the same substrate 6031 as a pixel portion 6032 and a scanning line driver circuit 6034, and a shift register 6033*b* included in the signal line driver circuit is formed separately over a different substrate and then attached to the substrate 6031 is shown in FIG. 9C. The pixel portion 6032 and the scanning line driver circuit 6034 are each formed of thin film transistors including a microcrystalline semiconductor film. The shift resistor 6033b included in the signal line driver circuit is connected to the pixel portion 6032 via an FPC 6035. The pixel portion 6032, the signal line driver circuit, and the scanning line driver circuit 6034 are each supplied with a potential of a power supply, a variety of signals, and the like via the FPC 6035.

As shown in FIGS. 9A to 9C, in the display device of the present invention, an entire driver circuit or part thereof can be formed over the same substrate as a pixel portion, of thin film transistors including a microcrystalline semiconductor film.

Note that there is no particular limitation on a connection method of the substrate formed separately; a COG method, a wire bonding method, a TAB method, or the like can be used. Further, a connection position is not limited to the positions shown in FIGS. 9A to 9C as long as electrical connection is possible. Moreover, a controller, a CPU, a memory, or the like may be formed separately and connected.

Note that a signal line driver circuit used in the present invention is not limited to a mode including only a shift resistor and an analog switch. In addition to the shift register and the analog switch, another circuit such as a buffer, a level shifter, or a source follower may be included. Further, the shift resistor and the analog switch are not necessarily provided; for example, a different circuit such as a decoder circuit by which selection of a signal line is possible may be used instead of the shift resistor, and a latch or the like may be used instead of the analog switch.

Figure 12A:
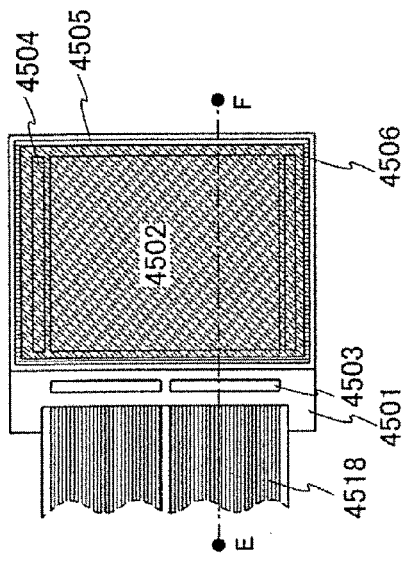
FIGS. 12A and 12B are views describing a display device of the present invention.
Figure 12B:
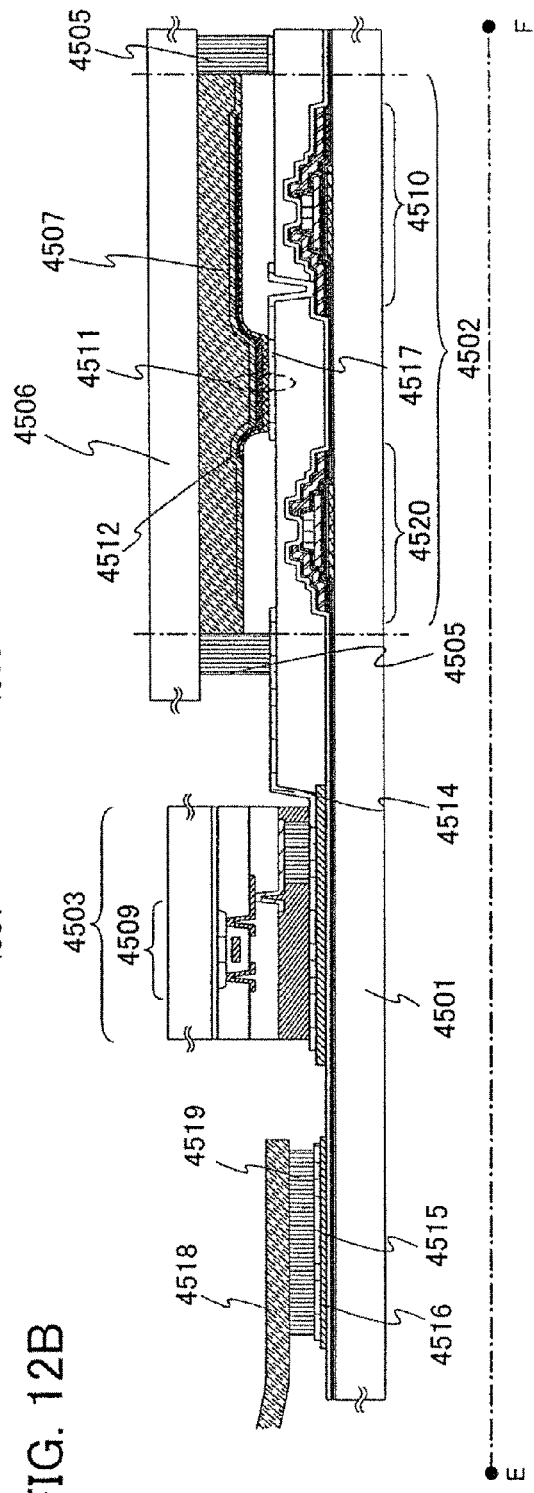

Next, an external view and a cross section of a light-emitting display panel, which is one mode of the display device of the present invention, will be described with reference to FIGS. 12A and 12B. FIG. 12A is a top view of a panel in which a thin film transistor including a microcrystalline semiconductor film and a light-emitting element which are formed over a first substrate are sealed between the first substrate and a second substrate with a sealing material. FIG. 12B is a cross-sectional view along line E-F in FIG. 12A.

The sealing material 4505 is provided so as to surround a pixel portion 4502 and a scanning line driver circuit 4504 which are provided over the first substrate 4501. Further, the second substrate 4506 is provided over the pixel portion 4502 and the scanning line driver circuit 4504. Therefore, the pixel portion 4502 and the scanning line driver circuit 4504 are sealed together with a filler 4507 by the first substrate 4501, the sealing material 4505, and the second substrate 4506. Further, a signal line driver circuit 4503 formed using a polycrystalline semiconductor film over a different substrate is mounted on a region over the first substrate 4501, which is different from the region surrounded by the sealing material 4505. Note that, although an example in which the signal line driver circuit including thin film transistors using a polycrystalline semiconductor film is attached to the first substrate 4501 is described in this embodiment mode, a signal line driver circuit may be formed using a transistor including a single crystalline semiconductor and attached to a substrate. FIG. 12B illustrates a thin film transistor 4509 formed using a polycrystalline semiconductor film, which is included in the signal line driver circuit 4503.

Further, each of the pixel portion 4502 and the scanning line driver circuit 4504 which are provided over the first substrate 4501 includes a plurality of thin film transistors. FIG. 12B illustrates thin film transistors 4510 and 4520 included in the pixel portion 4502. Note that, although description is made on the assumption that the thin film transistor 4510 is a driving TFT in this embodiment mode, the thin film transistor 4510 may be a TFT for current control or a TFT for erasing data. The thin film transistors 4510 and 4520 are thin film transistors each using a microcrystalline semiconductor film, and to each of which any thin film transistor described in Embodiment Mode 1, 2, or 4 can be applied and a similar manufacturing process to any of Embodiment Modes 1 to 5 can be employed. In this embodiment mode, the thin film transistor 4510 is an n-channel thin film transistor using, as a source and drain regions, a semiconductor film to which an impurity which imparts n-type conductivity is added, and the thin film transistor 4520 is a p-channel thin film transistor using, as a source and drain regions, a semiconductor film to which an impurity which imparts p-type conductivity is added. The thin film transistor in the present invention can be either an n-channel thin film transistor or a p-channel thin film transistor, and a CMOS (complementary metal oxide semiconductor) which includes an n-channel thin film transistor and a p-channel thin film transistor can be provided in a display device.

Further, reference numeral 4511 denotes a light-emitting element. A pixel electrode included in the light-emitting element 4511 is electrically connected to a source or drain electrode of the thin film transistor 4510 through a wiring 4517. Further, in this embodiment mode, a common electrode of the light-emitting element 4511 and a transparent conductive film 4512 which is made of a light-transmitting conductive material are electrically connected to each other. Note that the structure of the light-emitting element 4511 is not limited to the structure described in this embodiment mode. The structure of the light-emitting element 4511 can be changed as appropriate depending on a direction in which light is extracted from the light-emitting element 4511, the conductivity type of the thin film transistor 4510, or the like.

Further, a variety of signals and a potential which are applied to the signal line driver circuit 4503 that is formed separately, the scanning line driver circuit 4504, or the pixel portion 4502 are supplied from an FPC 4518 through a wiring 4514 and a wiring 4515, although not shown in the cross-sectional view of FIG. 12B.

In this embodiment mode, a connection terminal 4516 is formed of the same conductive film as the pixel electrode included in the light-emitting element 4511. Further, the wirings 4514 and 4515 are formed of the same conductive film as the wiring 4517.

The connection terminal 4516 is electrically connected to a terminal included in the FPC 4518 through an anisotropic conductive film 4519.

The substrate located in the direction in which light is extracted from the light-emitting element 4511 needs to be transparent. In this case, a light-transmitting material such as a glass plate, a plastic plate, a polyester film, or an acrylic film is used.

Further, as the filler 4507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment mode, nitrogen is used for the filler 4507.

Further, if needed, an optical film such as a polarizing plate, a circular polarizing plate (including an elliptical polarizing plate), a retardation plate (a quarter-wave plate or a half-wave plate), or a color filter may be provided for an emission surface of the light-emitting element as appropriate. Further, the polarizing plate or the circularly polarizing plate may be provided with an anti-reflection film. For example, an anti-glare treatment which can diffuse reflected light with roughness of the surface, and reduce reflection can be performed.

Note that, although an example in which the signal line driver circuit 4503 is formed separately and mounted on the first substrate 4501 is shown in FIGS. 12A and 1213, this embodiment mode is not limited to this structure. A scanning line driver circuit may be separately formed and attached to a substrate, or only part of a signal line driver circuit or part of a scanning line driver circuit may be separately formed and attached to a substrate.

Figure 16A:
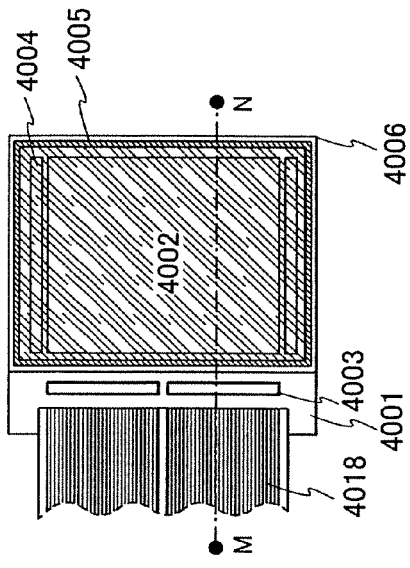
FIGS. 16A and 16B are views of a display device of the present invention.
Figure 16B:
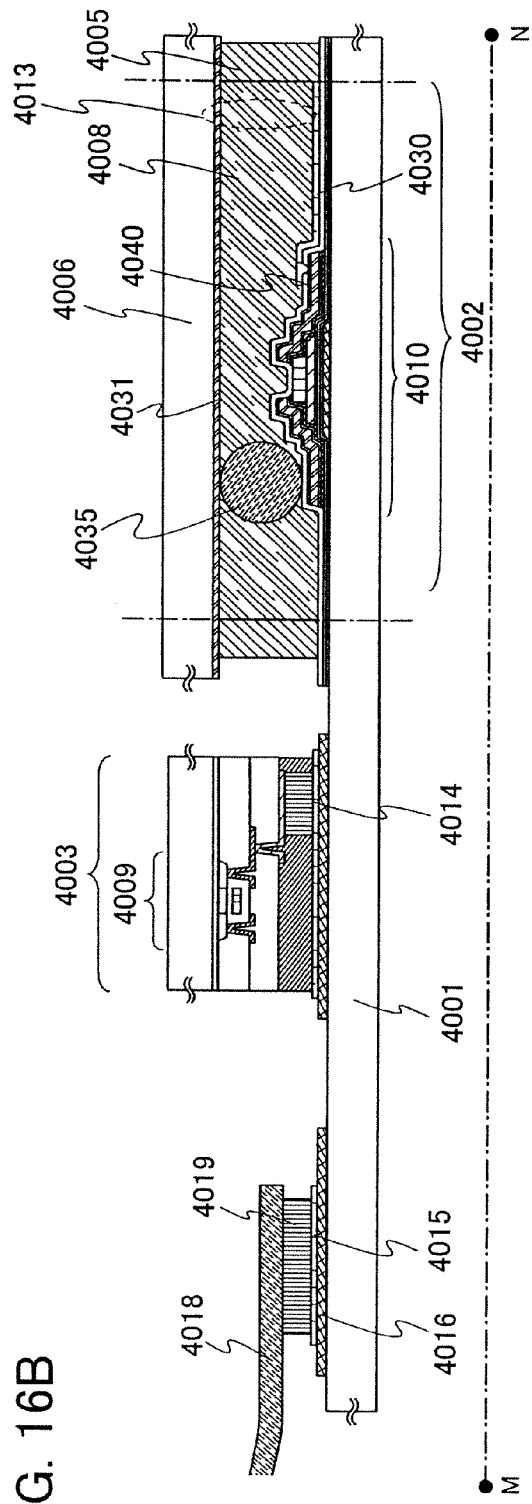

Next, the appearance and a cross section of a liquid crystal display panel which is one mode of the liquid crystal display device of the present invention will be described with reference to FIGS. 16A and 16B. FIG. 16A is a top view of a panel in which a thin film transistor 4010 including a microcrystalline semiconductor film and a liquid crystal element 4013 which are formed over a first substrate 4001 are sealed between the first substrate 4001 and a second substrate 4006 with a sealant 4005, and FIG. 16B is a cross-sectional view taken along line M-N in FIG. 16A.

The sealant 4005 is provided so as to surround the pixel portion 4002 and the scanning line driver circuit 4004 which are provided over the first substrate 4001. Further, the second substrate 4006 is provided over the pixel portion 4002 and the scanning line driver circuit 4004. Therefore, the pixel portion 4002 and the scanning line driver circuit 4004 are sealed together with liquid crystals 4008 by the first substrate 4001, the sealing material 4005, and the second substrate 4006. Further, a signal line driver circuit 4003 that is fowled using a polycrystalline semiconductor film over a separately prepared substrate is mounted at a region that is different from the region surrounded by the sealant 4005 over the first substrate 4001. Note that, although an example in which the signal line driver circuit 4003 including thin film transistors using a polycrystalline semiconductor film is attached to the first substrate 4001 is described in this embodiment mode, a signal line driver circuit may be formed of transistors each using a single-crystalline semiconductor film and attached to the first substrate 4001. FIG. 16B illustrates a thin film transistor 4009 that is formed using a polycrystalline semiconductor film and included in the signal line driver circuit 4003.

Further, the pixel portion 4002 and the scanning line driver circuit 4004 provided over the first substrate 4001 each include a plurality of thin film transistors, and the thin film transistor 4010 included in the pixel portion 4002 is illustrated in FIG. 1613. The thin film transistor 4010 is a thin film transistor using a microcrystalline semiconductor film, and to which any thin film transistor described in Embodiment Mode 1, 2, or 4 can be applied and a similar manufacturing process to any of Embodiment Modes 1 to 5 can be employed.

Further, reference numeral 4013 denotes a liquid crystal element, and a pixel electrode 4030 included in the liquid crystal element 4013 is electrically connected to the thin film transistor 4010 via a wiring 4040. A counter electrode 4031 of the liquid crystal element 4013 is provided for the second substrate 4006. A region where the pixel electrode 4030, the counter electrode 4031, and the liquid crystals 4008 overlap with each other corresponds to the liquid crystal element 4013.

Note that, for each of the first substrate 4001 and the second substrate 4006, glass, metal (typically, stainless steel), ceramic, or plastic can be used. As for the plastic, an FRP (fiberglass-reinforced plastics) plate, a PVF (polyvinyl fluoride) film, a polyester film, or an acrylic resin film can be used. Further, a sheet with a structure in which an aluminum foil is sandwiched with a PVF film or a polyester film can be used as well.

Further, reference numeral 4035 denotes a spherical spacer and is provided to control a distance (a cell gap) between the pixel electrode 4030 and the counter electrode 4031. Note that a spacer which is obtained by selectively etching an insulating film may be used as well.

Further, a variety of signals and a potential supplied to the separately formed signal line driver circuit 4003, the scanning line driver circuit 4004, and the pixel portion 4002 are supplied from an FPC 4018 through lead wirings 4014 and 4015.

In this embodiment mode, a connection terminal 4016 is formed of the same conductive film as the pixel electrode 4030 included in the liquid crystal element 4013. In addition, the lead wirings 4014 and 4015 are formed of the same conductive film as the wiring 4040.

The connection terminal 4016 is electrically connected to a terminal included in the FPC 4018 through an anisotropic conductive film 4019.

Note that, although not shown, the liquid crystal display device described in this embodiment mode includes an alignment film and a polarizing plate, and further, may include a color filter and/or a shielding film.

Note that, although an example in which the signal line driver circuit 4003 is formed separately and mounted on the first substrate 4001 is shown in FIGS. 16A and 16B, this embodiment mode is not limited to this structure. A scanning line driver circuit may be separately formed and attached to a substrate, or only part of a signal line driver circuit or part of a scanning line driver circuit may be separately formed and attached to a substrate.

This embodiment mode can be implemented in combination with any of the structures described in the other embodiment modes, as appropriate.

(Embodiment Mode 9)

The display device or the like obtained by the present invention can be used for a display module (an active matrix EL module or a liquid crystal module). That is, the present invention can be implemented in all electronic devices in which such a module is incorporated into a display portion.

As such electronic devices, cameras such as video cameras and digital cameras; displays that can be mounted on a head (goggle-type displays); car navigation systems; projectors; car stereos; personal computers; portable information terminals (e.g., mobile computers, mobile phones, and electronic books); and the like can be given. Examples of these devices are illustrated in FIGS. 7A to 7D.

Figure 7A:
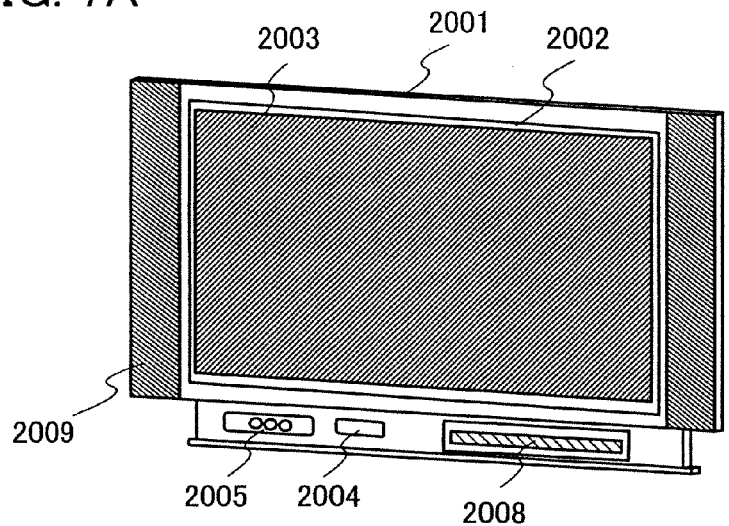
FIGS. 7A to 7D are diagrams showing electronic devices to which the present invention is applied.

FIG. 7A shows a television device. The television device can be completed by incorporating a display module into a chassis as shown in FIG. 7A. A display panel provided with components up to an FPC is also called a display module. A main screen 2003 is formed by using the display module, and a speaker portion 2009, an operation switch, and the like are provided as other attached structures. In this manner, the television device can be completed.

As shown in FIG. 7A, a display panel 2002 using a display element is incorporated into a chassis 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by switches incorporated in the chassis or by a remote controller 2006 separated from the main body. A display portion 2007 that displays information to be outputted may also be provided in this remote controller.

Figure 8:
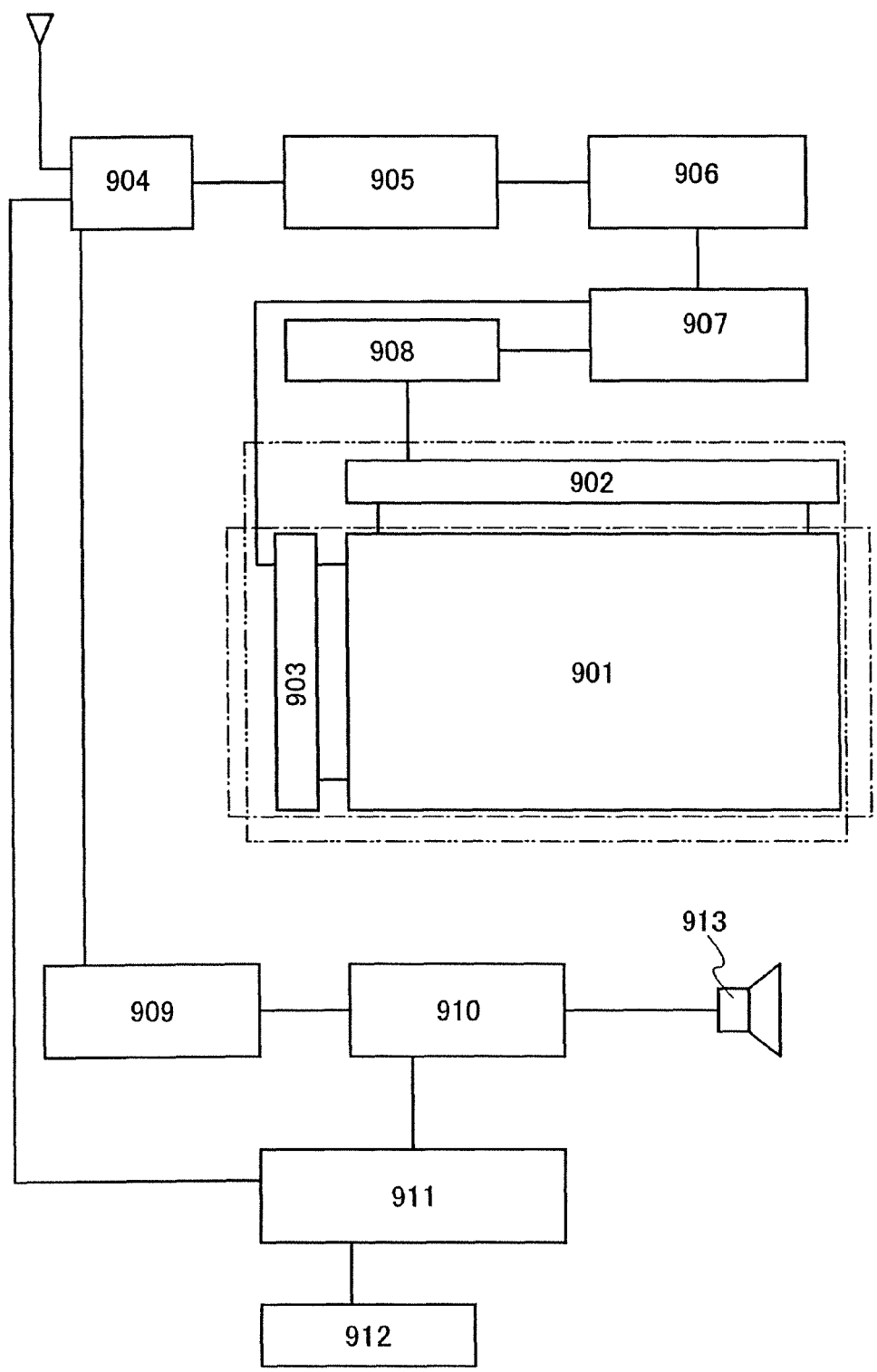
FIG. 8 is a block diagram showing a main structure of an electronic device to which the present invention is applied.

Further, the television device may include a sub screen 2008 formed using a second display panel to display channels, volume, and the like, in addition to the main screen 2003. In this structure, the main screen 2003 may be formed of a light-emitting display panel which has an excellent viewing angle, and the sub-screen 2008 may be formed of a liquid crystal display panel by which display can be performed at low power consumption. Alternatively, when reduction in power consumption is prioritized, a structure may be employed in which the main screen 2003 is formed of a liquid crystal display panel, the sub screen 2008 is formed of a light-emitting display panel, and the sub screen 2008 can be turned on and off, FIG. 8 is a block diagram of a main structure of a television device. A pixel portion 901 is formed in a display panel. A signal line driver circuit 902 and a scanning line driver circuit 903 may be mounted on the light-emitting display panel by a COG method.

As a structure of another external circuit, a video signal amplifier circuit 905 that amplifies a video signal among signals received by a tuner 904, a video signal processing circuit 906 that converts the signal outputted from the video signal amplifier circuit 905 into a chrominance signal corresponding to each color of red, green, and blue, a control circuit 907 that converts the video signal into an input specification of a driver IC, and the like are provided on a video signal input side. The control circuit 907 outputs signals to both a scanning line side and a signal line side. In the case of digital driving, a signal dividing circuit 908 may be provided on the signal line side so that an input digital signal is divided into m pieces to be supplied.

Among signals received by the tuner 904, an audio signal is transmitted to an audio signal amplifier circuit 909, and an output of the audio signal amplifier circuit 909 is supplied through an audio signal processing circuit 910 to a speaker 913. A control circuit 911 receives control information of a receiving station (reception frequency) or sound volume from an input portion 912 and transmits signals to the tuner 904 and the audio signal processing circuit 910.

It is needless to say that the present invention is not limited to a television device and the present invention can be used for various applications as a large display medium such as an information display board at train stations, airports, and the like, and an advertisement board on street as well as a monitor of a personal computer.

Figure 7B:
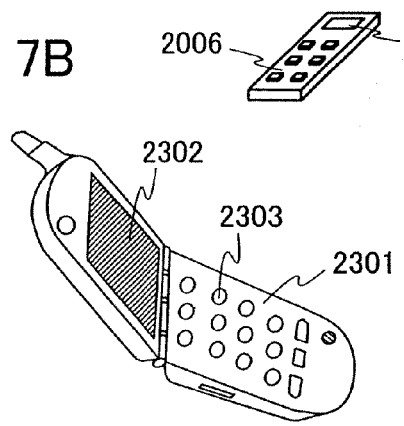

FIG. 7B shows an example of a mobile phone 2301. The mobile phone 2301 includes a display portion 2302, an operation portion 2303, and the like. When the display device described in the above-described embodiment mode is applied to the display portion 2302, reliability and mass productivity of the mobile phone 2301 can be improved.

Figure 7C:
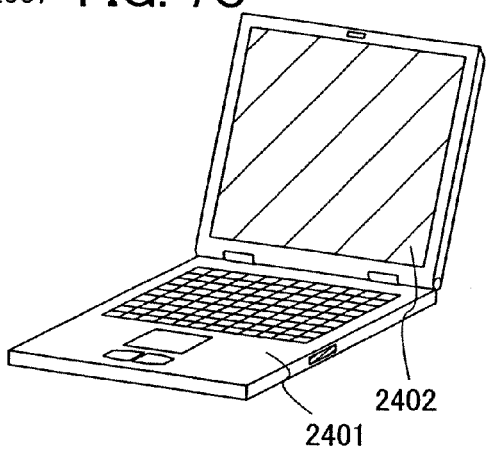

A mobile computer shown in FIG. 7C includes a main body 2401, a display portion 2402, and the like. When the display device described in the above-described embodiment mode is applied to the display portion 2402, reliability and mass productivity of the mobile computer can be improved.

Figure 7D:
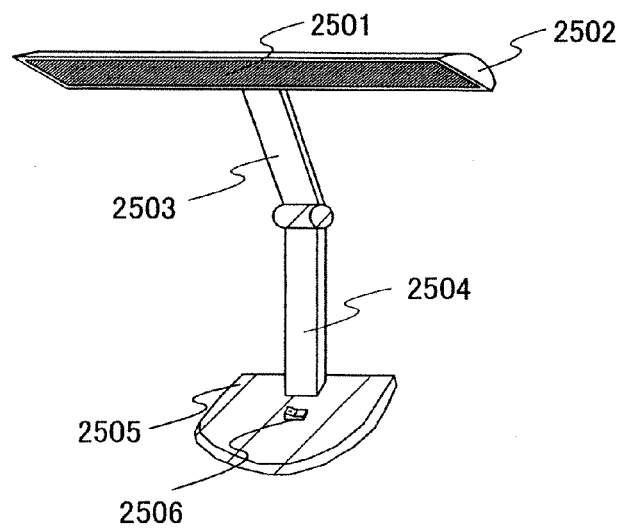

FIG. 7D shows a desk lamp including a lighting portion 2501, a shade 2502, an adjustable arm 2503, a support 2504, a base 2505, and a power supply switch 2506. The desk lamp can be manufactured by applying the display device of the present invention to the lighting portion 2501. Note that the light includes, in its category, ceiling lights, wall lights, and the like. By applying the display device described in the above-described embodiment mode, reliability and mass productivity of the desk lamp can be improved.

This application is based on Japanese Patent Application Serial No. 2007-227073 filed with Japan Patent Office on Aug. 31, 2007, the entire contents of which are hereby incorporated by reference.

What is claimed is:

1. A manufacturing method of a display device, comprising the steps of:
    forming a gate electrode over a substrate;
    forming a gate insulating film over the gate electrode;
    forming a microcrystalline semiconductor film over the gate insulating film, the microcrystalline semiconductor film including a channel formation region;
    forming a channel protective layer over the channel formation region;
    forming a buffer layer over the channel protective layer;
    forming a source and drain regions over the buffer layer;
    forming a source and drain electrodes over the source and drain regions; and
    forming an impurity region by adding an impurity element which imparts one conductivity type selectively in the channel formation region of the microcrystalline semiconductor film, through the channel protective layer with a use of the source and drain electrodes as masks.

2. The manufacturing method of a display device according to claim 1, after forming the impurity region, further comprising a step of irradiating the impurity region with a laser light through the channel protective layer.

3. The manufacturing method of a display device according to claim 1, wherein the buffer layer is formed of an amorphous semiconductor film.

4. The manufacturing method of a display device according to claim 1, wherein the impurity region is formed in the channel formation region of the microcrystalline semiconductor film between the source and drain electrodes.

5. The manufacturing method of a display device according to claim 1, wherein the impurity element which imparts one conductivity type is an impurity element which imparts p-type conductivity.

6. A manufacturing method of a display device, comprising the steps of:
    forming a gate electrode over a substrate;
    forming a gate insulating film over the gate electrode;
    forming a microcrystalline semiconductor film over the gate insulating film, the microcrystalline semiconductor film including a channel formation region;
    forming a channel protective layer over the channel formation region;
    forming a buffer layer over the channel protective layer;
    forming a source and drain regions over the buffer layer;
    forming a source and drain electrodes over the source and drain regions;
    forming an impurity region by adding an impurity element which imparts one conductivity type selectively in the channel formation region of the microcrystalline semiconductor film, through the channel protective layer with a use of the source and drain electrodes as masks; and
    forming a pixel electrode which is electrically connected to one of the source and drain electrodes.

7. The manufacturing method of a display device according to claim 6, after forming the impurity region, further comprising a step of irradiating the impurity region with a laser light through the channel protective layer.

8. The manufacturing method of a display device according to claim 6, wherein the buffer layer is formed of an amorphous semiconductor film.

9. The manufacturing method of a display device according to claim 6, wherein the impurity region is formed in the channel formation region of the microcrystalline semiconductor film between the source and drain electrodes.

10. The manufacturing method of a display device according to claim 6, wherein the impurity element which imparts one conductivity type is an impurity element which imparts p-type conductivity.

* * * * *

UNITED STATES PATENT AND TRADEMARK OFFICE
CERTIFICATE OF CORRECTION

PATENT NO. : 8,389,993 B2  
APPLICATION NO. : 13/361998  
DATED : March 5, 2013  
INVENTOR(S) : Satoshi Kobayashi et al.

It is certified that error appears in the above-identified patent and that said Letters Patent is hereby corrected as shown below:

In the Specification:

Column 5, line 24, "52a and 521)" should read "52a and 52b"

Column 5, line 64, "6'$10^{16}$ atoms/cm$^3$" should read "6 × $10^{16}$ atoms/cm$^3$"

Column 8, line 31, "added to form in" should read "added to form"

Column 9, line 50, "film 52h" should read "film 52b"

Column 9, line 60, "can he obtained" should read "can be obtained"

Column 11, line 33, "fainted as well" should read "formed as well"

Column 14, line 2, "can he formed" should read "can be formed"

Column 14, line 3, "by fowling" should read "by forming"

Column 14, line 6, "FIG. 20" should read "FIG. 2D"

Column 14, line 34, "can he formed" should read "can be formed"

Column 14, line 41, "clement" should read "element"

Column 15, line 15, "arc not" should read "are not"

Column 17, line 23, "so-called it" should read "so-called π"

Column 17, line 26, "polythiophenc" should read "polythiophene"

Signed and Sealed this  
Twenty-first Day of May, 2013

Teresa Stanek Rea  
*Acting Director of the United States Patent and Trademark Office*

CERTIFICATE OF CORRECTION (continued)
U.S. Pat. No. 8,389,993 B2

In the Specification:

Column 19, line 6, "can formed" should read "can be formed"

Column 19, line 13, "can he controlled" should read "can be controlled"

Column 19, line 16, "may he added" should read "may be added"

Column 21, lines 18-19, "4 to 8 am" should read "4 to 8 nm"

Column 21, line 34, "the film, in these cases" should read "the film. In these cases"

Column 22, line 34, "steps arc similar" should read "steps are similar"

Column 25, line 31, "such as art Ar laser" should read "such as an Ar laser"

Column 28, line 30, "0.4 Flush" should read "0.4 µm. Flush"

Column 30, line 65, "each of the MS" should read "each of the TFTs"

Column 33, line 1, "Modes 3 to 5" should read "Modes 1 to 5"

Column 38, line 32, "SOL The" should read "SOI. The"

Column 41, line 3, "12A and 1213" should read "12A and 12B"

Column 41, line 27, "fowled using" should read "formed using"

Column 41, line 44, "FIG. 1613" should read "FIG. 16B"

Column 43, line 9, "on and off," should read "on and off."